US008242350B2

(12) United States Patent
Cashion et al.

(10) Patent No.: US 8,242,350 B2
(45) Date of Patent: Aug. 14, 2012

(54) CONCENTRATING PHOTOVOLTAIC SOLAR PANEL

(76) Inventors: Steven A. Cashion, San Diego, CA (US); Michael R. Bowser, Los Angeles, CA (US); Mark B. Farrelly, Carlsbad, CA (US); Braden E. Hines, Pasadena, CA (US); Howard C. Holmes, Boulder Creek, CA (US); Richard L. Johnson, Jr., Suffolk, VA (US); Richard J. Russell, La Crescenta, CA (US); Michael F. Turk, Los Angeles, CA (US)

( * ) Notice: Subject to any disclaimer, the term of this patent is extended or adjusted under 35 U.S.C. 154(b) by 403 days.

(21) Appl. No.: 12/454,321

(22) Filed: May 15, 2009

(65) Prior Publication Data

US 2010/0018570 A1    Jan. 28, 2010

Related U.S. Application Data

(60) Provisional application No. 61/128,009, filed on May 16, 2008, provisional application No. 61/131,178, filed on Jun. 6, 2008, provisional application No. 61/209,526, filed on Mar. 6, 2009.

(51) Int. Cl.
*H01L 31/042* (2006.01)
*F24J 2/10* (2006.01)

(52) U.S. Cl. ........ 136/246; 136/251; 136/259; 126/600; 126/684

(58) Field of Classification Search .................. 136/246, 136/251, 259; 126/600, 684
See application file for complete search history.

(56) References Cited

U.S. PATENT DOCUMENTS

| 2,750,150 | A | * | 6/1956 | Lucker ........................... 254/103 |
| 3,388,739 | A | | 6/1968 | Olson et al. |
| 3,957,031 | A | | 5/1976 | Winston |
| 4,000,734 | A | | 1/1977 | Matlock et al. |
| 4,002,499 | A | | 1/1977 | Winston |
| 4,003,638 | A | | 1/1977 | Winston |
| 4,022,186 | A | | 5/1977 | Northrup, Jr. |
| 4,067,764 | A | | 1/1978 | Walker et al. |
| 4,069,812 | A | | 1/1978 | O'Neill |
| 4,092,531 | A | | 5/1978 | Moss |
| 4,107,521 | A | | 8/1978 | Winders |

(Continued)

FOREIGN PATENT DOCUMENTS

DE         4116894         11/1992

(Continued)

OTHER PUBLICATIONS http://www.nrel.gov/docs/fy99osti/25410.pdf (Kurtz et al., "Concentrator and Space Applications of High-Efficiency Solar Cells—Recent Developments," Presented at the National Center for Photovoltaics Program Review Meeting, Denver, Colorado, Sep. 1998) 9 pages.

(Continued)

*Primary Examiner* — Basia Ridley
*Assistant Examiner* — Devina Pillay

(57) ABSTRACT

The present invention relates to photovoltaic power systems, photovoltaic concentrator modules, and related methods. In particular, the present invention features concentrator modules having interior points of attachment for an articulating mechanism and/or an articulating mechanism that has a unique arrangement of chassis members so as to isolate bending, etc. from being transferred among the chassis members. The present invention also features adjustable solar panel mounting features and/or mounting features with two or more degrees of freedom. The present invention also features a mechanical fastener for secondary optics in a concentrator module.

11 Claims, 59 Drawing Sheets

U.S. PATENT DOCUMENTS

| | | | |
|---|---|---|---|
| 4,131,485 A | 12/1978 | Meinel et al. |
| 4,146,785 A | 3/1979 | Neale |
| 4,158,356 A | 6/1979 | Wininger |
| 4,168,696 A | 9/1979 | Kelly |
| 4,169,738 A | 10/1979 | Luque |
| 4,177,083 A | 12/1979 | Kennedy |
| 4,184,482 A | 1/1980 | Cohen |
| 4,187,123 A | 2/1980 | Diggs |
| 4,191,164 A | 3/1980 | Kelly |
| 4,210,121 A | 7/1980 | Stark |
| 4,211,212 A | 7/1980 | Braun |
| 4,215,410 A | 7/1980 | Weslow et al. |
| 4,223,174 A | 9/1980 | Moeller |
| 4,238,246 A | 12/1980 | Genequand et al. |
| 4,253,880 A | 3/1981 | Bellugue |
| 4,256,364 A | 3/1981 | Minoura et al. |
| 4,262,195 A | 4/1981 | White et al. |
| 4,269,168 A | 5/1981 | Johnson |
| 4,280,853 A | 7/1981 | Palazzetti et al. |
| 4,287,411 A | 9/1981 | Beucci |
| 4,296,731 A | 10/1981 | Cluff |
| 4,297,521 A | 10/1981 | Johnson |
| 4,307,711 A | 12/1981 | Doundoulakis |
| 4,320,288 A | 3/1982 | Schlarlack |
| 4,323,052 A | 4/1982 | Stark |
| 4,328,789 A | 5/1982 | Nelson |
| 4,349,733 A | 9/1982 | Beam et al. |
| 4,354,484 A | 10/1982 | Malone et al. |
| 4,365,617 A | 12/1982 | Bugash et al. |
| 4,397,303 A | 8/1983 | Stultz |
| 4,398,053 A | 8/1983 | Orillion |
| 4,410,757 A | 10/1983 | Stamminger et al. |
| 4,459,972 A | 7/1984 | Moore |
| 4,476,854 A | 10/1984 | Baer |
| 4,484,334 A | 11/1984 | Pressley |
| 4,495,408 A | 1/1985 | Mori |
| 4,554,038 A | 11/1985 | Allard |
| 4,556,788 A | 12/1985 | Hanak |
| 4,572,161 A | 2/1986 | Mori |
| 4,575,639 A | 3/1986 | Rogow et al. |
| 4,601,282 A | 7/1986 | Mountain |
| 4,604,494 A | 8/1986 | Shepard, Jr. |
| 4,619,244 A | 10/1986 | Marks |
| 4,622,470 A | 11/1986 | Makino et al. |
| 4,750,943 A | 6/1988 | Nelson |
| 4,771,764 A | 9/1988 | Cluff |
| 4,868,379 A | 9/1989 | West |
| 4,945,731 A | 8/1990 | Parker et al. |
| 4,968,355 A | 11/1990 | Johnson |
| 4,995,377 A | 2/1991 | Eiden |
| 4,999,483 A | 3/1991 | Okamoto |
| 5,255,666 A | 10/1993 | Curchod |
| 5,317,145 A | 5/1994 | Corio |
| 5,483,060 A | 1/1996 | Sugiura et al. |
| 5,498,297 A | 3/1996 | O'Neill et al. |
| 5,557,478 A | 9/1996 | Winston et al. |
| 5,610,768 A | 3/1997 | Winston |
| 5,665,174 A | 9/1997 | Laing et al. |
| 5,727,585 A | 3/1998 | Daume et al. |
| 5,806,955 A | 9/1998 | Parkyn, Jr. et al. |
| 5,977,475 A | 11/1999 | Hibino |
| 6,020,554 A | 2/2000 | Kaminar et al. |
| 6,058,930 A | 5/2000 | Shingleton |
| 6,079,408 A | 6/2000 | Fukuda |
| 6,087,646 A | 7/2000 | Didinsky |
| 6,089,224 A | 7/2000 | Poulek |
| 6,113,342 A | 9/2000 | Smith et al. |
| 6,127,620 A | 10/2000 | Tange et al. |
| 6,498,290 B1 | 12/2002 | Lawheed |
| 6,531,653 B1 | 3/2003 | Glenn et al. |
| 6,620,995 B2 | 9/2003 | Vasylyev et al. |
| 6,680,693 B2 | 1/2004 | Urban et al. |
| 6,691,701 B1 | 2/2004 | Roth |
| 6,700,054 B2 | 3/2004 | Cherney et al. |
| 6,717,045 B2 | 4/2004 | Chen |
| 6,809,413 B1 | 10/2004 | Peterson et al. |
| 6,843,573 B2 | 1/2005 | Rabinowitz et al. |
| 6,848,442 B2 | 2/2005 | Haber |
| 6,870,087 B1 | 3/2005 | Gallagher |
| 6,881,893 B1 | 4/2005 | Cobert |
| 6,903,261 B2 | 6/2005 | Habraken et al. |
| 6,959,993 B2 | 11/2005 | Gross et al. |
| 6,963,437 B2 | 11/2005 | Bauer et al. |
| 6,971,756 B2 | 12/2005 | Vasylyev et al. |
| 7,055,519 B2 | 6/2006 | Litwin |
| 7,076,965 B2 | 7/2006 | Lasich |
| 7,109,461 B2 | 9/2006 | Lasich |
| 7,156,088 B2 | 1/2007 | Luconi |
| 7,188,964 B2 | 3/2007 | Ealey |
| 7,192,146 B2 | 3/2007 | Gross et al. |
| 7,218,998 B1 | 5/2007 | Neale |
| 7,381,886 B1 | 6/2008 | Aiken et al. |
| 7,388,146 B2 | 6/2008 | Fraas et al. |
| 7,403,278 B2 | 7/2008 | Hayashi et al. |
| 7,432,438 B2 | 10/2008 | Rubin et al. |
| 7,442,871 B2 | 10/2008 | Meyers |
| 7,535,071 B2 | 5/2009 | Schell et al. |
| 7,622,666 B2 | 11/2009 | Hines |
| 2003/0201008 A1 | 10/2003 | Lawheed |
| 2004/0187907 A1 | 9/2004 | Morgal |
| 2004/0216734 A1 | 11/2004 | Lawheed |
| 2005/0081908 A1 | 4/2005 | Stewart |
| 2005/0229924 A1 | 10/2005 | Luconi et al. |
| 2006/0054212 A1 | 3/2006 | Fraas et al. |
| 2006/0060188 A1 | 3/2006 | Hickerson |
| 2006/0171704 A1* | 8/2006 | Bingle et al. ............... 396/419 |
| 2006/0283495 A1 | 12/2006 | Gibson |
| 2007/0070531 A1* | 3/2007 | Lu ............................... 359/851 |
| 2007/0089777 A1 | 4/2007 | Johnson, Jr. et al. |
| 2007/0102037 A1 | 5/2007 | Irwin |
| 2007/0108459 A1 | 5/2007 | Lu |
| 2007/0188876 A1 | 8/2007 | Hines et al. |
| 2007/0193620 A1 | 8/2007 | Hines et al. |
| 2007/0272234 A1 | 11/2007 | Allen et al. |
| 2008/0023061 A1 | 1/2008 | Clemens et al. |
| 2008/0078380 A1 | 4/2008 | Kimura et al. |
| 2008/0083405 A1 | 4/2008 | Kimura et al. |
| 2008/0127967 A1 | 6/2008 | Kimura et al. |
| 2008/0128586 A1 | 6/2008 | Johnson et al. |
| 2008/0135096 A1 | 6/2008 | Johnson |
| 2008/0142078 A1 | 6/2008 | Johnson |
| 2008/0185032 A1 | 8/2008 | MacDonald |
| 2008/0271776 A1 | 11/2008 | Morgan |
| 2009/0000612 A1 | 1/2009 | Hines et al. |
| 2009/0000662 A1 | 1/2009 | Harwood et al. |
| 2009/0032092 A1 | 2/2009 | Fang |
| 2009/0032093 A1 | 2/2009 | Fang |
| 2009/0056698 A1 | 3/2009 | Johnson et al. |
| 2009/0056785 A1 | 3/2009 | Johnson et al. |
| 2009/0056786 A1 | 3/2009 | Johnson et al. |
| 2009/0056787 A1 | 3/2009 | Johnson et al. |
| 2009/0064994 A1 | 3/2009 | Weatherby et al. |
| 2009/0199890 A1 | 8/2009 | Hering et al. |
| 2009/0283134 A1 | 11/2009 | Hines |
| 2010/0032004 A1 | 2/2010 | Baker et al. |
| 2010/0037935 A1 | 2/2010 | Vaid et al. |

FOREIGN PATENT DOCUMENTS

| | | |
|---|---|---|
| DE | 9412438 | 6/1995 |
| DE | 10150176 | 4/2003 |
| DE | 20 2007 001 865 | 6/2007 |
| EP | 0474349 | 3/1992 |
| EP | 1041628 | 10/2000 |
| EP | 1 895 597 | 3/2008 |
| FR | 2291506 | 6/1976 |
| FR | 2447017 | 8/1980 |
| FR | 2527748 | 12/1983 |
| JP | 56023666 | 3/1981 |
| JP | 56058278 | 5/1981 |
| JP | 58098984 | 6/1983 |
| JP | 06085301 | 3/1994 |
| JP | 06085304 | 3/1994 |
| JP | 2002141543 | 5/2002 |
| JP | 2002151711 | 5/2002 |
| WO | WO 90/04142 | 4/1990 |
| WO | WO 00/68628 | 11/2000 |
| WO | WO 01/63665 | 8/2001 |

| WO | WO 2004/114419 | 12/2004 |
| WO | WO 2005/090873 | 9/2005 |
| WO | WO 2005/119133 | 12/2005 |
| WO | WO 2006/070425 | 7/2006 |
| WO | WO 2006/114457 | 11/2006 |
| WO | WO 2006/120475 | 11/2006 |
| WO | WO 2007/041018 | 4/2007 |
| WO | WO 2007/093422 | 8/2007 |
| WO | WO 2008/038522 | 4/2008 |

OTHER PUBLICATIONS http://sol3g.com/eng/girasol.htm, "The Gira-Sol Project," 2 pages.
http://www.whitfieldsolar.com/Commercial_Applications.htm, "Commercial Applications," 1 page.
http://www.whitfieldsolar.com/Technical_Specifications.htm, "Technical Specifications," 1 page.
http://www.energyinnovations.com/sunpod.html, 1 page.
http://www.ifm.eng.cam.ac.uk/csp/summaries/learningcurve.html, "The Learning Curve for Industry," 2 pages.
http://www.entechsolar.com/sunline3.htm, "SunLine," 1 page.
http://www.sandia.gov/pv/docs/PDF/commercial.pdf, Commercial Applications, pp. 4-7.
Swanson, "The Promise of Concentrators," Prog. Photovolt. Res. Appl., vol. 8, pp. 93-111 (2000).
http://www.bowitt.com/materials/smc/SMC, Sheet Molding Compound (SMC), 1 page.
Kurtz and Friedman, "Photovoltaics-Lighting the Way to a Brighter Future," Optics & Photons News, pp. 30-35, Jun. 2005.
http://www.conergy.de/en/Desktopdefault.aspx/tabid-1765/1806_read-8784/, Conergy Europe—Renewable Energy—Conergy SolarOptimus, Tracking Systems, 3 pages.
http://www.conergy.de/en/PortalData/2/Resources/products/photovoltaics/pdf/SOLAROPTIMUS-TD-ENG-0801.pdf, Data Sheet Conergy SolarOptimus, 4 pages.
http://sol3g.com/eng/Gira-sol%20System%20v8.pdf, "The Gira-Sol System," 7 pages.
http://www.bctia.org/files/PDF/green_buildings/Potential_of_Solar_Photovoltaics_-_Day4_-_Mar06.pdf, "Day 4 Energy Inc., Realizing the full potential of Solar Photovoltaics Today," 9 pgs.
Richman, R.H. et al., "Investigation of high-concentration photovoltaic cell packages after three years field service," Solar Energy Materials and Solar Cells 30, No. 3, pp. 263-276, Aug. 1993.
http://www.whitfieldsolar.com/ "Home Page," 1 page.
Prisms & Flats from Pacific Rim Optical, Inc., http://www.krugeroptical.com/pro_prisms.asp, copyright 2009, 1 page.
Optical Products, Pacific Rim Optical, Inc. brochure, 8 pages.
Burge et al., "Lightweight Mirror Technology Using a Thin Facesheet With Active Rigid Support," Proc. SPIE 3356, Space Telescopes and Instruments V, pp. 690-701, 1998.
Cho et al., "Optimization of the ATST Primary Mirror Support System," Proc. SPIE 6273, Optomechanical Technologies for Astronomy, 2006, 12 pages.
http://www.energyinnovations.com/technology/, illustrating "light is concentrated 800x onto highly efficient PV cells," 2 pages.
http://www.energyinnovations.com/technology/, illustrating "altitude tilt tracking," 2 pages.
http://www.energyinnovations.com/technology/, illustrating "azimuth rotational tracking," 2 pages.
http://www.energyinnovations.com/technology/, illustrating "low profile design," 2 pages.
http://www.energyinnovations.com/technology/, illustrating "self powered design" (design #1), 2 pages.
http://www.energyinnovations.com/technology/, illustrating "self powered design" (design #2), 2 pages.
http://www.energyinnovations.com/products/, Sunflower, Is It Right for You?, 2 pages.
http://www.whitfieldsolar.com/products/, Products, Overview, 2 pages.
http://www.whitfieldsolar.com/products/products_sub.php, Products, Concentrating Photovoltaic, 1 page.
http://www.whitfieldsolar.com/Product_.htm, "Product Features," 1 page.

* cited by examiner

CONCENTRATING PHOTOVOLTAIC SOLAR PANEL

PRIORITY CLAIM

The present nonprovisional patent application claims priority under 35 U.S.C §119(e) from U.S. Provisional patent application having Ser. No. 61/128,009, filed on May 16, 2008, by Hines et al. and titled CONCENTRATING PHOTOVOLTAIC SOLAR PANEL, from U.S. Provisional patent application having Ser. No. 61/131,178, filed on Jun. 6, 2008, by Hines et al. and titled CONCENTRATING PHOTOVOLTAIC SOLAR PANEL, and from U.S. Provisional patent application having Ser. No. 61/209,526, filed on Mar. 6, 2009, by Baker et al. and titled SOLAR SYSTEMS THAT INCLUDE ONE OR MORE SHADE-TOLERANT WIRING SCHEMES, wherein the respective entireties of said provisional patent applications are incorporated herein by reference.

STATEMENT REGARDING FEDERALLY SPONSORED RESEARCH OR DEVELOPMENT

The present invention was made with Government support under Cooperative Agreement No. DE-FC36-07G017044 awarded by the U.S. Department of Energy. The Government has certain rights in this invention.

FIELD OF THE INVENTION

The present invention relates to photovoltaic power systems, photovoltaic concentrator modules, and related devices and methods.

BACKGROUND OF THE INVENTION

Solar panels are generally well known (see, e.g., U.S. Pub. No. 2006/0283497 (Hines)). It is desirable to produce solar panels that either produce more power and/or that cost less.

To date, photovoltaic solar concentrators have generally taken one of two approaches—either build a large reflective trough or dish or a field of articulating mirrors which reflect light to a central point, where it is converted to power (such as by Solar Systems of Victoria, Australia and by Gross et al., U.S. Pat. No. 2005/0034751), or tightly pack a large number of small concentrators into a large panel which articulates rigidly to follow the sun (such as by Chen, U.S. Pub. No. 2003/0075212 or Stewart, U.S. Pub. No. 2005/0081908). See also the Matlock et al. reference (U.S. Pat. No. 4,000,734), which discloses elongated reflectors mounted for movement around a heating tube arranged in the linear focus of the reflectors and a tracking mechanism.

A recent third approach that has appeared in the prior art (Fraas et al., U.S. Pub. No. 2003/0201007) is to attempt to combine the advantages of concentration with the convenience of the form factor of an ordinary solar panel. Fraas et al, show multiple approaches that attempt to solve the cost/performance/convenience problem.

An approach to produce a flat solar concentrator was to place rows of small concentrators in a "lazy susan" rotating ring (Cluff, U.S. Pat. No. 4,296,731). See also, e.g., the photovoltaic tracking system commercialized under the trade name SUNFLOWER™ by Energy Innovations, Pasadena, Calif.

One approach in the prior art has been to develop a set of concentrating collectors, which articulate individually while also articulating en masse, as in Diggs, U.S. Pat. No. 4,187,123.

A recent variation on this approach is to place two rows of collectors in a frame where they articulate approximately in place, such as in Fukuda, U.S. Pat. No. 6.079,408. Such an approach packages a tracking concentrator into a form that is approximately flat.

Bugash et al, U.S. Pat. No. 4,365,617, disclose a reflective solar heating system whose collectors articulate in place.

It has been known previously in the art that a frame around the perimeter of a solar tracking system helps to be able to support the individual photovoltaic elements (see, e.g., the photovoltaic tracking system commercialized under the trade name SOLAROPTIMUS by Conergy, Hamburg, Germany, and International Application Publication No. WO 2006/120475).

Framing around the perimeter of a solar panel can limit packing density of solar panels and/or make the panels less aesthetically pleasing. However, sparse packing can make it easier for concentrator modules to operate without shading each other through a larger portion of the day and of the year, allowing a cost-effective use of the individual concentrators by increasing their overall daily exposure to sunlight.

Many consumers have traditional solar panel mounting structures (e.g., rails and the like) in place and would like to use such existing mounting structures instead of investing in new mounting structures. Retrofitting new and innovative solar panels to traditional solar panel mounting structures can be a significant technical hurdle in making such new panels a practical reality.

A technical challenge with respect to developing innovative solutions around articulating concentrator modules is that many mounting locations such as rooftops and the like tend to have uneven surfaces which can cause the concentrators to bind to an undue degree when the modules articulate in tilt and/or tilt.

With respect to concentrating optics, a need exists to provide a concentrating module with one or more secondary optics such that the optics can withstand one or more environmental stresses such as vibration (e.g., during manufacturing and/or use), thermal and/or physical shock, particle contamination such as dust, combinations of these, and the like.

SUMMARY OF THE INVENTION

Applicants have invented numerous solutions helpful singly or in combination to overcome and/or alleviate one or more of the problems present in prior art solar concentrators and solar panels.

For example, one or more attachment points can be positioned in the interior region of a concentrator module such that a tip articulating mechanism can articulate the concentrator module substantially about the center of gravity of the photovoltaic concentrator module. Such attachment points can also permit the concentrator module to articulate in tilt. Having attachment points in the interior region of a concentrator module permits the panel to not have framing around the perimeter of the panel. Support structure can be positioned underneath the concentrator modules. Advantageously, two or more such concentrator modules can be packed relatively more tightly than in many traditional ground-based, utility-scale solar concentrator arrays. Packing concentrator modules more tightly tends to better amortize the costs associated with planning, permitting, and executing the installation of a photovoltaic array based on the concentrator systems, especially, for example, for a commercial rooftop installation, potentially leading to a lower overall cost of energy produced by the system. Nonetheless, it can be desirable to leave at least some amount of space between the individual concentrators.

Another innovation includes an articulation chassis having an articulating member rigidly and physically coupled to one or more other chassis members directly attached to concentrator modules in a manner that substantially isolates or minimizes any bending and the like from being transferred from the driven articulating member (e.g., the axle). Advantageously, such an arrangement among the chassis members can prevent undue binding when the concentrator modules articulate in tip and/or tilt. In preferred embodiments, the articulation chassis members can be positioned beneath the concentrator modules so that the panel essentially does not have a frame around the perimeter of the panel. Rather than including a superfluous frame around the entire concentrating solar panel, many preferred embodiments do not include a frame along one or more sides of the unit (e.g., no frame around the perimeter of the panel), instead making use of the unit's concentrator articulation mechanism to also provide structural support, allowing a more cost-effective unit via elimination of unnecessary frame components. The support structure can be tucked underneath the concentrating solar panel yet still be capable of articulating the concentrator module(s) substantially about the center of gravity of each concentrator module, thereby allowing support of the concentrator modules without increasing the width of the solar panel, helping to improve the efficiency of the solar panel.

Another innovation includes a solar panel having adjustable mounting structure so as to accommodate a plurality of mounting locations. Such mounting structure advantageously permits traditional solar panel mounting hardware (e.g., rails, etc.) to accommodate one or more new and unique solar panel designs.

Another innovation includes a solar panel having mounting hardware with a suitable number of degrees of freedom so as to prevent undue binding when the concentrator modules articulate in tilt and/or tip. Advantageously, such mounting hardware permits a given solar panel design to adapt to a broad range of mounting surfaces/locations (e.g., relatively uneven rooftop surfaces and the like) and articulate in tilt and/or tilt in a robust manner without undue binding of the concentrator modules.

The innovations with respect to adjustable mounting structure and having suitable degrees of freedom are important breakthroughs, because they can allow concentrating solar panels, with heretofore unseen higher efficiencies and also with lower costs, to penetrate markets currently dominated by traditional flat-panel solar, especially the commercial rooftop market, greatly reducing cost and increasing the acceleration of deployment of solar into the market. In preferred embodiments, this allows current flat-panel solar installers to use much of their existing mounting hardware and installation techniques, and even sales and marketing techniques, to deploy concentrating solar. Thus the invention combines the advantages (e.g., cost advantages) of concentrating solar with the market acceptance and form factor advantages of traditional flat photovoltaic panels.

Considerable technical challenge can be present in manufacturing a reliable heat sink assembly because such an assembly is typically exposed to highly intensified sunlight, concentrated as much as 500 to 1000 times or more, and it desirably has a lifetime approximating that of traditional silicon solar panels, as much as 25 to 30 years or more. This means an exposure to the equivalent of up to 30,000 years or more of ultraviolet and other radiation over the lifetime of the assembly. In addition, the intense solar radiation creates a large amount of unwanted heat, in addition to the desirable electricity, which is preferably dissipated in an efficient manner. The heat sink assembly 10 of FIG. 14, while functionally sound, may be mechanically fragile. For example, such an assembly might be subject to damage from vibrations typical during shipment and/or thermal and/or UV wear as just described. In addition, it is desirable that the total internal reflection (TIR) sidewalls of the secondary optic 24 remain free of contamination for the life of the product, in order to avoid a degradation of the reflectivity of the TIR sidewalls with time.

Another innovative solution includes one or more mechanical support structures/braces (e.g., a housing) that rigidly couple one or more concentrating secondary optics to a concentrator module (e.g., to a heat sink assembly of the module).

According to one aspect of the present invention, a photovoltaic concentrator module includes a main body portion having a base; one or more side walls connected to the base; one or more attachment points positioned in the interior region of the main body portion; and one or more apertures located opposite the base. The base and the one or more sidewalls help define an interior region of the main body portion. The one or more attachment points can couple the main body portion to a tip articulating mechanism such that the tip articulating mechanism can articulate the photovoltaic concentrator module substantially about the center of gravity of the photovoltaic concentrator module.

According to another aspect of the present invention, a photovoltaic power system includes a tip articulating mechanism and a plurality of photovoltaic concentrator modules. Each photovoltaic concentrator module includes a main body portion having a base; one or more side walls connected to the base; one or more attachment points positioned in the interior region of the main body portion; and one or more apertures located opposite the base. The base and the one or more sidewalls help define an interior region of the main body portion. The one or more attachment points are coupled to the tip articulating mechanism such that the tip articulating mechanism can articulate the photovoltaic concentrator module substantially about the center of gravity of the photovoltaic concentrator module.

According to another aspect of the present invention, a photovoltaic power system includes a tip articulation mechanism and a plurality of photovoltaic concentrator modules. The plurality of photovoltaic concentrator modules are positioned adjacent to each other in a linear manner. The plurality of photovoltaic concentrator modules define an inboard region. Each photovoltaic concentrator module includes one or more attachment points positioned in the inboard region. The one or more attachment points are each coupled to the tip articulating mechanism such that the tip articulating mechanism can articulate each photovoltaic concentrator module substantially about the center of gravity of the photovoltaic concentrator module.

According to another aspect of the present invention, a photovoltaic concentrator module includes an inboard region and one or more attachment points positioned in the inboard region. The one or more attachment points can be coupled to a tip articulating mechanism such that the tip articulating mechanism can articulate the photovoltaic concentrator module substantially about the center of gravity of the photovoltaic concentrator module.

According to another aspect of the present invention, a photovoltaic power system includes a plurality of articulating photovoltaic concentrator modules positioned so as to define a panel of photovoltaic concentrator modules and an articulating mechanism coupled to each photovoltaic concentrator module. The panel defines a footprint having a first dimension and a second dimension. The articulating mechanism includes at least three chassis members. Each chassis member is substantially parallel to the other chassis members and each chassis member extends along the first dimension of the panel footprint. At least two chassis members are physically coupled to each photovoltaic concentrator modules in an articulating manner. Each of the two chassis members are rigidly, physically coupled to the third chassis member at two or more points.

According to another aspect of the present invention, a photovoltaic power system includes a plurality of articulating photovoltaic concentrator modules positioned so as to define a panel of photovoltaic concentrator modules and an articulating mechanism coupled to the panel of photovoltaic concentrator modules in a manner so as to articulate the panel at least in a tilting manner. The panel has a first end and a second end. At the first end of the panel the articulating mechanism includes a chassis and a mounting plate coupled to the chassis via a movable joint that permits the mounting plate to move relative to the chassis so as to accommodate a plurality of mounting locations.

According to another aspect of the present invention, a photovoltaic power system includes a plurality of articulating photovoltaic concentrator modules positioned so as to define a panel of photovoltaic concentrator modules and an articulating mechanism coupled to the panel of photovoltaic concentrator modules in a manner so as to articulate the panel at least in a tilting manner. The panel has a first end and a second end. At the first end of the panel the articulating mechanism includes a chassis and a mounting plate coupled to the chassis via a pivotable joint that permits the mounting plate to pivot relative to the chassis.

According to another aspect of the present invention, a heat sink assembly includes a heat sink, a photovoltaic cell attached directly or indirectly to the heat sink, a concentrating optic positioned over the photovoltaic cell and optically coupled to the photovoltaic cell, and one or more structural braces. The concentrating optic has an outer surface. The one or more structural braces are positioned over the concentrating optic such that the one or more structural braces allow incident light to pass to the concentrating optic. The one or more structural braces are attached directly or indirectly to the heat sink. The one or more structural braces contact the outer surface of the concentrating optic in a structurally supporting manner.

According to another aspect of the present invention, a method of making the main body portion of a photovoltaic concentrator module includes providing a moldable composition comprising one or more thermosetting polymers, providing a mold having a form corresponding to the main body portion of a photovoltaic concentrator module, molding the moldable composition to the form of the mold, and, optionally, curing the molded composition.

DETAILED DESCRIPTION OF PRESENTLY PREFERRED EMBODIMENTS

Figure 1:
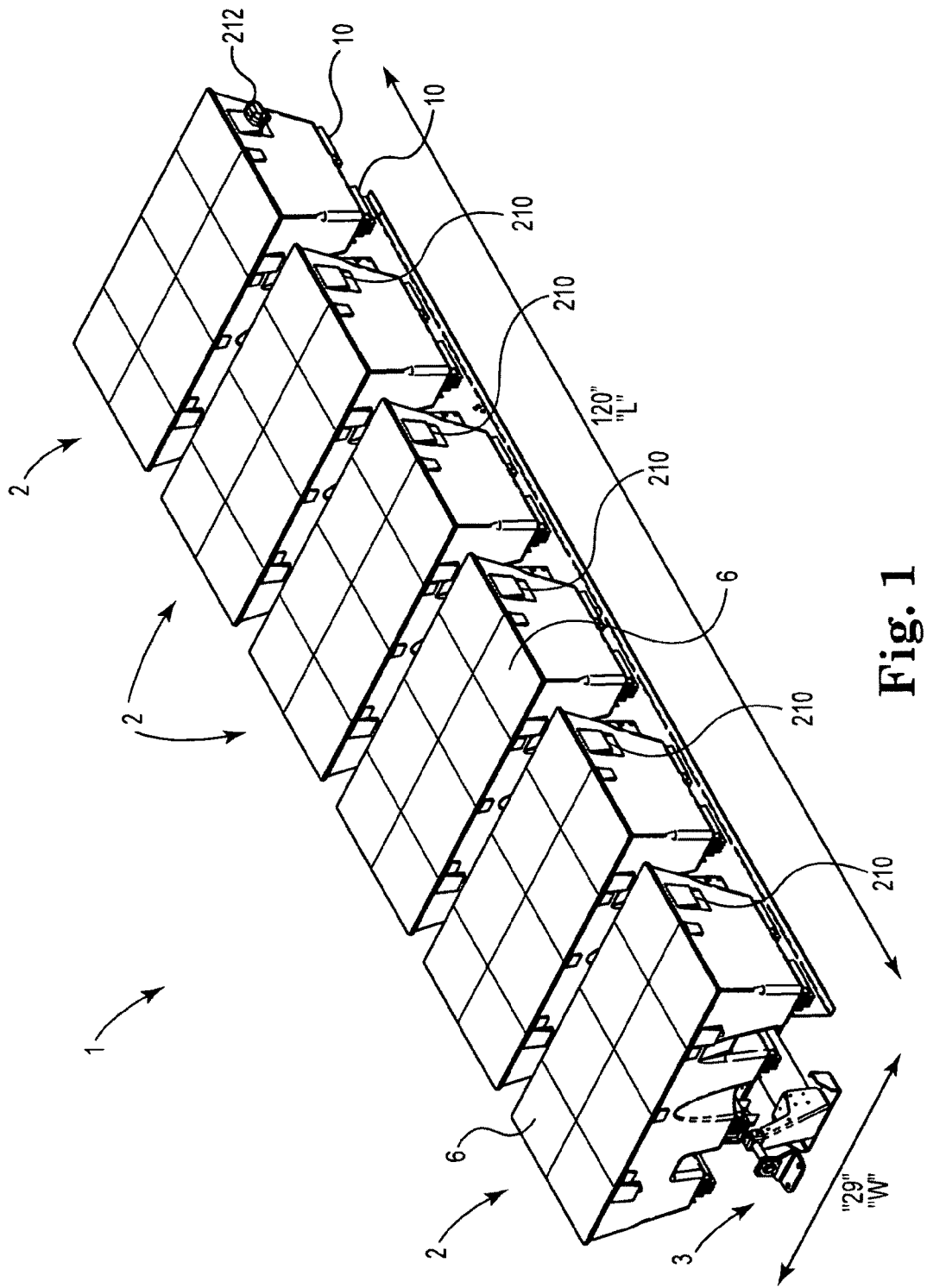
FIG. 1 shows a photovoltaic power system according to the present invention.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

In the embodiments described below, the same reference characters are used to describe features that are the same among the embodiments.

The present invention can provide a concentrating solar panel that in some embodiments may be similar in size to traditional solar panels, or, in other embodiments, may be longer and narrower than traditional solar panels, resulting in lower amortized installation costs. Advantageously, solar concentrating modules and/or solar panels according to the present invention can produce as much or more power than an equivalently-sized traditional solar panel in many representative embodiments.

A first embodiment of a photovoltaic power system according to the present invention is shown in FIG. 1. Photovoltaic power system 1 (also referred to herein as solar panel 1) includes a plurality of moveable photovoltaic concentrator modules 2 and articulating mechanism 3. As shown in FIG. 1, photovoltaic power system 1 has a first dimension, length "L" and a second dimension "W," where length is the longer dimension and width is the shorter dimension. It is noted that concentrator modules 2 also have a width and a length, where width is the shorter dimension and length is the longer dimension.

Figure 2:
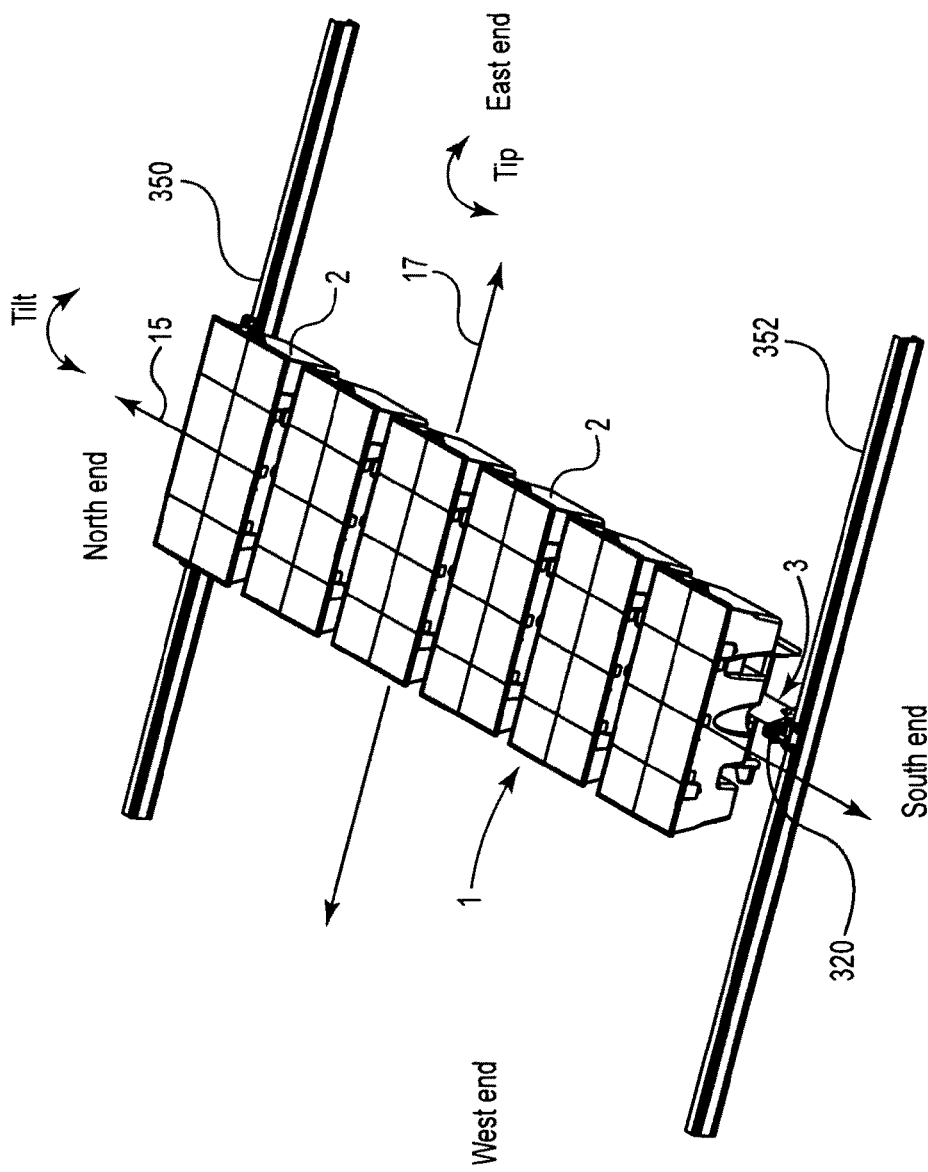
FIG. 2 shows an example of the system of FIG. 1 mounted.

The concentrating solar panel 1 is preferably designed for installation using standard photovoltaic rack equipment, such as is available from Direct Power and Water. The physical layout of such racking on a rooftop may be uncontrolled to a degree, and further, there may be some movement in the racking over time, due, for example, to thermal expansion or contraction, or due to changes in roof weight load, such as when water pools or when rooftop equipment such as air conditioners are installed nearby. One exemplary approach to mounting the concentrating solar panel 1 is shown in FIG. 2, wherein panel 1 mates with rail 350 and rail 352. Rails 350 and 352 can be provided by an installer. As shown, modules 2 can be articulated in a "tilt" motion and a "tip" motion. As used herein, with reference to FIG. 2, tilt motion means articulation about the short axis 15 of module 2 (e.g., about the axis running north-south). As used herein, tip motion means articulation about the long axis 17 of module 2 (e.g., about the axis running east-west when the buckets are pointed at zenith). It is noted that each module 2 in panel 1 has a separate tip axis 17, but all modules 2 in panel 1 share the same tilt axis 15. As shown, each module 2 articulates in place about the tilt axis 15 and about the tip axis 17 of each module 2. Articulating modules 2 in place can help system 1 have a low profile. Rooftop installation can then be simpler. Low profile means relatively low wind profile. Preferably, a low profile system 1 can allow conventional installation techniques to be used which is a substantial market advantage. A low profile system 1 can also help the modules 2 to be relatively less visible from street level, thereby helping with permitting approvals, which can be another market advantage. The modules 2 preferably point in synchrony at the sun.

Preferably, each photovoltaic concentrator module 2 articulates in place, i.e., each concentrating module 2 articulates about a separate first axis that is substantially parallel to the long dimension of module 2 (e.g., tip axis 17) such that the first axes 17 of system 1 lie substantially in the same plane and are substantially parallel to each other. Also, each concentrating module 2 preferably articulates about a same second axis that is substantially parallel to the short dimension of module 2 (e.g., tilt axis 15) such that the first axes 17 are substantially perpendicular to the second axis 15. Preferably, second axis 15 remains substantially fixed in orientation/position.

Figure 3:
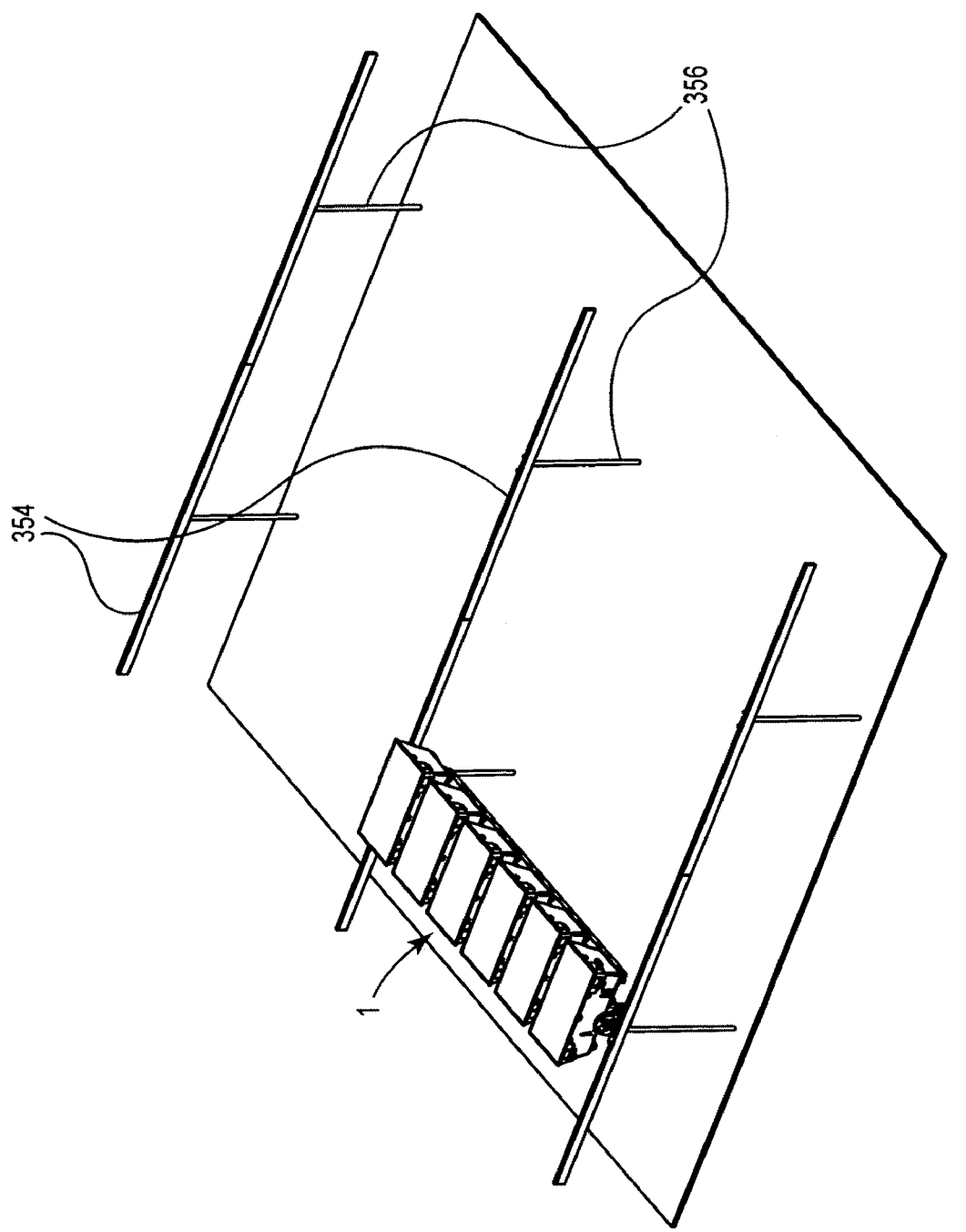
FIG. 3 shows the mounted system of FIG. 2 on a roof.

FIG. 3 illustrates a mounting scheme in the context of an entire roof, wherein a set of rails 354 are supported on a set of struts 356, providing a multiplicity of potential mounting points. Rails 354 and 356 can be provided by an installer.

Advantageously, the modules 2 of system 1 are packed unusually close together and/or close to adjacent systems similar to or the same as system 1, yet can articulate in tilt and tip to track the sun without colliding. Modules 2 can be packed so close to other modules 2 within a given system 1 and/or to modules 2 in adjacent systems 1 because, e.g., the height of an individual module 2 is relatively short thereby allowing modules 2 to articulate without colliding. Adjacent systems 1 can be packed relatively close to each other also because in preferred embodiments, system 1 does not have frame structure located at a position of perimeter of system 1 that would interfere to an undue degree with positioning two or more systems 1 next to each other. Also, modules 2 can be unusually tolerant to shading that may occur, thereby permitting such relatively close packing. Because modules 2 can be packed so close to each other and/or adjacent systems, system 1 can provide an aperture density (aperture area per unit area of system 1 that can receive incident sunlight) that allows a desired power output, e.g., from a limited roof area.

Figure 4:
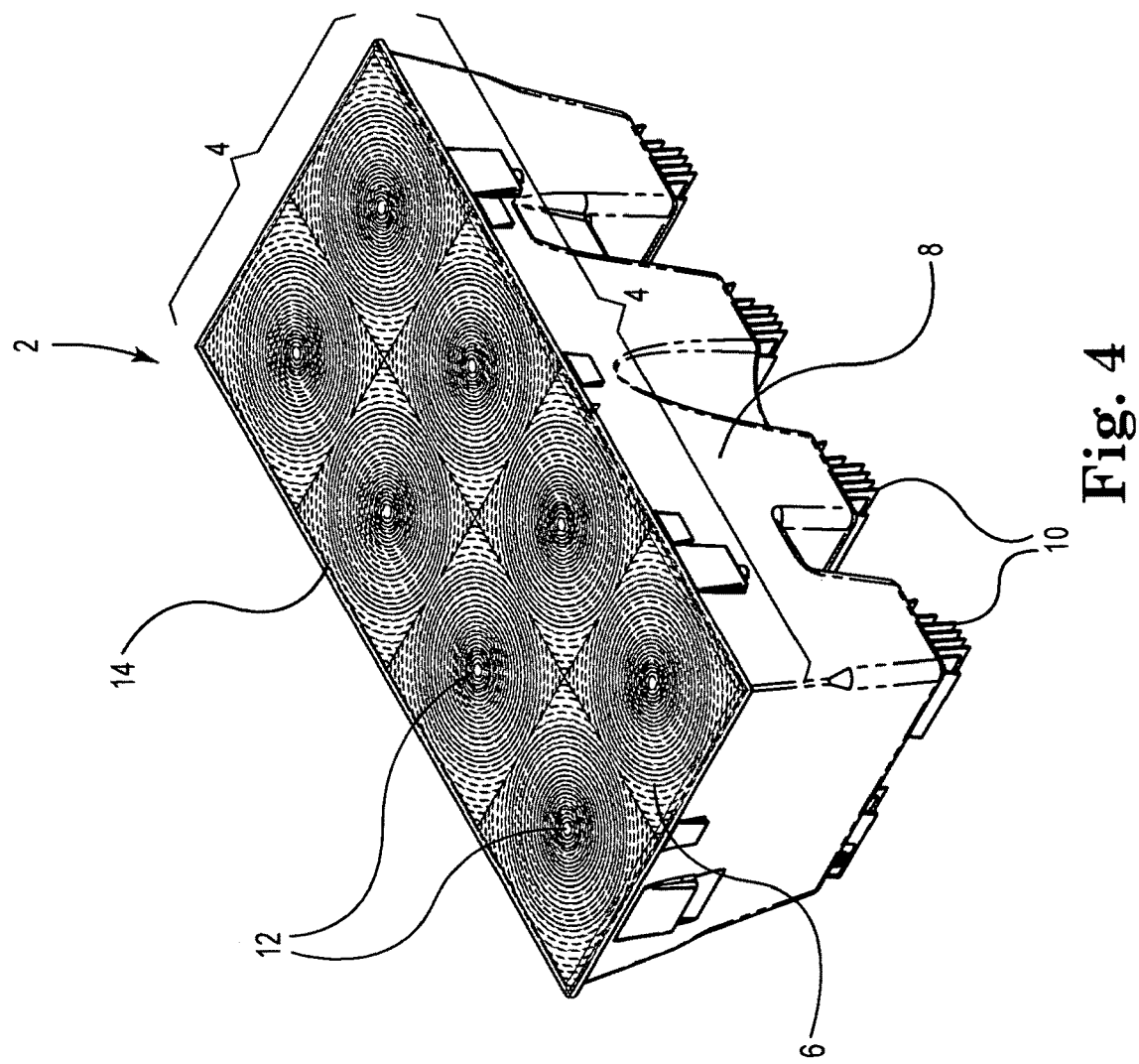
FIG. 4 shows a portion of a concentrator module, or "bucket", from the system of FIG. 1.
Figure 5:
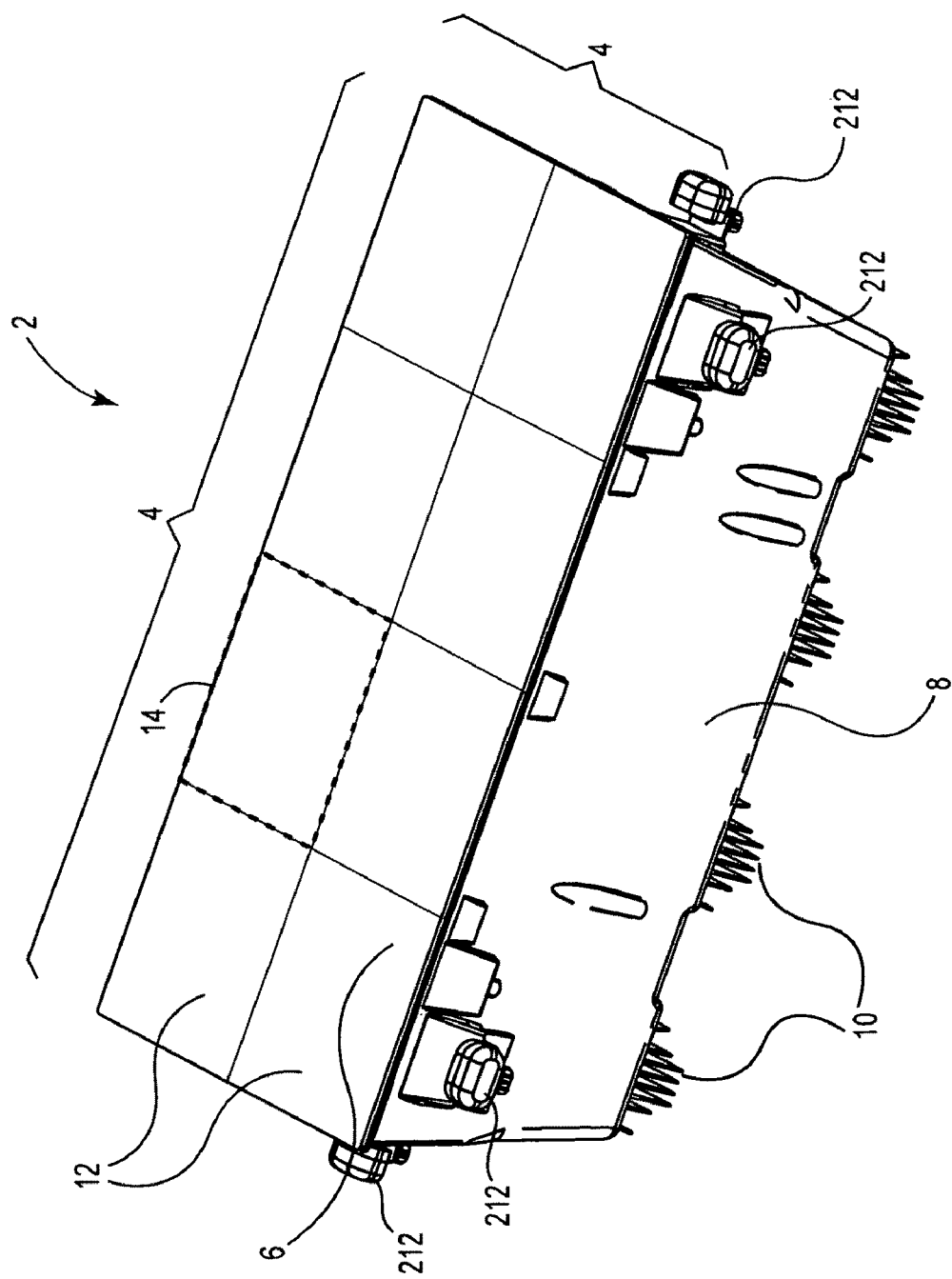
FIG. 5 shows a concentrator module, or "bucket", from the system of FIG. 1, including optional pointing sensors.

Referring to FIGS. 4 and 5, each solar concentrator module 2 (also referred to herein as photovoltaic concentrator module 2) includes a main body portion 8 (also referred to herein as "bucket"), a set of heat sink assemblies 10, an aperture 4 through which sunlight may enter the bucket 8, lens 6, wiring (not shown), an optional sun sensor. 212, an optional sunlight shield 160 (see FIG. 8), and one or more additional optional components described herein and/or known to be used in solar concentrator modules.

Figure 6:
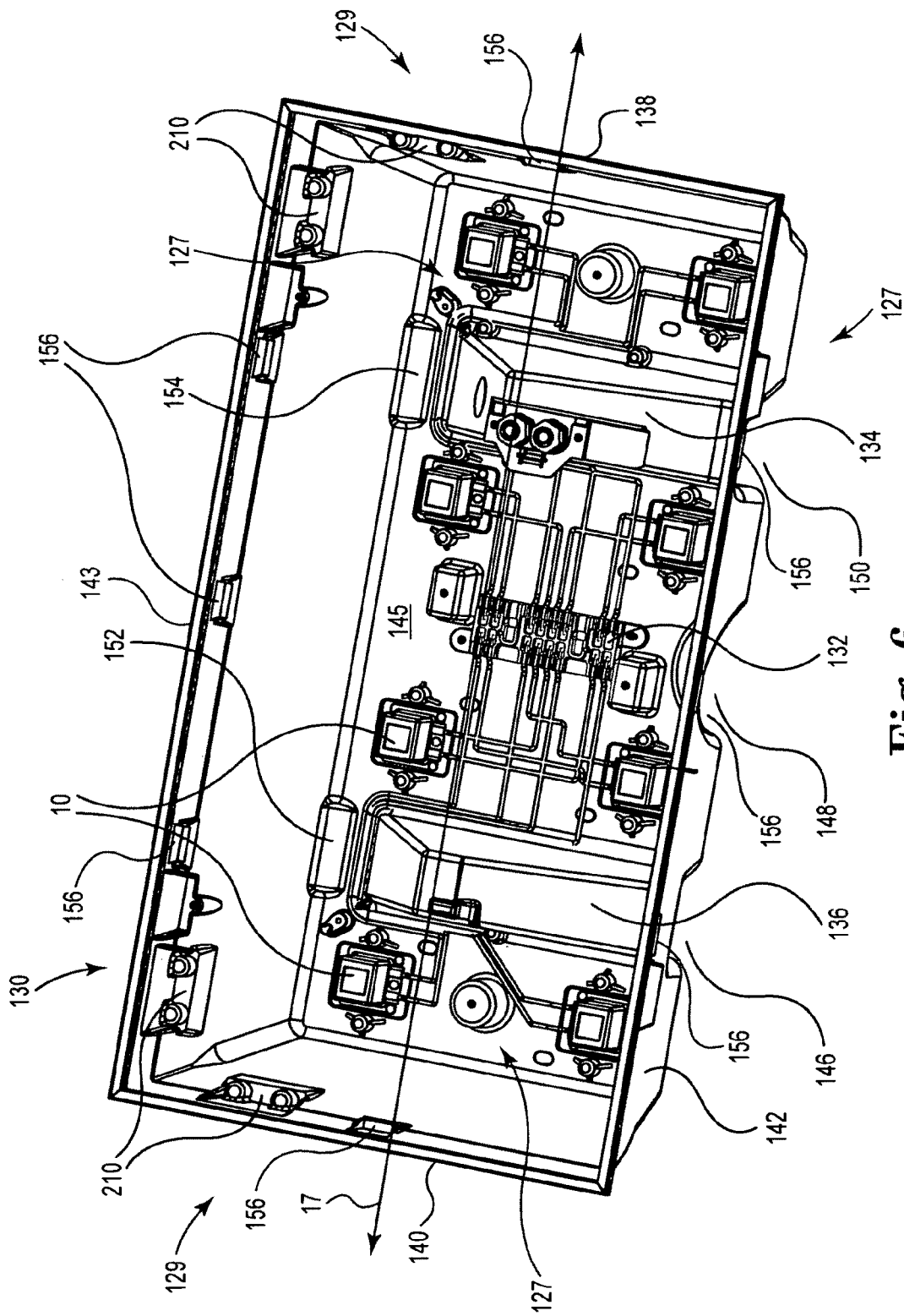
FIG. 6 shows a top view of a portion of a bucket assembly of a photovoltaic concentrator module used in the system of FIG. 1.

Referring to FIG. 6, as shown, bucket 8 includes side walls 138, 140, 142, and 143, and base (floor) 145. Side walls 138, 140, 142, and 143, and base 145 help define an inboard region 127 of bucket 8. As shown, bucket 8 also includes optional cavities 134 and 136, notches 146, 148, 150, 152, 154, and 156, and additional features discussed below.

As shown, cavities 134 and 136 permit the bucket 8 to attach to solar panel 1 at tip axis 17. The linkage (discussed below) of articulating mechanism 3 that is associated with tip axis 17 mates with bucket 8 in the pair of cavities 134 and 136. Tip axis 17 is preferably at or substantially near the center of gravity of bucket 8. Having tip axis 17 at or substantially near the center of gravity of bucket 8 can advantageously help minimize the amount of torque needed to move bucket 8 in tip motion and/or to hold bucket in one or more fixed positions along the range of tip motion.

Figure 7:
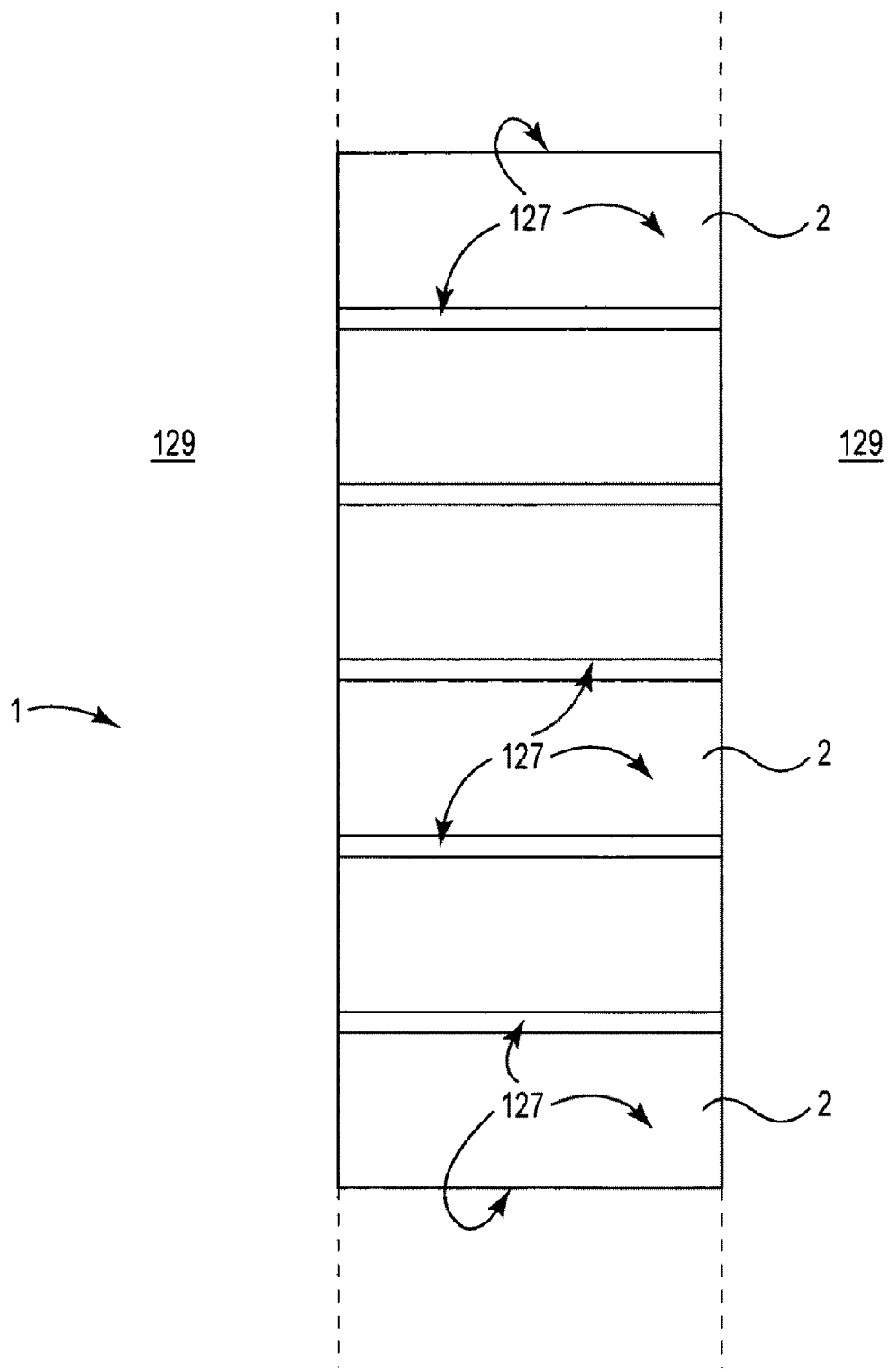
FIG. 7 shows the inboard and outboard regions of system 1 of FIG. 1.

In alternative embodiments, bucket 8 may be attached to articulation mechanism 3 by any number of mating points, and the mating points may be at any location. For example, in some alternative embodiments, there may not be any cavities 134 and 136, and the linkage of articulation mechanism 3 that is associated with tip axis 17 may mate with bucket 8 at the exterior surfaces 137 and. 139 of side walls 140 and 138, respectively. However, by attaching bucket 8 to the linkage elements of articulating mechanism 3 at one or more positions in the inboard region 127, instead of the outboard region 129, the overall width W of panel 1 can be relatively smaller. Otherwise, attaching bucket 8 to articulating mechanism 3 at one or more positions in the outboard region 129 may have the effect of increasing the overall width W of solar panel 1. Advantageously, reducing the overall width W of panel 1, relatively, while maintaining the same total collecting area, can increase the overall efficiency of panel 1, which can yield significant benefits in the overall economics of solar installations (e.g., rooftop installations). As used herein, "inboard region" of a solar concentrator means the volume of space between the side walls of a solar concentrator, the underside of a concentrator base, or the exterior surface of concentrator side walls that are approximately perpendicular to the tilt axis 15. By referring to FIG. 6, the inboard region 127 of bucket 8 includes the space between side walls 138, 140, 142 and 143, the exterior surface of side walls 142 and 143, and the underside of base 145. Within the inboard region of concentrator 2, concentrator 2 has an interior region defined as the space between side walls 138, 140, 142 and 143, below lens 6, and above base 145. As used herein, "outboard region" of a solar concentrator means the volume of space surrounding the side walls of a given solar concentrator that are approximately parallel with tilt axis 15. By referring to FIG. 6, the outboard region 129 includes the space outward from side walls 138 and 140. Referring to FIG. 7, in the context of system 1, the inboard region includes the interior area of the system footprint, the underside of the system footprint, and the exterior ends. The outboard region of system 1 includes the exterior area on the sides. Within the outboard region of concentrator 2, concentrator 2 has an exterior region defined as the space outward from side walls 138, 140, 142 and 143, outward from lens 6, and outward from base 145.

Preferably, a cavity does not impose on the path of the rays of sunlight converging on a heat sink assembly 10. In order to help achieve this, a cavity is positioned outside one or more converging cones of light. As shown, lens parquet 6 has four individual lenses 12 in the east-west direction. Cavities 134 and 136 are preferably positioned in base 145 such that cavities 134 and 136 are located outside of each converging cone of light associated with each lens 12. As shown, base 145 also has a space for wiring hub 132 (discussed below) that is located outside of each converging cone of light associated with each lens 12. Advantageously, by appropriately positioning features in the inboard region 127 of bucket 8, the pointing accuracy of bucket 8 can be relatively improved.

Figure 8:
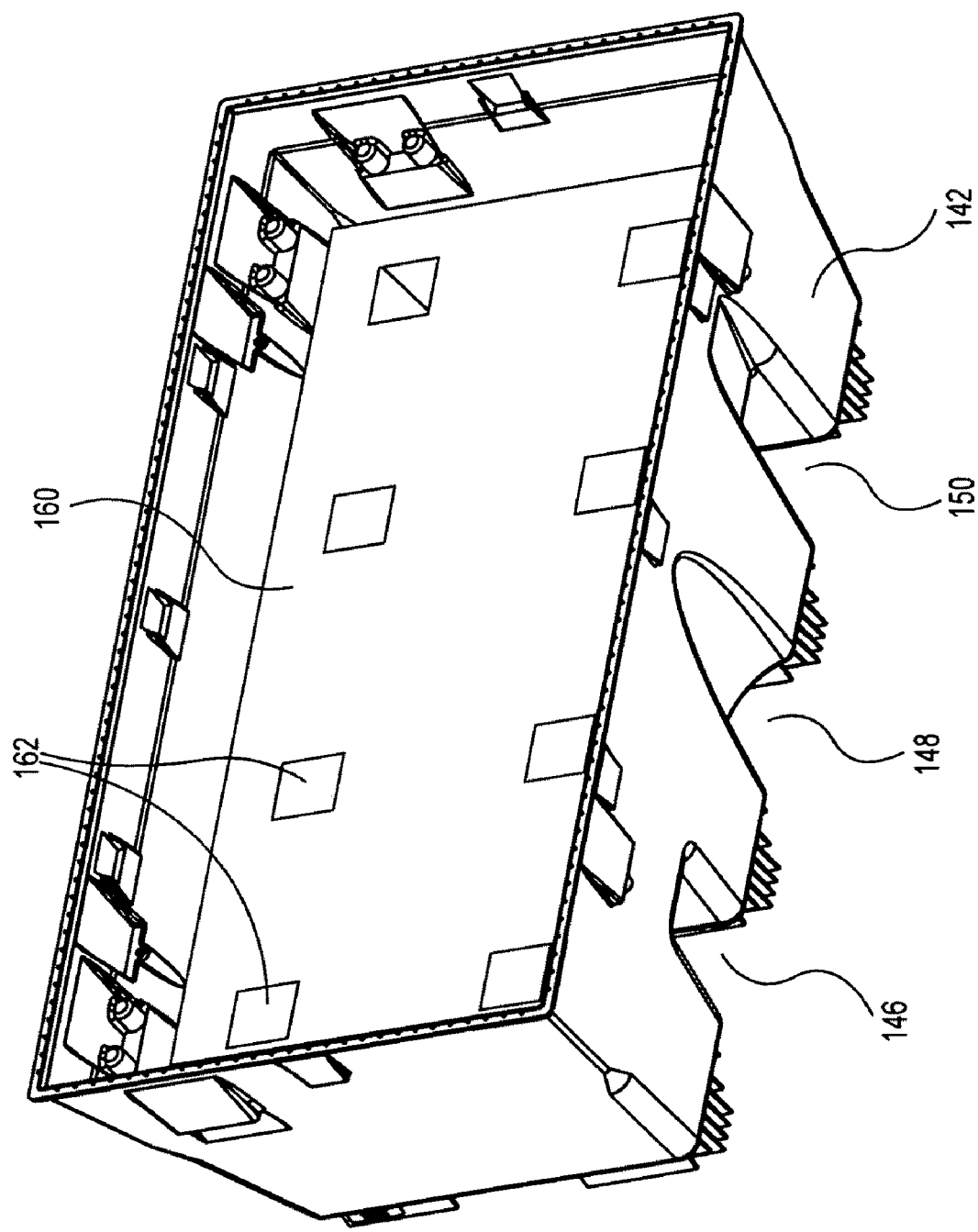
FIG. 8 shows the bucket assembly of FIG. 6 including a sun shield.

As shown in FIGS. 6 and 8, notches 146, 148, and 150, are located in southern side wall 142. As shown, notches 146 and 150 are aligned with cavities 136 and 134, respectively. Notches 146, 148, and 150 can help provide clearance for certain elements (discussed below) of articulation mechanism 3. Notches 146, 148, and 150 allow bucket 8 to have a desired range of motion about tip axis 17 while retaining the ability of the attachment linkage associated with tip axis 17 to mate with bucket 8 at or substantially near the center of gravity of bucket 8.

As shown, notches 152 and 154 can help bucket 8 have a desired range of motion in the northern direction, while still maintaining the low center of gravity.

The present invention also appreciates that the ability of the cavities 134 and 136, and notches 146, 148, 150, 152, and 154, to provide for the desired range of articulation, while still allowing attachment at the center of gravity, is related to the aspect ratio of the bucket. For example, an alternative embodiment with a 4 by 3 lens parquet, instead of the preferred 4 by 2, can suffer from a reduced range of motion in tip, since the base of the bucket begins to collide with the support structure when moving through a desired range of motion, in spite of the cavities and notches. The preferred aspect ratio is thus strongly affected by the preferred cavities and notches and range of motion, because cavities and notches are preferably sizeable enough to provide a desired clearance for the support structure and attachment linkage that might impinge upon the converging cones of light focused by the lenses 6 and/or upon the input aperture 4, thus blocking light and reducing the power output of the system 1. The preferred aspect ratio is influenced by the desired range of motion together with the desire to couple the attachment linkage about the tip axis 17 within the interior of bucket 8. As shown, eight notches 156 are provided in the bucket 8 to help support an optional (not shown) support frame for the lens parquet 6. In a preferred embodiment, the frame can include four strips of sheet metal. Each strip of sheet metal can be coupled between a pair of oppositely positioned notches 156. As shown, three pairs of oppositely positioned notches 156 each run north-south and one pair of oppositely positioned notches 156 runs east-west. By positioning each strip of sheet metal in this preferred manner, each strip of sheet metal can be aligned edge-on to the incoming sunlight and along the seams of the eight individual lenses 12 of parquet 6. Advantageously, the strips of sheet metal tend to not block incoming sunlight to an undue degree. Also, the support frame can advantageously help mitigate any sag of lens 6 that may occur and/or help provide support to the lens 6 so as to help withstand impacts.

Figure 9:
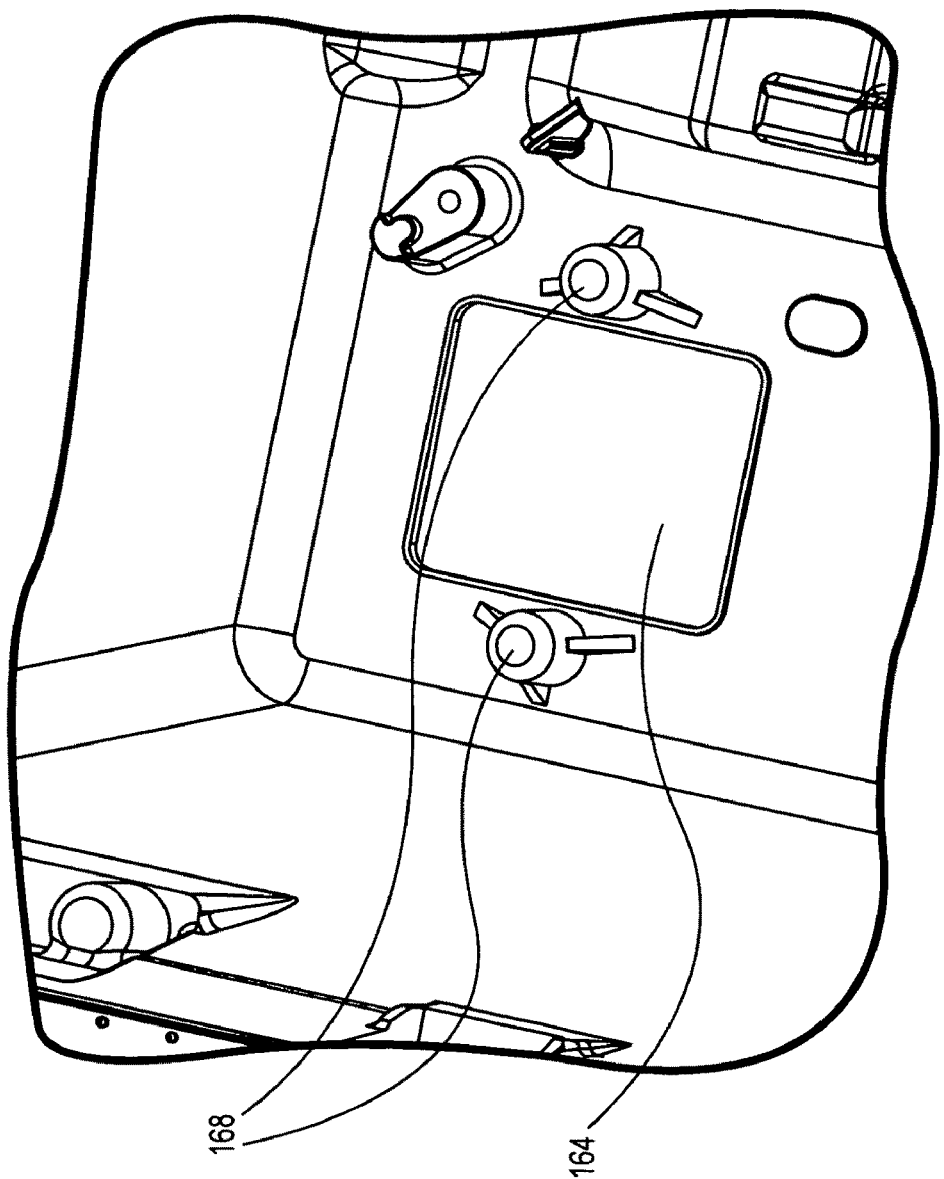
FIG. 9 shows a top, close-up, sectional view of the bucket in FIG. 6 with the heat sink assemblies removed.
Figure 10:
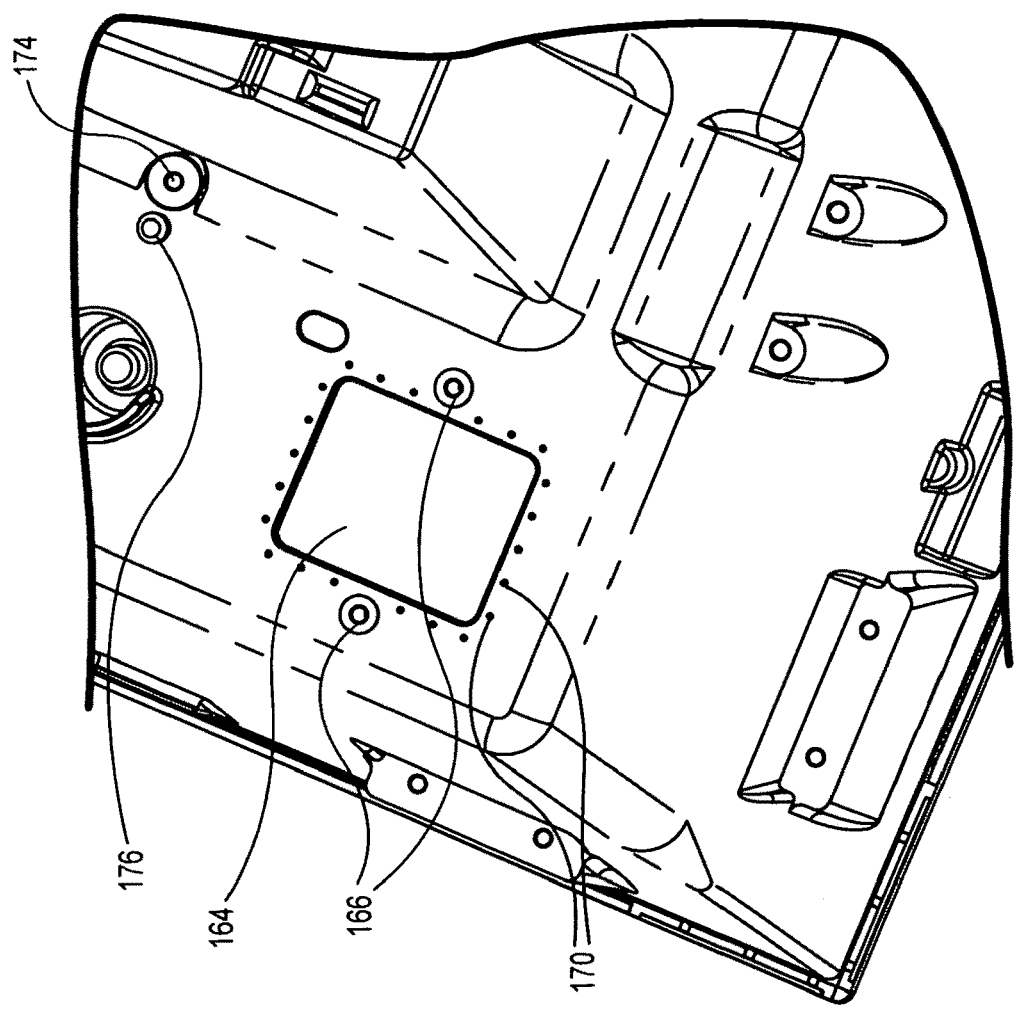
FIG. 10 shows a bottom, close-up, sectional view of the bucket in FIG. 6 with the heat sink assemblies removed.

Bucket 8 includes eight optional mounting holes 164 and eight pairs of optional inserts 166. FIGS. 9 and 10 show a mounting hole 164 and pair of inserts 166. A heat sink assembly 10 (discussed below) can be positioned in mounting hole 164 and attached to bucket 8. In preferred embodiments, heat sink assembly 10 is attached to bucket 8 using inserts 166. Preferably, inserts 166 are threaded and fit into (e.g., molded into) gusseted cavities 168. The fasteners (e.g., screws or the like) that go into inserts 166 hold the heat sink assemblies 10 to the bucket 8 adequately, but typically do not create a desirable watertight seal. Therefore, a watertight adhesive seal is preferably applied to at least a portion of the perimeter of hole 164.

As shown in FIG. 10, bucket 8 also includes optional "buttons", or raised dots, 170. Buttons 170 can help control the thickness of the bond line of an adhesive that may be used to seal heat sink 62 (discussed below) to bucket 8. As shown, buttons 170 can help define a certain space between the bucket 8 and the heat sink 62. Accordingly, buttons can help provide a uniform bond line and a desirable seal. In preferred embodiments, buttons 170 are molded into bucket 8.

As shown in FIG. 10, bucket 8 also includes optional slot 172, insert 174 (preferably threaded), and raised nub 176, which are used to attach a mounting bracket 380 (discussed below) to bucket 8.

Figure 11:
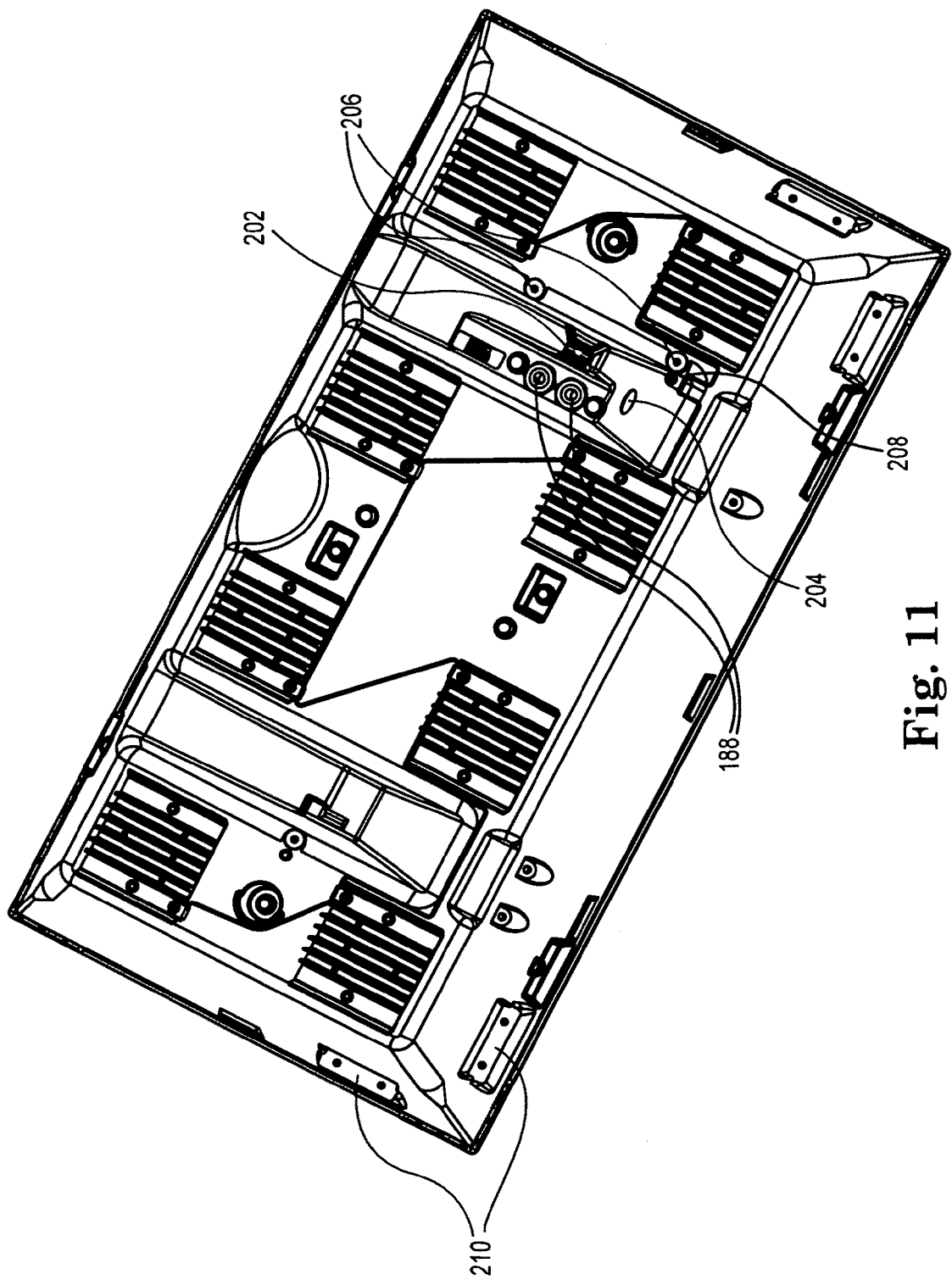
FIG. 11 shows a bottom view of the bucket shown in FIG. 6 with the back end assemblies removed.
Figure 12:
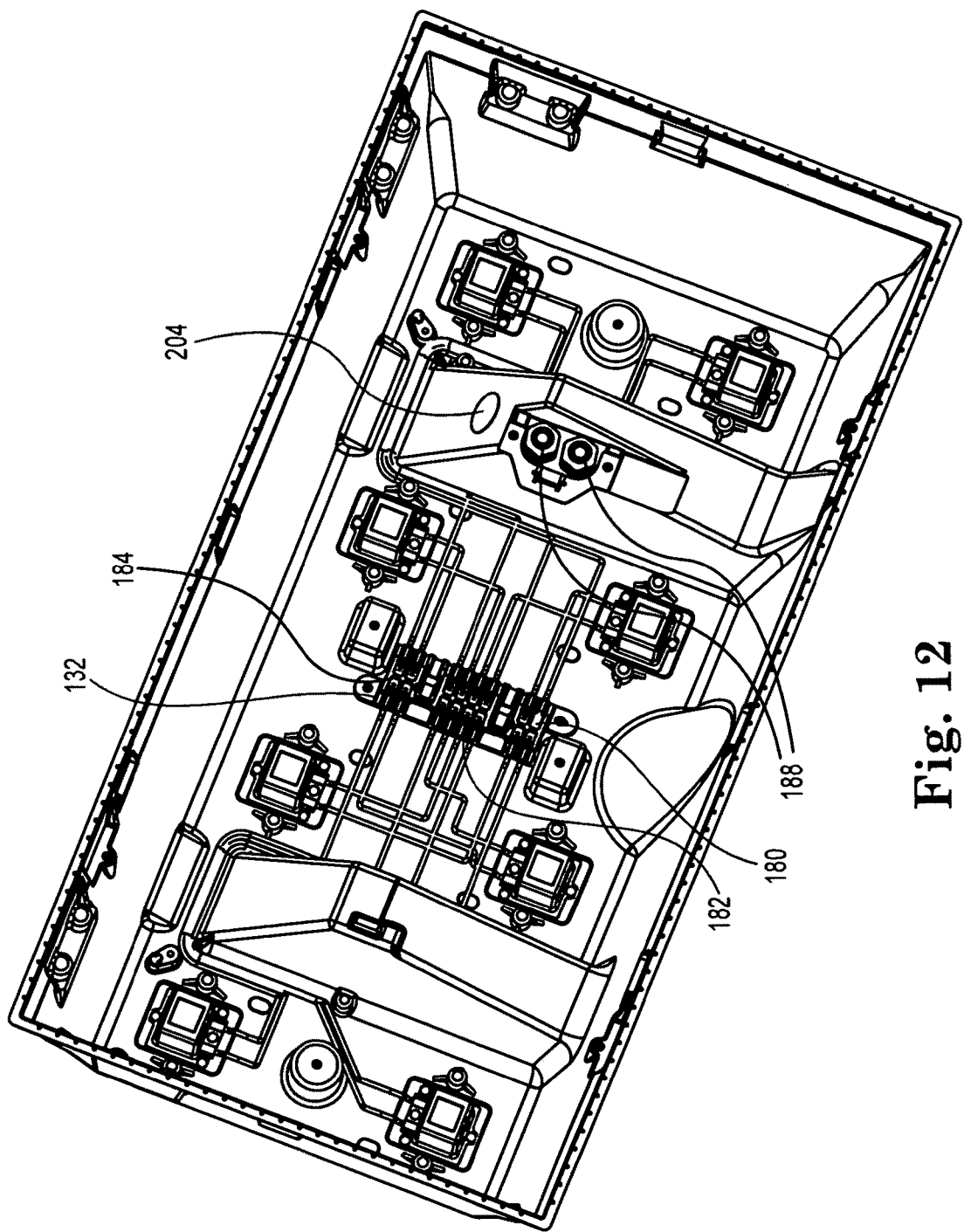
FIG. 12 shows a top, close up view of the bucket in FIG. 6 with the back end assemblies removed.
Figure 13:
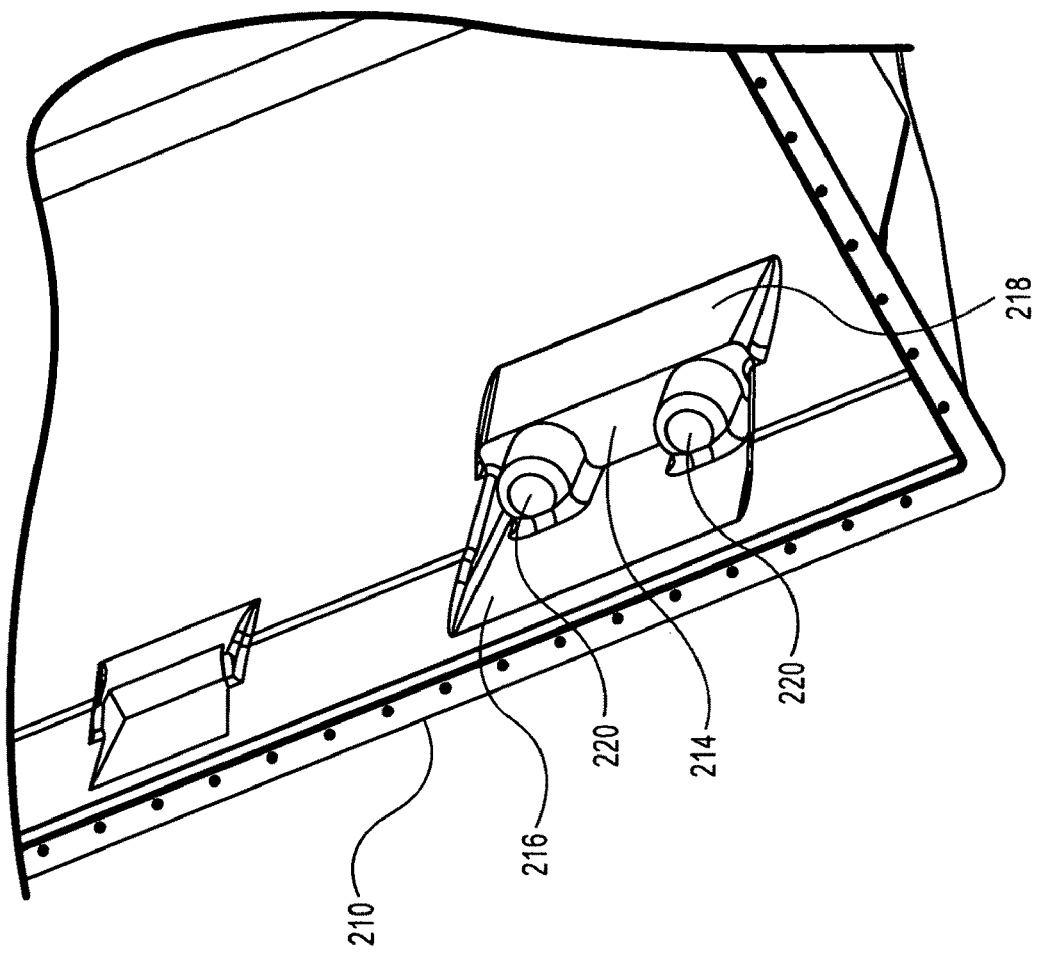
FIG. 13 shows a close-up view of a portion of the bucket in FIG. 6 with the back end assemblies removed.

A bucket according to the present invention can optionally include one or more vent ports. Vent ports can allow the air in the inboard region 127 of the concentrator module 2 to equalize in pressure with the air outside of the module 2, as the barometric pressure outside the module 2 varies with time. Allowing the air pressure in concentrator 2 to equalize with the atmosphere can help enhance the reliability of concentrator 2. As shown in FIGS. 11 and 12, bucket 8 includes vent port 204. As shown, one exemplary location for vent port 204 is on cavity 134 so that vent port 204 is relatively inaccessible to fingers, tools, and the like.

Vent port 204 preferably includes a semi-permeable membrane. For example, vent port preferably includes a gas-permeable filter to help prevent contaminants and liquid (e.g., water) from entering the concentrator module 2. Even more preferred, vent port 204 includes a gas-permeable filter that is also permeable to water vapor, such that any condensation that may form inside the bucket 8 can escape, such as, for example, when the module is pointed at the sun in the morning and begins to warm up.

Exemplary filter material includes any gas-permeable material suitable for a solar concentrator such as a film, a foam, combinations of these, and the like. One exemplary material includes an adhesive expanded polytetrafluoroethylene (ePTFE) patch commercially available under the tradename Gore-Tex® from W. L. Gore & Associates, Inc., Newark, Del. Another exemplary material is commercially available under the tradename Tyvek® from DuPont, Wilmington, Del.

Bucket 8 can optionally include one or more mounting features 210. Mounting feature 210 can be used to mount sun sensor 212 (discussed below). As shown in FIGS. 1, 5, 6, 11, and 13, bucket 8 preferably includes at least four mounting features 210. As shown, mounting feature 210 includes ledge 214 between two beveled regions 216 and 218, and two recesses 220 for fastening sun sensor 212 to mounting feature 210. Any type of fastener suitable for mounting sun sensor 212 to mounting feature 210 can be used such as screws and the like. In a preferred embodiment, self-tapping screws can be used to fasten sun sensor 212 to mounting feature 210. Preferably, recesses 220 have a form such that mounting feature 210 will remain substantially watertight if a sun sensor 212 is not installed on mounting feature 210. In some embodiments, sun sensors 212 are installed on fewer than all mounting features 210 of a given solar panel. For example, as shown in FIG. 1 four sun sensors 212 are installed on one of the six concentrator modules 2.

The range of motion of bucket 8 about the tip axis 17 can be any desired range of motion. In the embodiment shown, the range of articulation about the tip axis 17 is asymmetric. The preferably asymmetric range of motion helps ease the attachment of the tip axis support at the center of gravity of the bucket 8. In preferred embodiments, the range of tip motion can be from 20 degrees from zenith in a first direction to 70 degrees from zenith in a second direction. In preferred embodiments, the first direction is north if in the northern hemisphere and the second direction is south if in the northern hemisphere.

Preferably, cavities 134 and 136 are asymmetric in shape relative to the tip axis 17 of rotation to correspond to the asymmetric range of motion. As shown in system 1, cavity 134 is located on the east side of module 2 and cavity 136 is located on the west side of module 2. The notions of "east" and "west" come about because of an asymmetric range of motion. Since the solar panel 1 can have a preferred installation orientation (e.g., on a roof), there is a notion of east and west sides of bucket 8. Of course, these definitions are with respect to the northern hemisphere. If solar panel 1 is installed in the southern hemisphere, these directions are reversed.

FIG. 8 shows optional sunlight shield 160. During acquisition of the sun, high-intensity spots of sunlight may impinge on one or more features located in the inboard region 127 of bucket 8 (e.g., the base 145 of bucket 8, wiring, combinations of these, and the like). In order to help protect the base 145 of bucket 8 and the wiring located in bucket 8 from this high-intensity sunlight, a sunlight shield 160 is provided to help deflect the sunlight. The sun shield includes apertures 162 which allow the converging sunlight beams to reach the inputs of the secondary optics 24. Standoffs in the bucket 8 help prevent the sunlight shield 160 from contacting the internal wiring or the wiring hub 132. Sunlight shield 160 can be made of any material that helps suitably deflect incoming sunlight. A preferred material for constructing sunlight shield 160 includes aluminum sheet metal.

Bucket 8 can be made from one or more materials suitable for an articulating photovoltaic concentrator. Desirable material properties for bucket 8 include fire resistance, long-term dimensional stability, precision manufacturability, resistance to ultraviolet radiation, watertightness, structural strength, low thermal expansion, low cost, low to substantially no outgassing (low VOC), combinations of these, and the like. Exemplary materials of construction for bucket 8 include one or more materials such as plastic, metal (e.g., aluminum sheet metal), epoxy, and combinations thereof. Preferred plastic materials include thermosetting materials. Preferred thermosetting materials include epoxy, sheet molding compound (SMC), bulk molding compound (BMC), and combinations thereof. Sheet molding compound is a fiber-glass (typically relatively long glass fibers) reinforced thermosetting compound in the form of a sheet. Sheet molding compound can also include one or more of fillers, maturation agent, catalyst, and mold release agent. Bulk molding compound is a "puttylike" compound that is a blend of thermoset plastic resin and fiber-glass (typically relatively short glass fibers). Bulk molding compound can also include one or more of filler, catalyst, stabilizer, pigment. In preferred embodiments, bucket 8 is manufactured from material including at least sheet molding compound.

In terms of manufacturing bucket 8, molding a thermosetting plastic is preferred because molding can form bucket 8 having one or more complex features with relatively fewer pieces. For example, mounting feature 210 is a relatively complex feature that is preferably positioned on a side wall of bucket 8 as close to aperture 4 as possible. Also, mounting feature 210 is preferably positioned such that mounting feature does not interfere with incoming light in inboard region 127 to an undue degree. As shown, ledge 214 of mounting feature 210 can be positioned in a side wall of bucket 8 such that part of ledge 214 protrudes into inboard region 127 and part of ledge 214 protrudes into the exterior space of bucket 8. Advantageously, mounting feature 210 can be positioned relatively close to aperture 4 of bucket 8 by positioning ledge 214 in such a manner. The two beveled regions 216 and 218 can advantageously provide draft angle characteristics that permit ledge 214 to be positioned in such a manner using molding techniques. Having appropriate draft angle characteristics can permit a feature to be desirably removed from a mold.

Forming bucket 8 with relatively fewer pieces can be highly advantageous because, as discussed above, bucket 8 can include one or more complex features. Forming bucket 8 from sheet metal would typically involve assembling relatively more individual complex parts and fasteners. But by molding a thermosetting material into bucket 8, the complexity of the bucket 8 can typically be absorbed into the cost of tooling, which can be done once, and the cost to replicate buckets 8 in high volume can then be typically less than for a sheet metal bucket 8. In preferred embodiments, bucket 8 is a seamless, unitary piece made from sheet molding compound.

Forming bucket 8 from a plastic is advantageous because of the relatively light weight of bucket 8, helping to reduce the weight of the overall system 1 and ease the installation and handling of system 1. In preferred embodiments, system 1 can weigh less than about 100 pounds.

One method of making bucket 8 from sheet molding compound can include placing one or more sheets or portions of sheets of sheet molding compound over a female plug. The female plug can include the features of the inside of bucket 8. Then a male plug can be mated with the female plug so that the sheet molding compound is compressed between the female plug and male plug. Typically, the sheet molding compound is compressed between the female and male plug at an elevated temperature to cause the thermosetting plastic to at least begin to cure. Forming bucket 8 in this manner can allow complex features to be precisely positioned in bucket 8 and consistently positioned from bucket 8 to bucket 8. Also, co-molded parts such as, for example, threaded inserts and the like, can be precisely placed in bucket 8 and consistently placed from bucket 8 to bucket 8.

Advantageously, the selection of sheet molding compound for the preferred embodiment of the bucket can help meet cost targets while at the same time allowing one or more of the features discussed above to be included in bucket 8.

Figure 14:
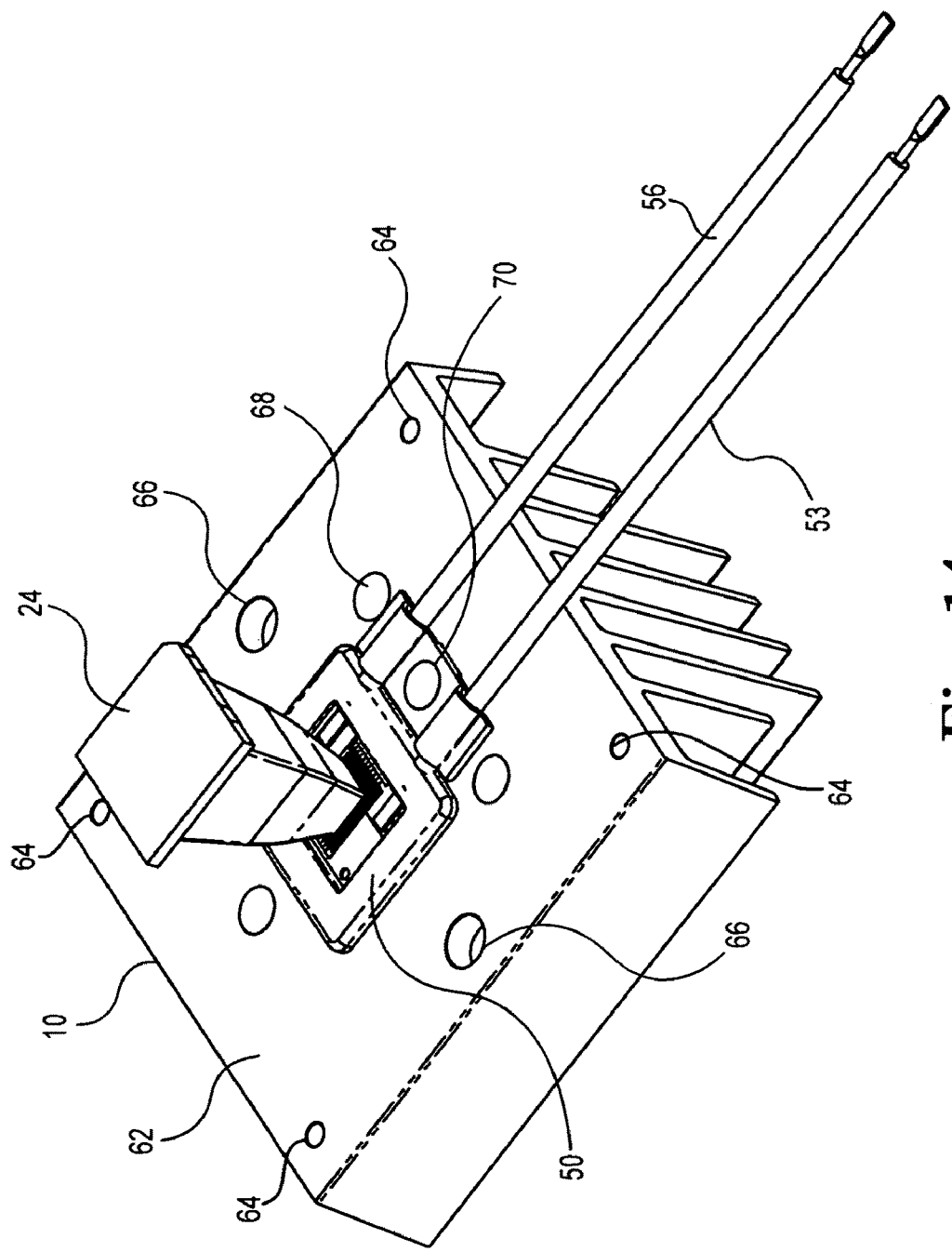
FIG. 14 shows the solar cell assembly of FIG. 18 mounted onto a heat sink and having the secondary optic of FIG. 8 mounted onto the solar cell assembly.
Figure 15:
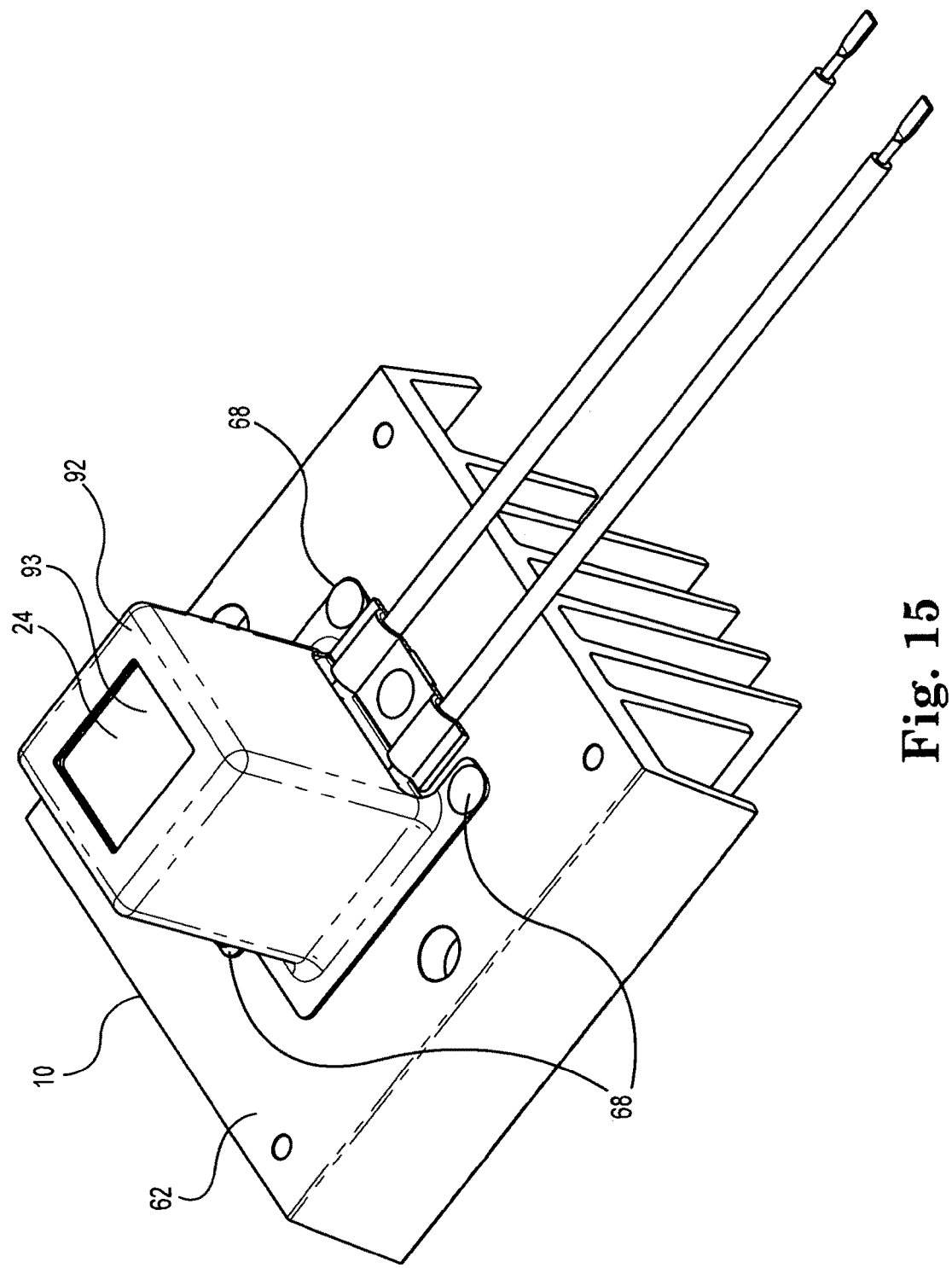
FIG. 15 shows a completed back end assembly that can be used in the system of FIG. 1.
Figure 16:
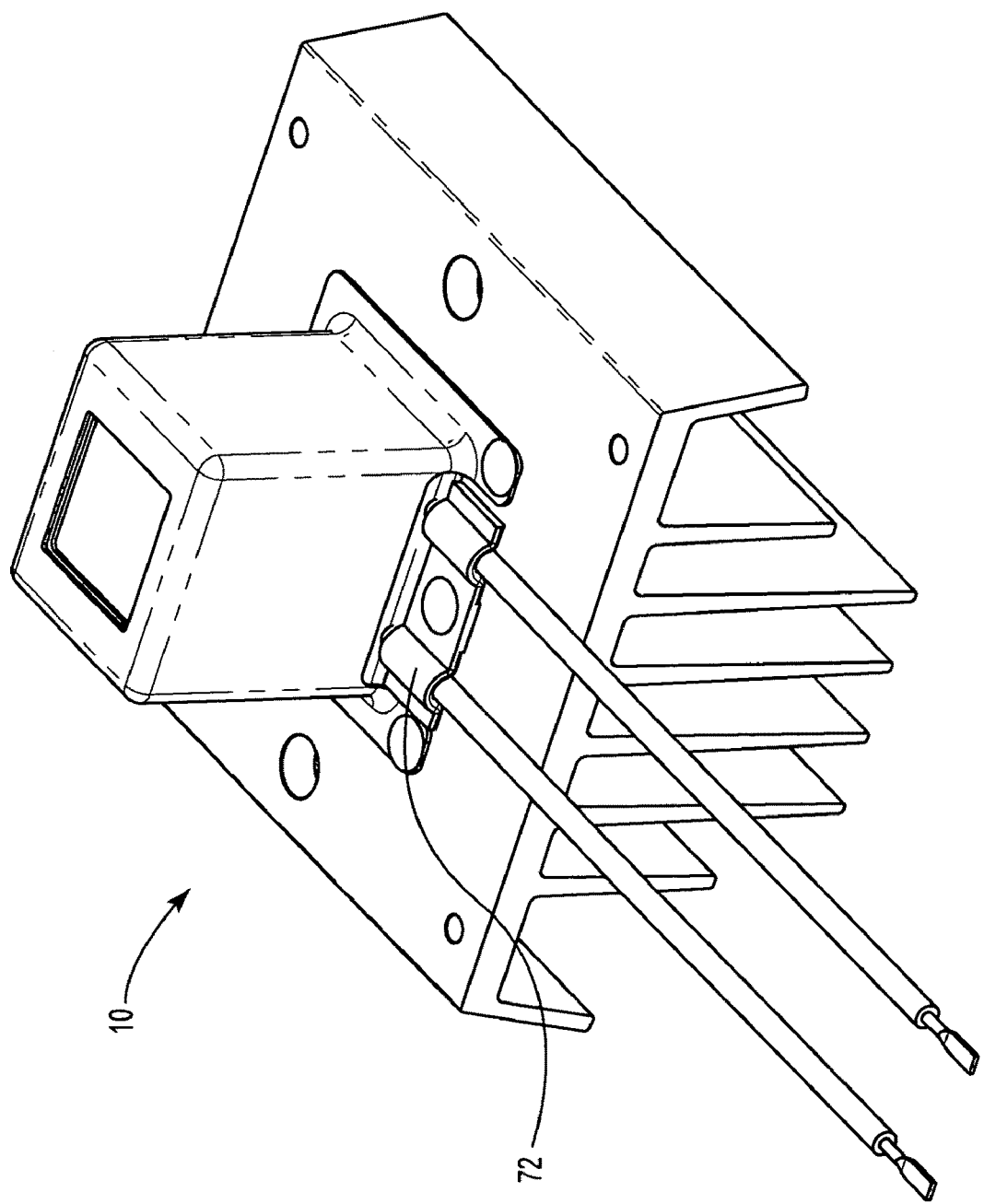
FIG. 16 is another view of the back end assembly shown in FIG. 15, with the can portion in a transparent view to see the interior.

As shown in FIGS. 14-16, heat sink assembly 10 includes heat sink 62, solar cell assembly 50, secondary optic 24, and housing 92.

Figure 17:
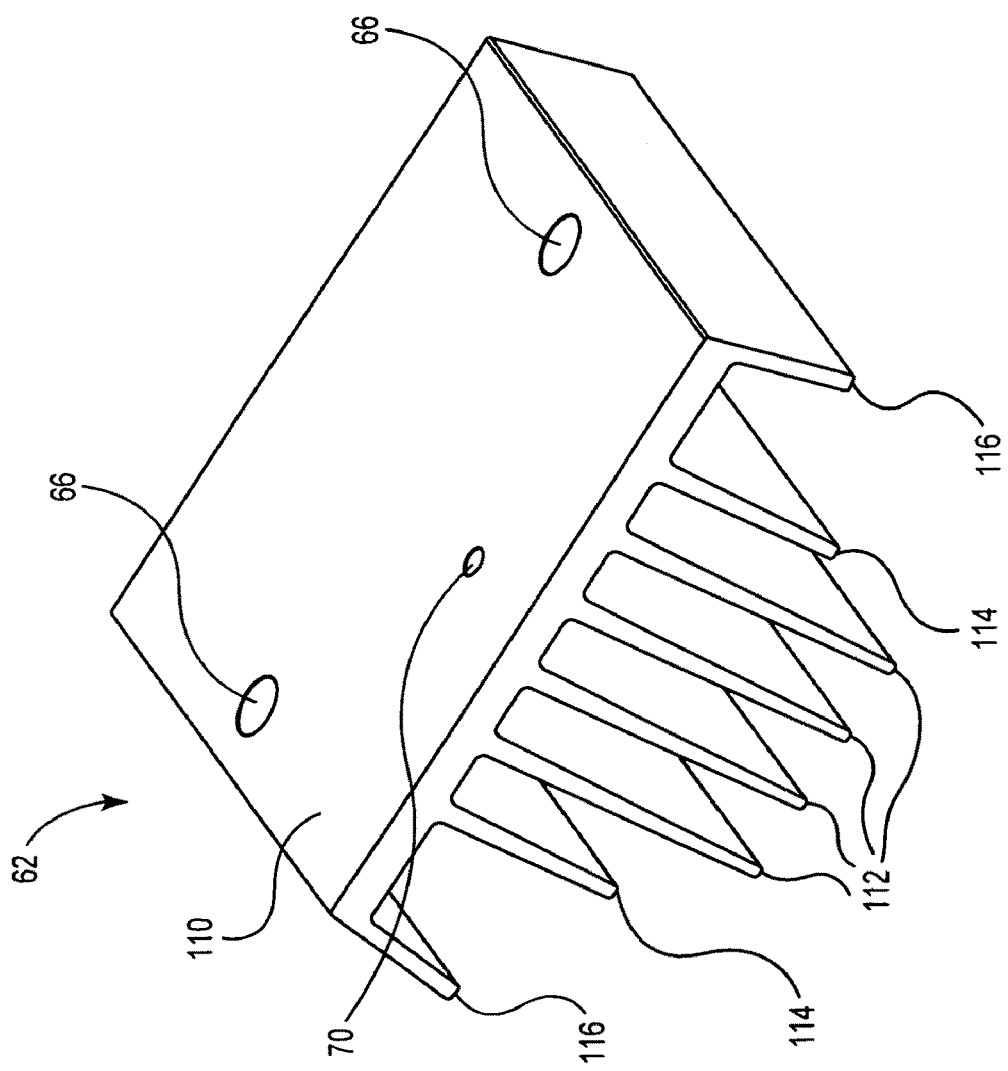
FIG. 17 shows a perspective view of the heat sink shown in FIG. 15.

Heat sink 62 preferably includes holes 66 and 70, as well as holes (not shown) to accommodate rivets 68. As shown, heat sink 62 optionally includes holes 64. Hole 70 can be included to accommodate attachment of optional wiring clamp 72, as shown in FIG. 16. Holes 66 are preferably used to mount heat sink assembly 10 to bucket 8 using any suitable fastener (e.g., screws or the like). Holes 66 are preferably oversized to allow minor adjustment of the position of heat sink assembly 10 with respect to the bucket 8 prior to final fastening. Holes 64 may be used, for example, to attach grounding wires to the heat sink 62. Referring to FIG. 17, the heat sink 62 is shown with solar cell assembly 50 removed before holes 64 and holes (not shown) for rivets 68 are included.

As shown, heat sink 62 includes a base plate 110, and fins 112, 114, and 116. Fins 112, 114, and 116 preferably have different lengths. Fins 112, closest to the heat source (as shown, solar cell assembly 50) that is thermally coupled to heat sink 62, are preferably the longest. Fins 116, furthest from the heat source (as shown, solar cell assembly 50) that is thermally coupled to heat sink 62, are preferably the shortest. Varying fin height can have the effect of keeping the path from the heat source (e.g., solar cell assembly 50) to the tip of each fin 112, 114, and 116, similar, which is desirable since longer source-to-tip distances typically require thicker metal in order to achieve equivalent thermal conduction from source to fin tip. In addition, fins 116 are preferably angled outward so as to increase the overall projected area of the heat sink 62 as seen from the bottom of heat sink 62. Increasing the projected area can improve the radiative performance of the heat sink 62.

While heat sink 62 is a preferred embodiment, any number of fins of any length, angled at any angle, may be used in connection with concentrator 2. Alternative heat sinks include, for example, pin heat sinks, corrugated sheet metal heat sinks, and the like.

Heat sink 62 can be made from any material suitable for transferring heat in a desirable manner from solar cell assembly 50. In one preferred embodiment, heat sink 62 is made from material including aluminum. The aluminum can by anodized such as clear-anodized or black anodized. In preferred embodiments, the aluminum is clear-anodized which has been observed as helping to improve radiative performance without unduly impacting convective performance.

Figure 18:
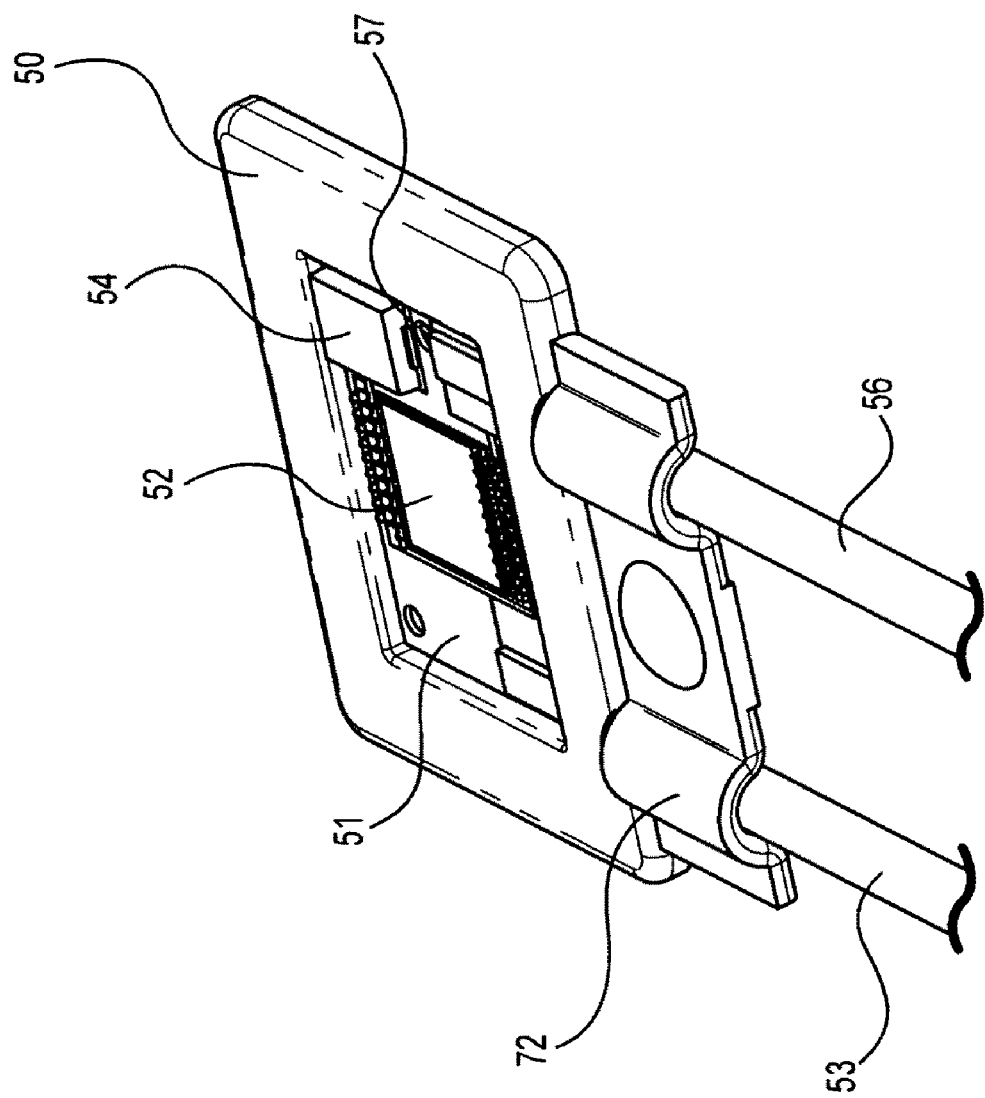
FIG. 18 shows a preferred solar cell assembly that can be used in the system of FIG. 1.
Figure 19:
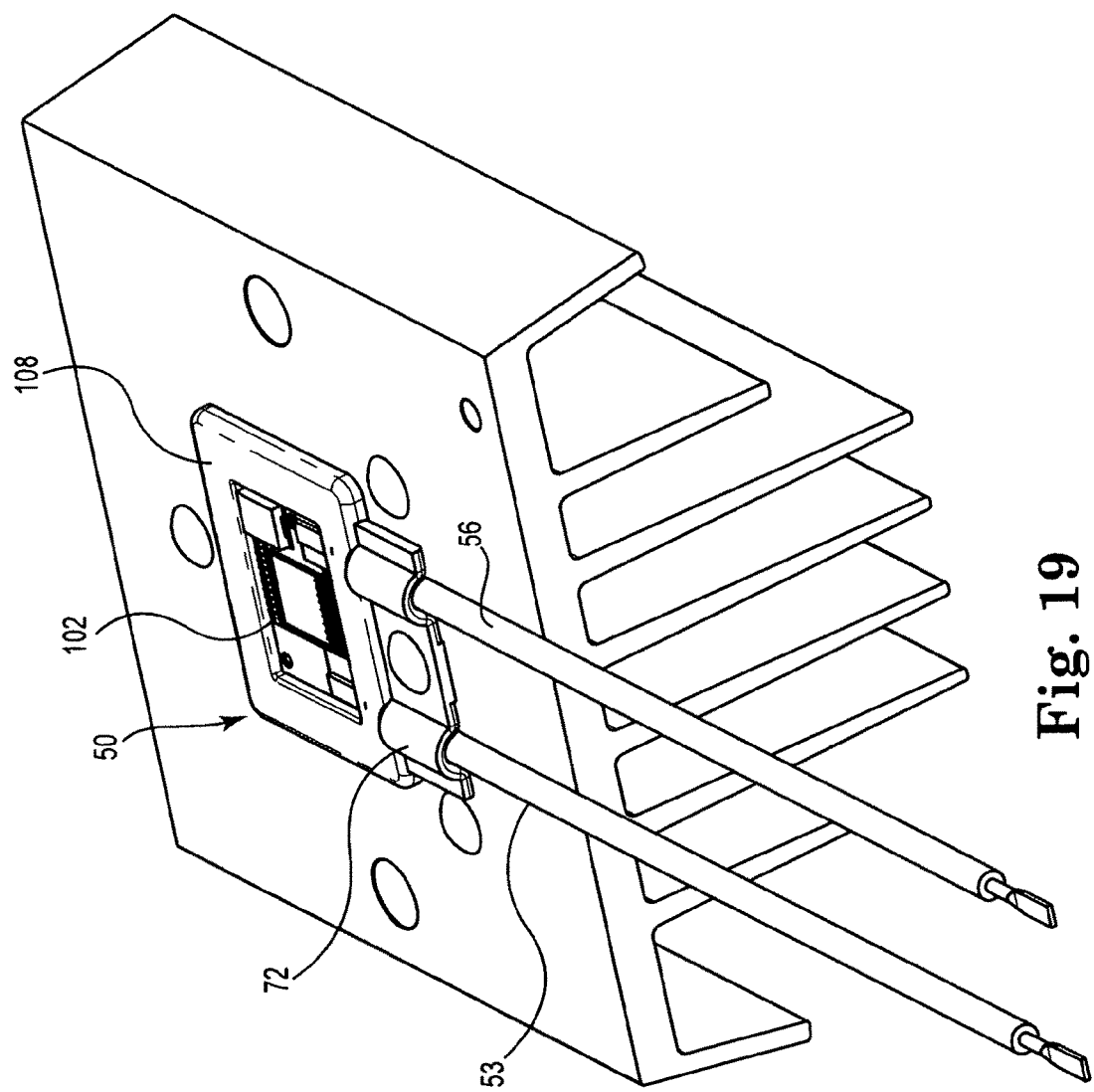
FIG. 19 shows a close-up view of a portion of the solar cell assembly shown in FIG. 18.

As shown in FIG. 18, solar cell assembly 50 includes a solar cell 52, a bypassing element 54, circuit board 51; and electrical wires 53 and 56.

The solar cell 52 can be any type and size that is suitable for use in a solar concentrator. A preferred solar cell includes a high-efficiency triple-junction solar cell, such as that manufactured by Emcore or Spectrolab. As shown, solar cell 52 is preferably a square (e.g., seven and one-half (7.5) millimeters by seven and one-half (7.5) millimeters).

Bypassing element 54 is optional and may be a diode or another type of element, such as an active element such as a metal-oxide-semiconductor field-effect transistor (MOSFET). A MOSFET is a device that can be used to amplify or switch an electronic signal. Bypassing element 54 is preferably a diode. As is well known in the art, a bypassing element can help provide an alternate path for current flow in cases where power is not being produced, for example, when a shadow blocks light from reaching the solar cell 52. Providing an alternate current path besides through the solar cell 52 itself helps to allow bucket 8 and system 1 to continue to produce a desired power output even if one or more of the solar cells 52 is not producing any power. Circuit board 51 can be any electrical wiring that can function as a circuit board and that is suitable for use in solar cell assembly 50. As shown, solar cell 52 and bypassing element 54 are attached to circuit board 51. Solar cell 52 and bypassing element 54 can be attached to circuit board 51 by any manner suitable for use in solar cell assembly 50. In preferred embodiments, the solar cell 52 is attached to circuit board 51 in a substantially void-free manner. For example, a conductive epoxy could be used to bond solar cell 52 to circuit board 51 in a substantially void-free manner.

The circuit board 51 can be made of any material suitable for use as a circuit board in solar cell assembly 50. A preferred circuit board 51 includes a substrate having at least a first layer that is electrically insulating and a second layer that is electrically conductive, where the second layer is electrically coupled to solar cell 52 and optional bypassing element 54. Preferably, the first layer is thermally conductive. An even more preferred circuit board 51 includes a substrate having at least first and second faces that are electrically conductive, and an electrically insulating core sandwiched between the first and second faces. Preferably the electrically insulating core is thermally conductive. A preferred electrically insulating material includes ceramic material. Preferred electrically conducting material includes metal. In some embodiments, the first and second electrically conducting faces can be two different metals. If two different metals are used for first and second electrically conducting faces, preferably the linear thermal expansion is matched among the first and second faces. Advantageously, a circuit board having at least first and second faces that are electrically conductive, and an electrically insulating core sandwiched between the first and second faces, can prevent warping ("potato-chipping") of the substrate that might otherwise occur due to changes in temperature. A preferred circuit board 51 includes a "direct-bonded copper" ("DBC") double-sided copper substrate. DBC double-sided copper substrates are well known and include a ceramic tile having a sheet of copper bonded to each side. Exemplary ceramic tiles can be made out of alumina, aluminum nitride, beryllium oxide, combinations of these, and the like.

Wires 53 and 56 help provide an electrical circuit so that photovoltaically generated electricity can be delivered from solar cell 52 as electricity is generated. Wires 53 and 56 can be attached to solar cell assembly 50 in any suitable manner. Resistance-welding wires 53 and 56 is a method of attachment because resistance-welding can occur over such a relatively quick time period that the heat generated for welding typically is not unduly transferred away by surrounding heat sinks such as, e.g., heat sink 62. Also, because resistance-welding can occur over such a relatively short time period, heat generated from the welding process typically does not transfer to surrounding solder-joints in a manner that causes the solder-joints to unduly soften and/or become undone.

The solar cell assembly 50 preferably includes fiducial marks, such as holes 57, for aid in automated assembly, such as in assembly using a machine vision system to precisely locate the solar cell assembly 50 into the bucket 8.

Figure 20:
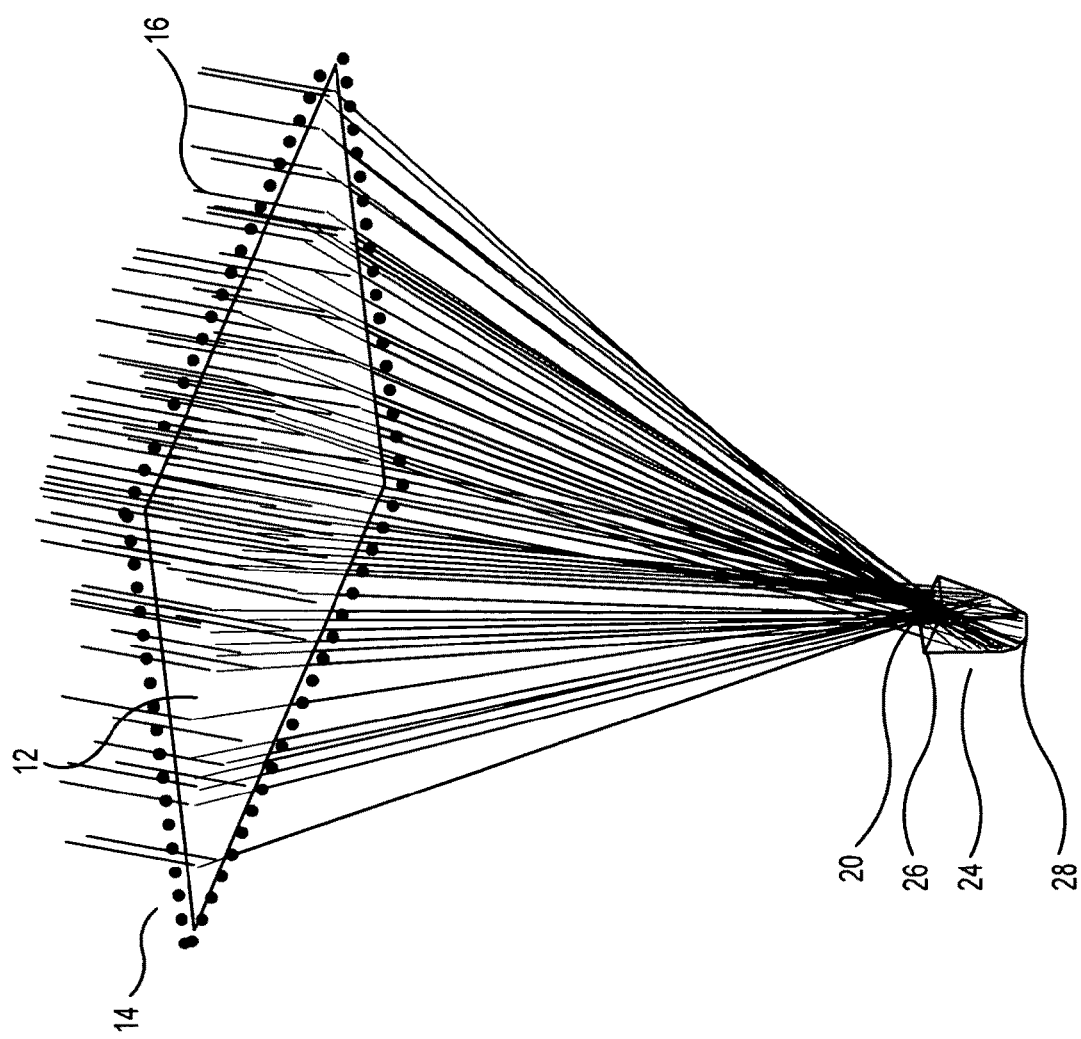
FIG. 20 shows one of the eight concentrating elements from the concentrator module shown in FIGS. 4 and 5.
Figure 21B:
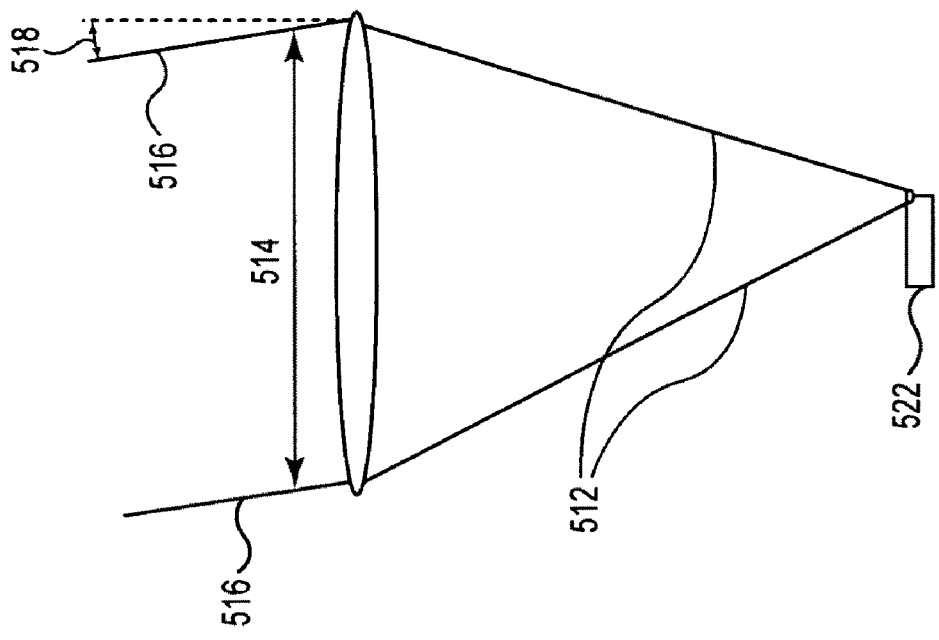
FIGS. 21A and 21B show schematic diagrams of a photovoltaic concentrator assembly not having a secondary optic.
Figure 21A:
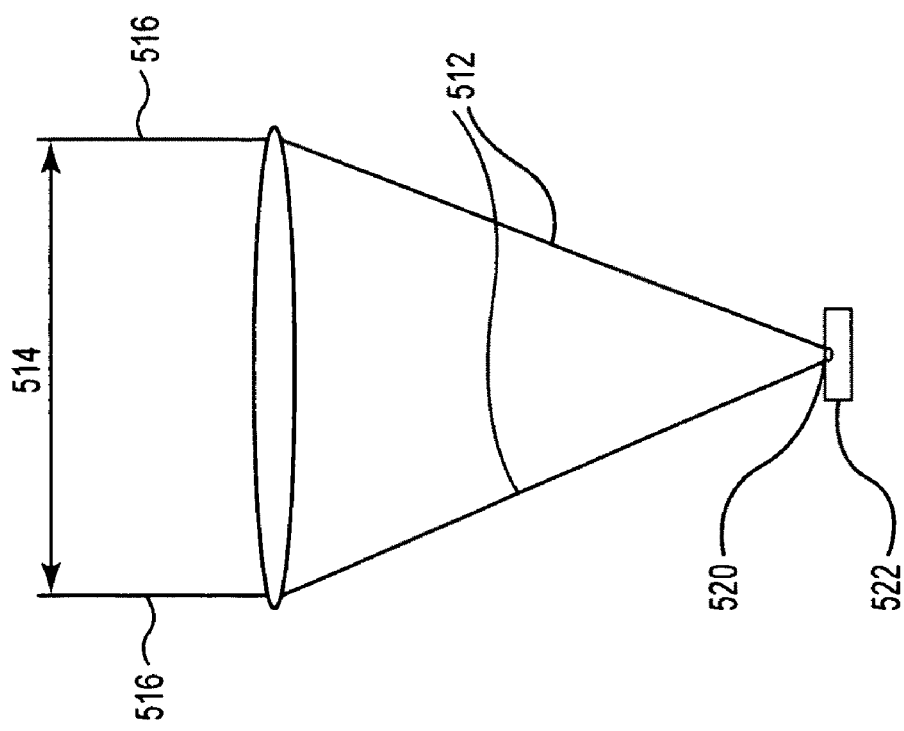

As shown in FIG. 20, an additional optional optical element 24, known as an optical secondary or secondary optic, can be positioned at the focal point 20 of an individual lens 12. Alternatively, solar cell 52 may be placed at the focus 20 of one or more lenses 12. Advantageously, secondary optic 24 can help increase the acceptance angle of the concentrator module 2. The increased acceptance angle that can be provided by the optical secondary 24 can be described by reference to FIGS. 21A and 21B, which illustrate the case with no optical secondary present. FIG. 21A is a diagram of a concentrating optical assembly, including a lens portion 514 focusing the sun's rays 516 onto a solar cell 522. If the sunlight is nominally intensely focused into an relatively small area 520 in the center of the solar cell 522, it is possible to achieve full power production even if the lens portion 514 is not pointed directly at the sun. FIG. 21B illustrates the situation if the incoming sunlight rays 516 are at an angle 518 relative to lens portion 514. If angle 518 exceeds a certain value, the focused rays 512 tend to fall off the edge of the solar cell 522, thereby reducing or eliminating the production of electricity.

In preferred embodiments, the optical secondary 24 can effectively magnify (albeit in a non-imaging fashion) the area in which solar cell 522 can capture incident light 16. Optical secondary 24 presents a larger area at the mouth 26 onto which the focus 20 may fall. Presenting a larger area at mouth 26 tends to have the effect of increasing the acceptance angle of the optical system as a whole.

Figures 22A, 22B:
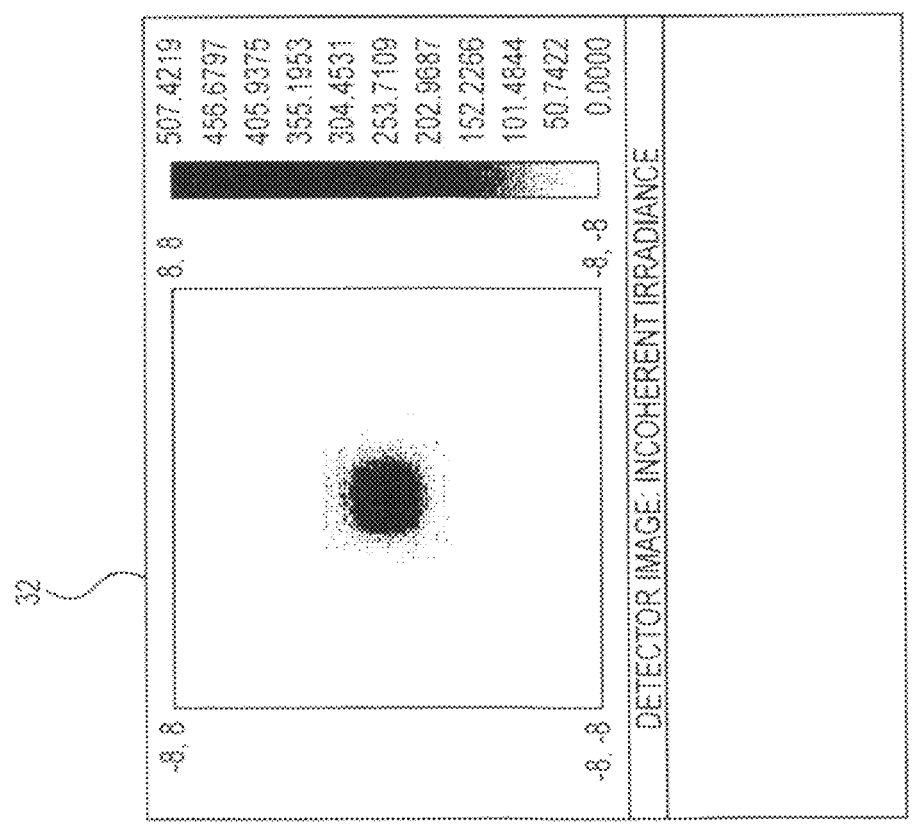
FIGS. 22A, 22B, 23A, and 23B shown illumination patterns associated with a secondary optic used in the system of FIG. 1.
Figure 23B:
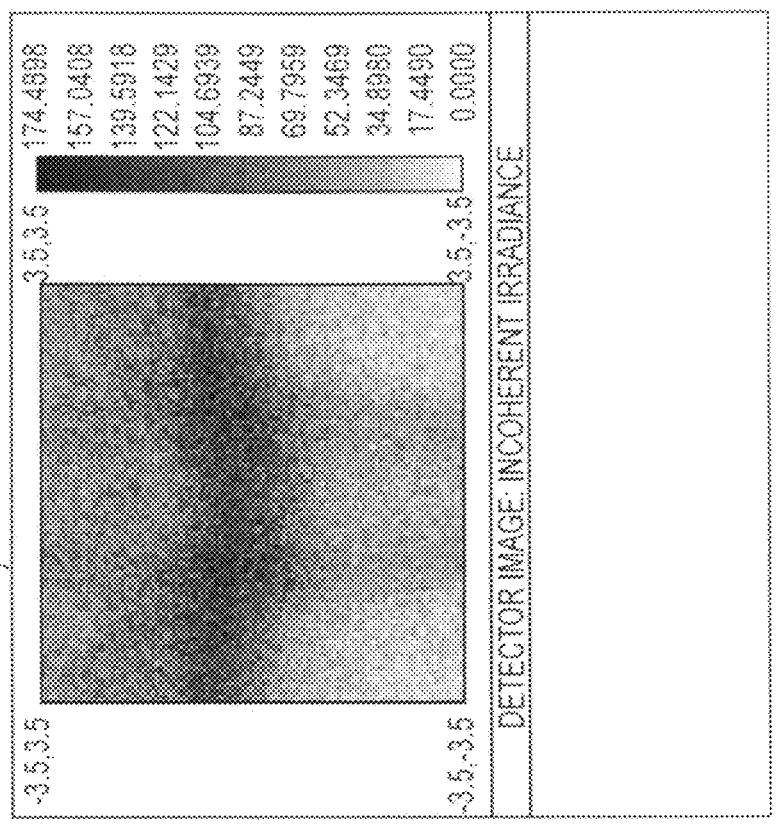
Figure 23A:
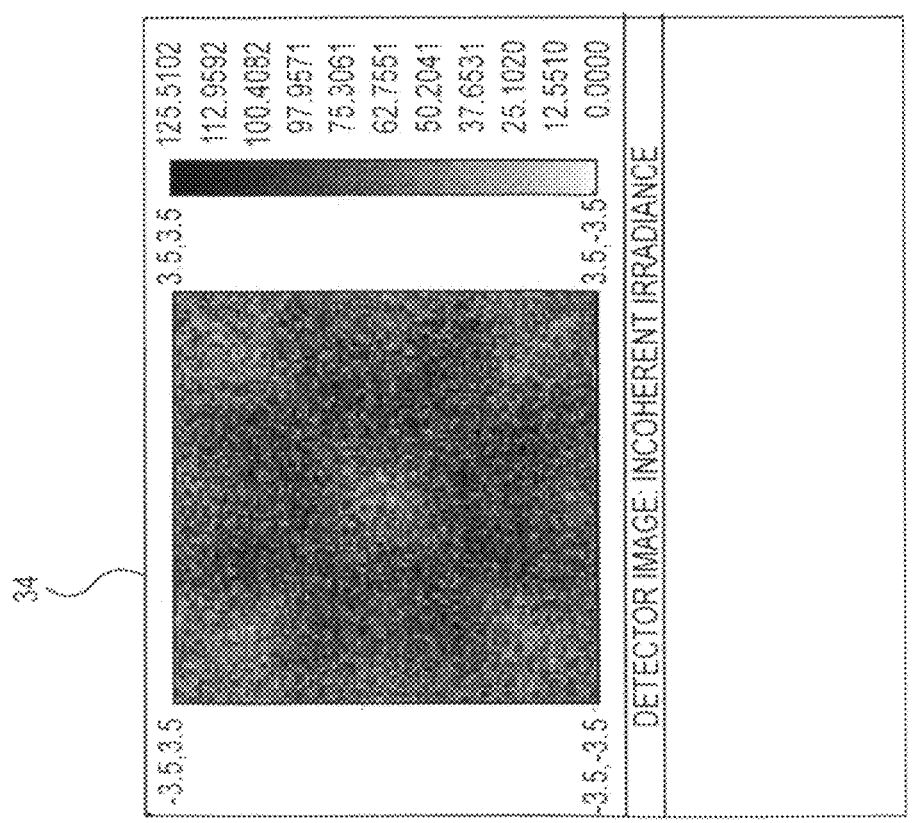

In preferred embodiments, the optical secondary 24 can optionally perform a function of illumination homogenization (also known as "beam stirring"). Illumination homogenization redistributes the hyper-concentrated light at the entrance aperture (or mouth) 26 of secondary optic 24 into a much more uniform illumination pattern at the exit aperture (or throat) 28 of secondary optic 24. Secondary optics that perform the beam stirring function will tend to be taller than secondary optics that do not perform the beam stirring function as well. FIGS. 22A, 22B, 23A, and 23B, help illustrate the effect of beam stirring. FIGS. 22A and 22B show the illumination pattern at the focus 20 of the lens 12, for the cases of FIGS. 21A and 21B, respectively. FIGS. 23A and 23B show the much-more-uniform illumination pattern at the throat 28 of secondary optic 24 for these same two cases. The improvement in illumination uniformity is thus apparent. A preferred beam stirring secondary optic 24 can nominally convert the illumination patterns 32 and 33 into the illumination patterns 34 and 36, respectively. Illumination pattern 32 is present at the mouth 26 when an individual lens 12 is pointed substantially directly at the sun. Illumination pattern 32 is converted by secondary optic 24 into pattern 34, which is present at the throat 28 of secondary optic 24. Illumination pattern 33 is present at the mouth 26 when an individual lens 12 is pointed at the sun at an angle of one degree. Illumination pattern 33 is converted by secondary optic 24 into pattern 36, which is present at the throat 28 of secondary optic 24. As can be seen by comparing pattern 34 to 36, the preferred secondary optic 24 can produce a fairly uniform illumination pattern 36 even if an individual lens 12 is not pointed directly at the sun.

Figure 24:
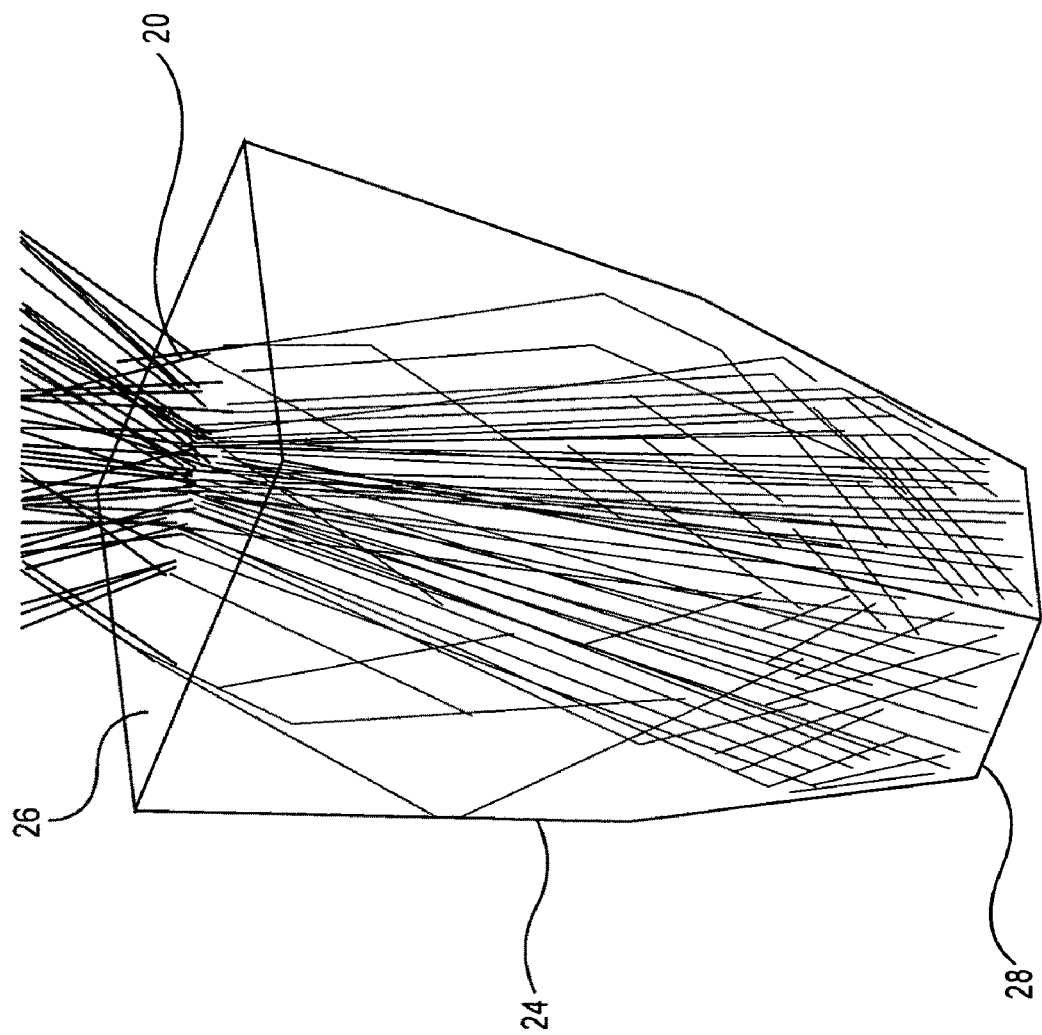
FIG. 24 illustrates the beam stirring action of a secondary optic used in the system of FIG. 1.

The beam stirring action of the optical secondary 24 is illustrated in detail in FIG. 24, which is a three-dimensional view of the input and output illumination patterns shown in FIGS. 22A and 23A. The ray bundle entering the mouth 26 of the secondary optic 24 is tightly focused, but secondary optic 24 causes numerous reflections which tend to "stir" the rays to produce a relatively uniform illumination at the throat 28.

Figure 25:
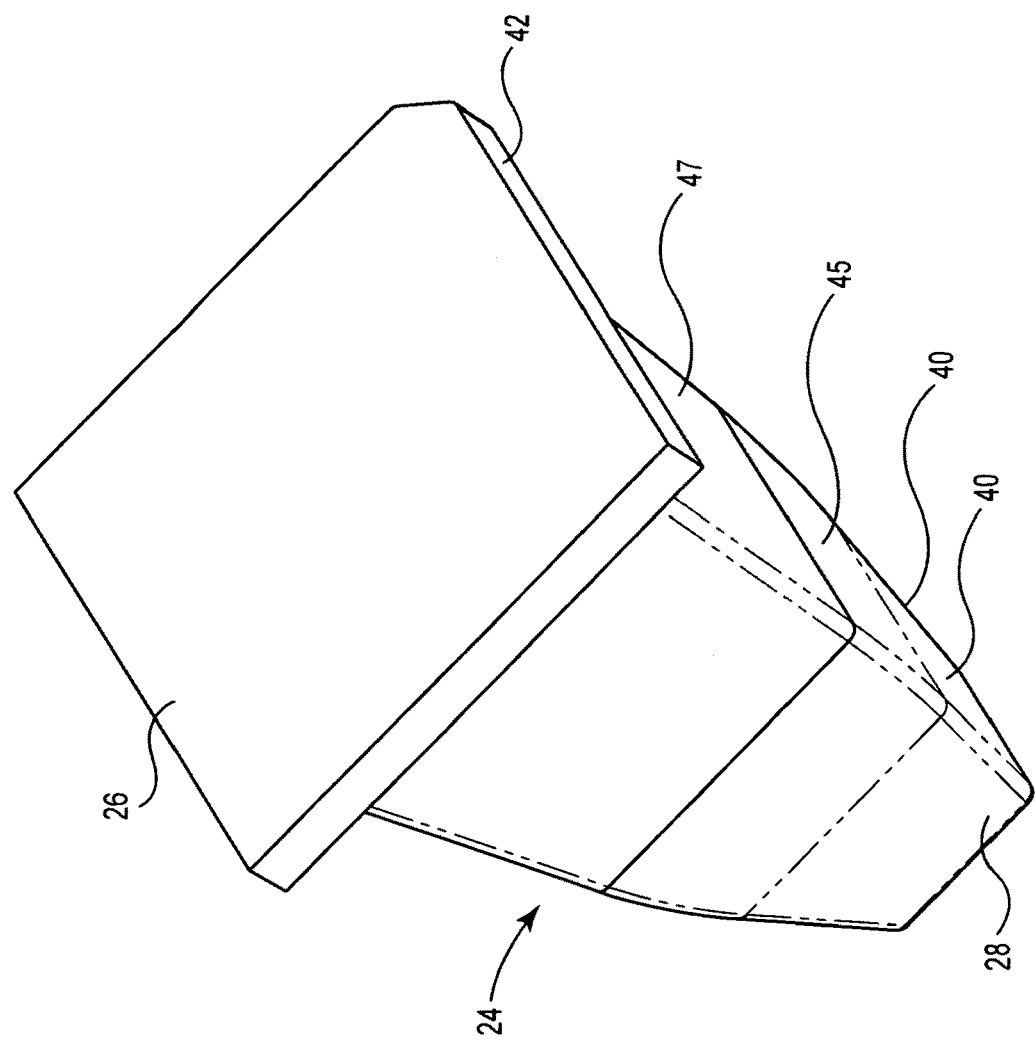
FIG. 25 shows a schematic of a preferred secondary optic used in the system of FIG. 1.

As shown in FIG. 25, optical secondary 24 preferably includes multiple distinct geometric zones 40, 45, and 47. Zone 47 tends to help capture and redirect the incoming light if the lens 12 is not pointed directly at the sun. Zone 40 tends to concentrate the incoming light towards the throat 28, and zone 45 is a physical transition region between zones 45 and 47.

As shown, optical secondary 24 optionally includes flange 42, which preferably does not contribute in the optical function of the secondary optic 24 but can aid in mechanically securing the secondary optic 24 in position on heat sink assembly 10 (discussed below). In alternative embodiments, flange 42 could be replaced with one or more tabs (not shown) that can similarly aid in mechanically securing the secondary optic 24 in position on heat sink assembly 10. In yet other alternative embodiments, secondary optic 24 could have no flange 42 or tabs (not shown).

Figure 26:
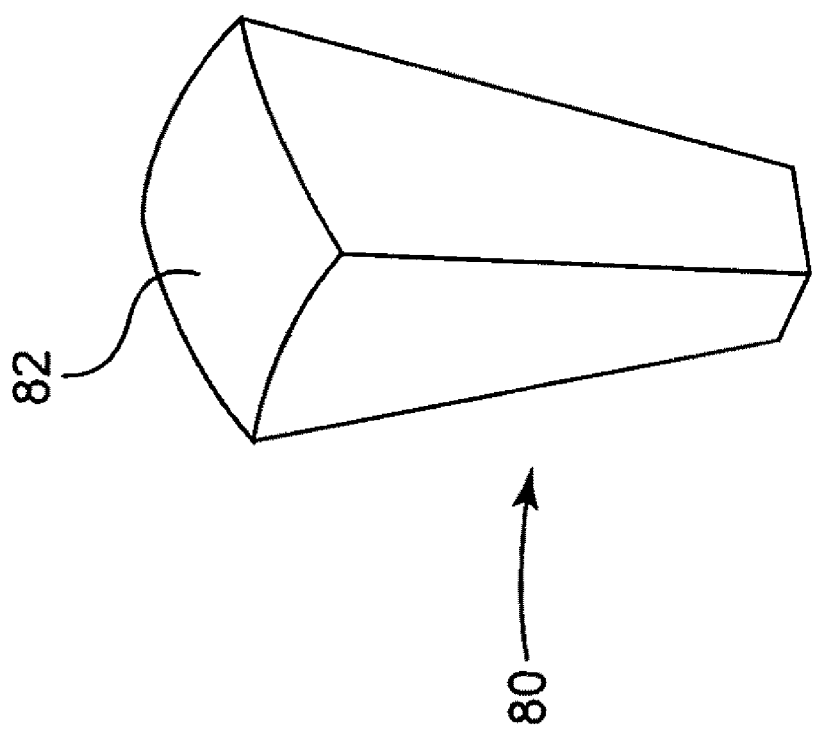
FIG. 26 shows a perspective view of an alternative secondary optic that can be used in the system of FIG. 1.

Alternatively, any secondary optic for use in solar concentrators could be used in concentrator 2. For example, an alternative secondary optic 80 is shown in FIG. 26. Secondary optic 80 includes a front surface 82 that may be curved, sloped, or otherwise shaped in order to improve the acceptance angle for off-axis rays. The front surface 82 of secondary optic 80 can function similar to the function of a field lens in the art of imaging optical systems, thereby tending to collimate off-axis rays and improving the field of view (i.e., the acceptance angle) of the secondary optic 80. By way of example, secondary optic 80 can be optimized to accept a ray cone that nominally comes into the secondary optic 80 from a slightly off-normal direction, and thus the input aperture 82 is generally sloped in addition to having the curvature associated with a field lens. Another alternative secondary optic includes a mirrored, open-air secondary optic that is used by Amonix, Inc., Torrance, Calif.

A secondary optic for use in concentrator 2 can have any number of sides (or even have a round or elliptical profile) and any shape that is suitable for use in a solar concentrator. Preferably, as shown in secondary optics 24 and 80, a secondary optic for use in concentrator 2 has four sides.

Secondary optic 24 can be made out of any material suitable for used in solar concentrator 2. In a preferred embodiment, secondary optic 24 can be made out solid glass, utilizing total internal reflection (TIR) to reflect rays towards the exit aperture 28 of secondary optic 24.

Secondary optic 24 can optionally include one or more coatings known for use on secondary optics. For example, secondary optic 24 could use a reflective coating on the sidewalls of secondary optic 24. As another example, secondary optic 24 could include an approximately transparent anti-reflective coating on the entrance aperture 26 of the secondary optic 24 to help improve coupling of focused sunlight into the secondary optic 24.

As shown in FIG. 15, housing ("can") 92 is positioned over and contacts secondary optic 24 in a structurally rigid manner. As shown, can 92 includes aperture 93, which is at least the size of entrance aperture 26 of the secondary optic 24 so that can 92 does not unduly block light incident upon aperture 26. Also, housing 92 can at least partially protect secondary optic 24 from the environment of inboard region 127. Preferably, as shown, an inner surface of can 92 contacts flange 42 in a structurally rigid manner. In preferred embodiments, secondary optic 24 (preferably flange 42) forms a seal with the top inner surface of can 92 in a structurally rigid manner. Optionally, secondary optic 24 (preferably flange 42) can be bonded to the top inner surface of can 92 (e.g., with a sealant) in a structurally rigid manner.

The base of can 92 can be affixed directly or indirectly to heat sink 62 in any manner suitable for use with heat sink assembly 10. In one preferred embodiment, as shown in FIG. 15, can 92 is affixed to heat sink 62 with rivets 68. Alternatively, can 92 could be substituted with one or more mechanical members that can contact secondary optic 24 in a structurally rigid manner and, optionally, at least partially protect secondary optic 24 from the environment of inboard region 127.

Figure 27:
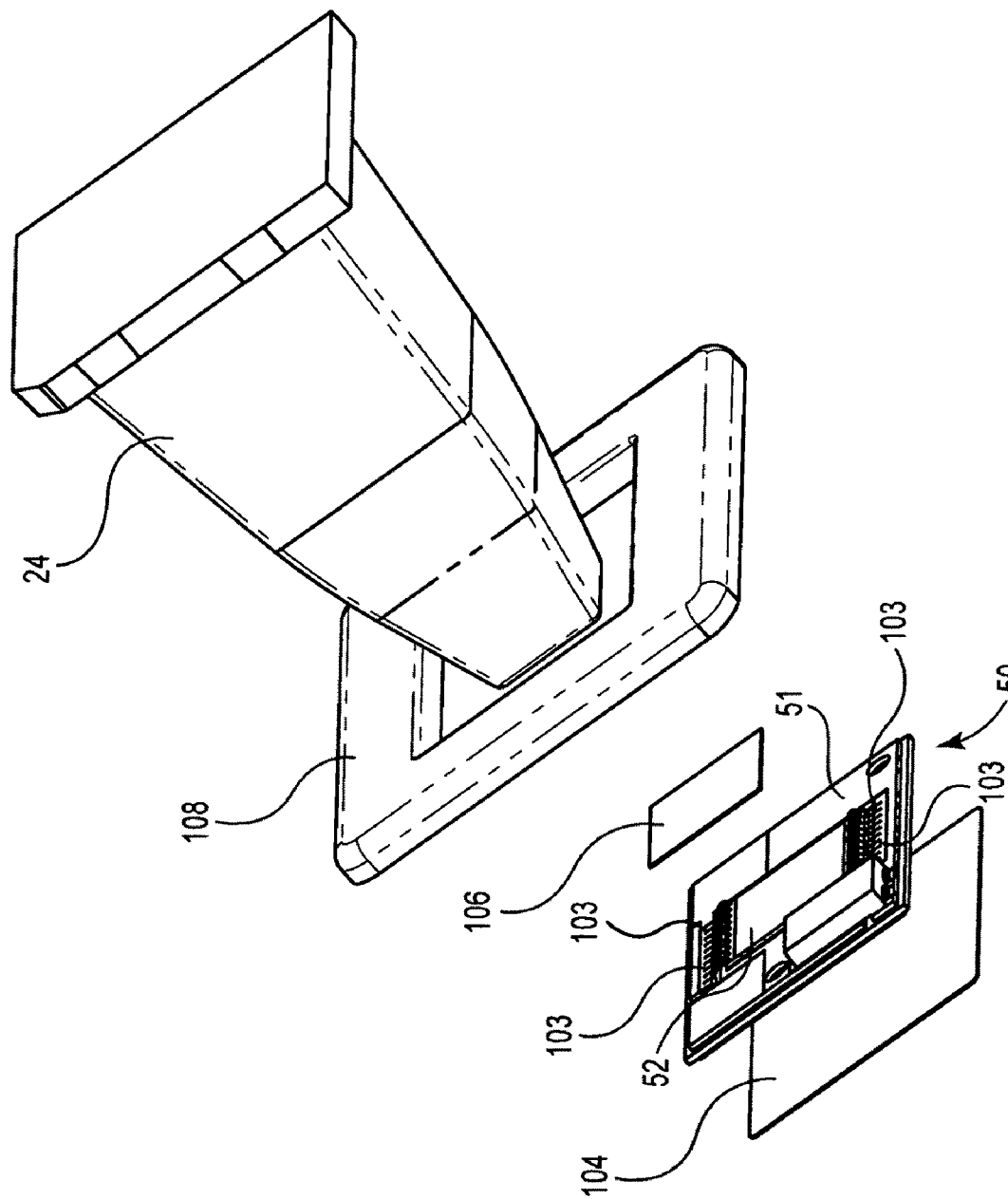
FIG. 27 is an exploded view of a portion of the solar cell assembly shown in FIG. 14.

Heat sink assembly 10 can be assembled in any convenient manner. FIG. 27 is an exploded view of a preferred material stack of the solar cell assembly 50 and secondary optic 24. The order of the explosion is suggestive of a preferred order of assembly. In a preferred approach, solar cell assembly 50 is first produced from circuit board 51, solar cell 52, and a bypass diode 54. Preferably, an encapsulant 102 can be applied over a portion of the circuit board 51 to protect and insulate the solar cell leads 103. A thin layer of optical adhesive or gel 106 is preferably applied to the top surface of solar cell 52 and secondary optic 24 is attached to solar cell 52 in a manner such that concentrated light exiting the concentrating optic is incident upon the photovoltaic cell. The circuit board 51-with-secondary-optic 24 is then preferably bonded with thermal adhesive 104 to heat sink 62. Finally, a conformal coating 108 is preferably applied to cover the entire solar cell assembly 50. Coating 108 can contact optical adhesive 106 but preferably leaves a small gap so that coating 108 does not contact secondary optic 24. The gap is preferably a few thousandths of an inch, but is exaggerated in FIG. 27 for clarity.

Optical adhesive or gel 106 preferably has an index of refraction that is as high or higher than the index of refraction of the material of the secondary optic 24, and as low or lower than the index of refraction of the material of which the solar cell 52 is constructed. However, it can be challenging to find an adhesive or gel 106 which meets the desired index of refraction criteria and can also withstand the high ultraviolet load, so a compromise can be made, which specifies an adhesive which survives the ultraviolet load but has a slightly lower index of refraction than would be otherwise me most preferred.

While preferred embodiments contemplate thermally curing liquid adhesives for all the adhesives used in the heat sink assembly 10, any sort of adhesive may be used.

Referring to FIG. 14, solar cell assembly 50 and heat sink 62 can be assembled together in a manner such that solar cell 52 receives incident light passing through the aperture of the concentrator module 2, preferably with a thermal adhesive.

The present invention teaches a number of novel approaches for producing a reliable heat sink assembly, in high volume. Techniques such as fiducial marks and oversized holes to allow for accurate robotic alignment have already been described. Another area in which novel techniques are desirable is in the assembly of the optical secondary 24 to the solar cell 52, and of the resulting assembly 50 to the heat sink 62. Adhesives with the desired properties mentioned earlier (for the optical adhesive, qualities like transparency and tolerance to intense ultraviolet radiation, and for the thermal adhesive, qualities like dielectric standoff and high thermal conductivity) are available, but the best adhesives may not be readily available in fast-curing formulations. Many desirable adhesives are thermally cured at elevated temperature for extended periods of time, for example an hour or more.

Due to the desire to assemble these components with a desired level of precision, it is desirable to provide fixtures to hold the components in the proper alignment while the adhesive cures. However, such fixtures may be expensive, so if it is desired to produce, for example, hundreds or thousands of heat sink assemblies 10 per hour, hundreds or thousands of expensive precision fixtures may be required.

The present invention teaches that the technique of tack curing, novel to the field of solar concentrators, may be used to achieve the required high-precision assemblies while requiring fewer fixtures. Tack curing is a technique whereby an adhesive is at least partially cured to achieve a low-strength but useful bond, allowing further operations that may rely on the bond prior to final curing, as long as the further operations do not place undue stress on the adhesive. A preferred method of heat sink assembly manufacture then proceeds as follows: 1) Place one or-more solar cell assemblies into appropriately shaped receptacles in a rotary table; 2) Dispense optical adhesive onto the solar cells 52; 3) Using optional machine vision for guidance, optionally use a robot to precisely place secondary optics 24 onto solar cells 52, using the fiducial marks as positional references for the machine vision system. The robot attaches a clamp or other fixture to the precision-placed assemblies to hold them in place; 4) Bring a (preferably pre-heated) heating plate up from below the rotary table to contact the prospective solar cell assemblies with secondary optics; 5) Apply beat in excess of, say, 150 C. for a short interval, say, 15 seconds, in order to initially cure the optical adhesive to a point where it is still far from full strength, but has achieved enough rigidity that it can withstand the benign vibrational disturbances present in the manufacturing line; 6) For each solar-cell-with-secondary assembly, dispense thermal epoxy onto a heat sink; 7) Use a robot to place each solar-cell-with-secondary assembly onto a heat sink, causing the robot to press the assembly onto the heat sink with a desired force, preferably fixturing the assembly to the heat sink, freeing the robot for further operations; 8) Apply heat in excess of, say, 150 C. for a short interval, say, 50 seconds. Since the heat sink might tend to wick away any heat applied solely to the adhesive joints, some sort of oven is instead preferably used to heat the entire prospective heat sink assembly at once. This heat will thus tack-cure both the thermal adhesive and the optical adhesive to the point where they can tolerate normal handling during assembly; 9) Remove the fixtures (and return them to a position that will allow re-use) and place the heat sink assembly onto a slow conveyer that will take it into curing oven at a temperature in excess of, say, 150 C., for a duration of, say, 90 minutes, to achieve a full-strength cure of all adhesives; and 10) Allow the completed heat sink assembly to cool, and remove it from the conveyer.

Referring again to FIGS. 4 and 5, as shown, aperture 4 is preferably rectangular shaped. An exemplary dimension of aperture 4 is approximately 29 inches by 15 inches. Alternatively, aperture 4 can be any size and shape suitable for a solar concentrator.

As shown, lens 6 is preferably a "parquet" of individual lenses 12 as optical elements to concentrate sunlight. Considering FIGS. 4, 5, and 20 together, each individual lens 12 concentrates incoming rays 16 of sunlight from aperture 14 of aperture 4 to a high intensity focus 20. Advantageously, focus 20 of light can be used to create electricity from solar cell 52.

As shown, lens 6 preferably includes a single unitary sheet of lenses 12. Alternatively, lens 6 could be made up separate, sub-sheets of lenses 12.

Lens 6 can be made out of any optical material suitable for a lens in a solar concentrator. Exemplary materials include plastic materials such as acrylic.

As shown in FIGS. 4 and 5, lens 6 preferably includes a 4 by 2 parquet of approximately square lenses 12. As shown, lenses 12 are preferably square because a square lens 12 can help make concentrator 2 shorter since the minimum practical height of a concentrator is typically driven by the largest dimension of the lens. Alternative embodiments may use other lens shapes (non-square) and different numbers of lenses in the parquet. The present invention also teaches that other types of parquets, such as parquets of hexagonal lenses may approximate a preferred aperture profile, which includes circle segments 440 (discussed below with respect to FIG. 57). Alternative embodiments therefore include parquets of hexagonal or other-shaped lenses, or parquets of heterogeneous lenses, to help approximate a preferred "capped-rectangle" shape.

The invention appreciates that the amount of energy the solar panel 1 will produce tends to be directly related to the efficiency of the lenses. The efficiency of lenses 12 can be described as the ratio of the amount of light that lens 12 properly focuses to focal point to the amount of light 16 entering the aperture 14. The invention also appreciates that in certain embodiments Fresnel lenses are preferred since Fresnel lenses tend to weigh and cost relatively much less than at least some other lenses. Note that since the preferred lens 12 is square, there are at least two ways to think about the focal length to diameter ratio of the lens 12. With respect to width (w) of lens 12, f/w ratios of less than 1.25 can lead to unacceptable losses of light. With respect to the diagonal (d) (which is 1.41 times the width for a square lens 12), f/d ratios of less than about 0.9 can lead to unacceptable losses of light.

When other desired components of the preferred embodiment are added, including secondary optic 24 and heat sink 62, the present invention appreciates that it may be challenging to produce a suitably efficient concentrator 2 whose height is much less than 2 times its width.

Advantageously, a 4 by 2 array constructed of efficient Fresnel lenses can yield a concentrator 2 whose width is approximately one times the height of concentrator 2, permitting concentrators 2 to be packed relatively tightly in solar panel 1 for a relatively high efficiency. For this reason, parquets that have at least two lenses in the shortest dimension of the parquet (e.g., the north-south direction in FIG. 2) are preferred, so as to give a width-to-height ratio of at least 1:1. Alternatively, a parquet lens 6 can be any array of lenses 12. For example, parquet lens 6 could be a 4 by 1 array of lenses 12.

Figure 57:
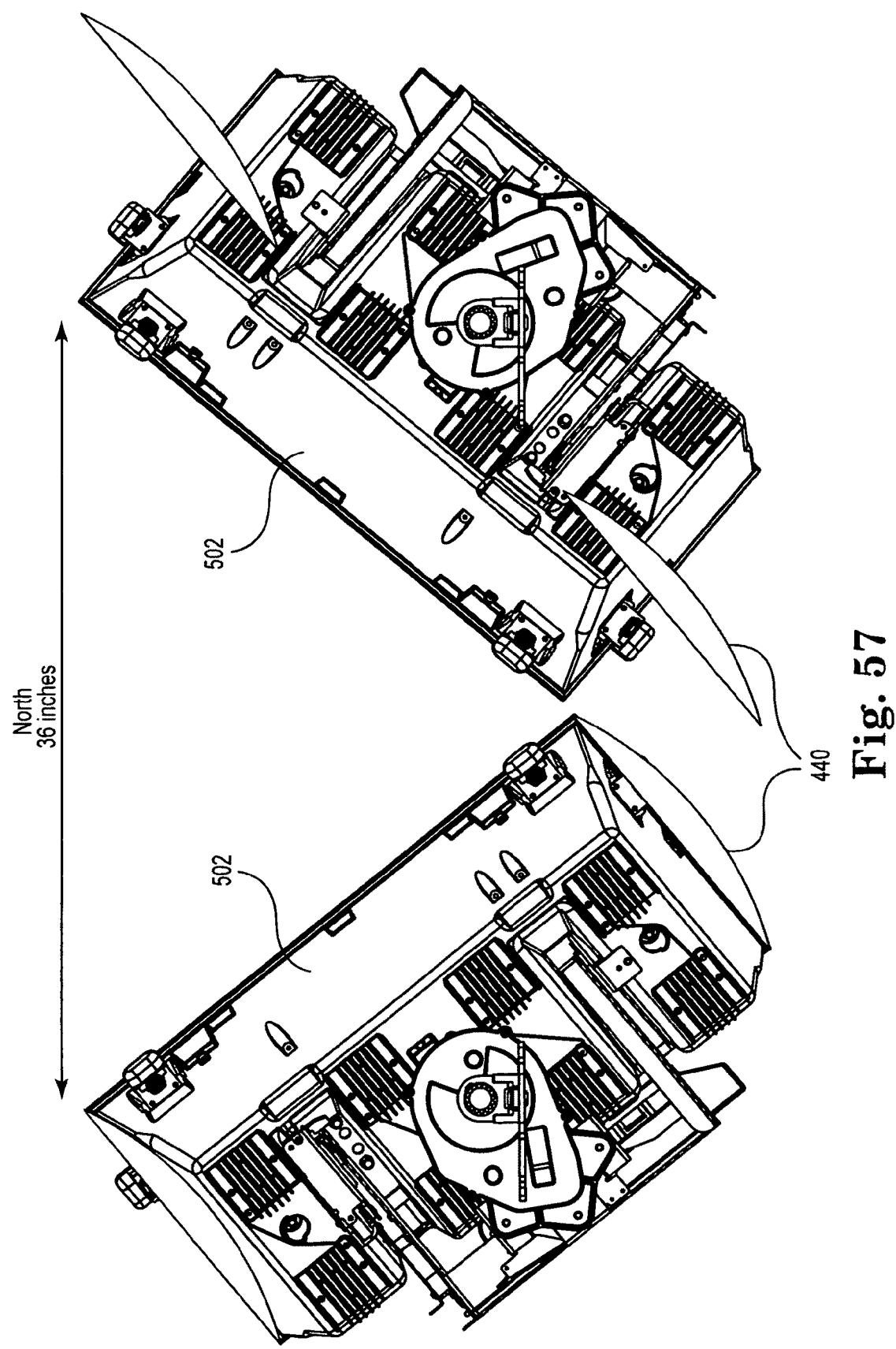
FIG. 57 shows an arrangement similar to that shown in FIG. 55, but with alternative concentrator modules.

In alternative embodiments, as shown in FIG. 57, the input aperture of the concentrating module 502 can be expanded by adding circle segments 440 thereby increasing the collecting area (and thus the efficiency) of the solar panel without any increase in spacing required.

Figure 58:
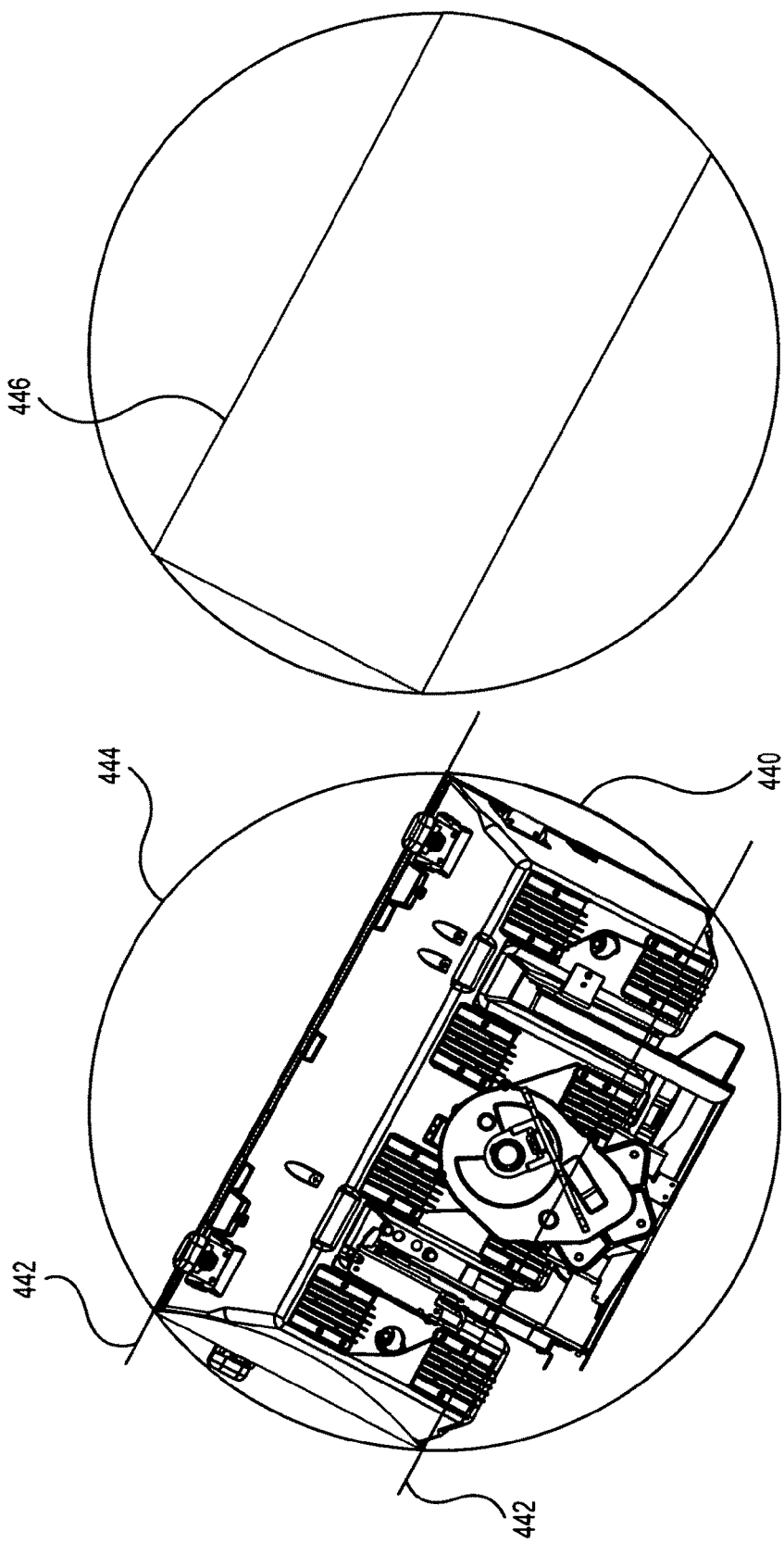
FIG. 58 shows another view of a concentrator module of FIG. 57.

Referring to FIG. 57, the present invention further teaches that rectangular apertures and lens parquets 6, that are wider in the east-west direction than in the north-south direction, tend to minimize the amount of space (and thus lost light and lost efficiency) that is wasted when circle segments 440 are not included in the aperture 4. Preferred embodiments thus tend towards asymmetric apertures. A preferred shape for the aperture is a "capped rectangle", as illustrated by region 446 in FIG. 58. This capped rectangle is constructed by first constructing circle 444, which is the perimeter swept out by the corners of a rectangular module the module articulates in tilt motion. Lines 442 are then constructed by extending the long sides of the preferred module past the edge of the circle. The resulting interior area 446 is the preferred shape. Note that the preferred modules 2 instead use a rectangular aperture to help ease manufacturing.

Nonetheless, by choosing a rectangular aperture with an aspect ratio (north-south width to east-west width) of greater than 1.5 to 1 can help minimize the amount of lost area 440 with respect to the theoretically ideal aperture 446. Thus, the manufacturing simplicity of a rectangular aperture will tend to be preferred over the more complex theoretically ideal aperture 446, when aspect ratios of greater than 1.5 to 1 are used. In preferred embodiments, a lens has an "m" by "n" array of individual lenses, m>1, n>1, and m≠n. Preferably n equals 1.5 or greater, or even 2 or greater. As shown in FIG. 4, lens 6 has an array of individual lenses 12 where n=2 and m=4. As shown, the "n" dimension occurs along an axis that is substantially parallel to tipping axis 17.

Alternative embodiments consider very large aspect ratios, such as 3 to 1 or 4 to 1, with lens parquets comprising 6 by 2 or 8 by 2 lenses. However, as the width of the buckets in the east-west direction grows, it becomes necessary to mount the product higher off the roof, so that the buckets have room to swing freely in tip motion without hitting the roof. That is to say, referring to FIG. 3, as the aspect ratio grows, support posts 356 become taller and taller, leading to a loss of structural stiffness.

Wider modules also modify the overall aspect ratio of the solar panel as a whole. The preferred embodiment selects a 4 by 2 lens parquet as a near-optimal balance between packing density, structural stiffness, and the desire to articulate about the center of gravity.

As shown, each lens 12 is preferably a Fresnel lens. Alternatively, one or more different types of focusing elements can be used for a lens 12. For example, lens 12 can be a standard lens, a reflective lens, a total internal reflection-refraction (TIR-R) lens, combinations of these, and the like. Similarly, the lens need not be planar. The lens may be dome-shaped or otherwise three-dimensional.

Each lens 12 can be any size suitable for concentrator. An exemplary size of lens 12 is 7 inches by 7 inches. Lens 6 can optionally include a border around the lenses 12, e.g., a ½-inch border.

Sun position sensor 212 is illustrated in FIGS. 28-34. The preferred sensor 212 includes distinct narrow-angle and wide-angle sensors, each including a plurality of photodiodes which sense incident sunlight. The basic approach can be consistent with the approach in Ser. No. 11/974,407 (Johnson Jr., et al.) having filing date of Oct. 12, 2007, the entirety of which is incorporated herein by reference. The sensor 212 preferably includes a set of wide-angle sensing diodes 222 and a pair of narrow-angle sensing diodes 224 located behind precision slits 226 and masks 228. Slits 226 and masks 228 are preferably molded into sensor body 230. The preferred sun position sensors 212 are single-axis sensors, designed to be principally sensitive to sun position in a preferred axis and agnostic to sun position in the other axis.

Figure 28:
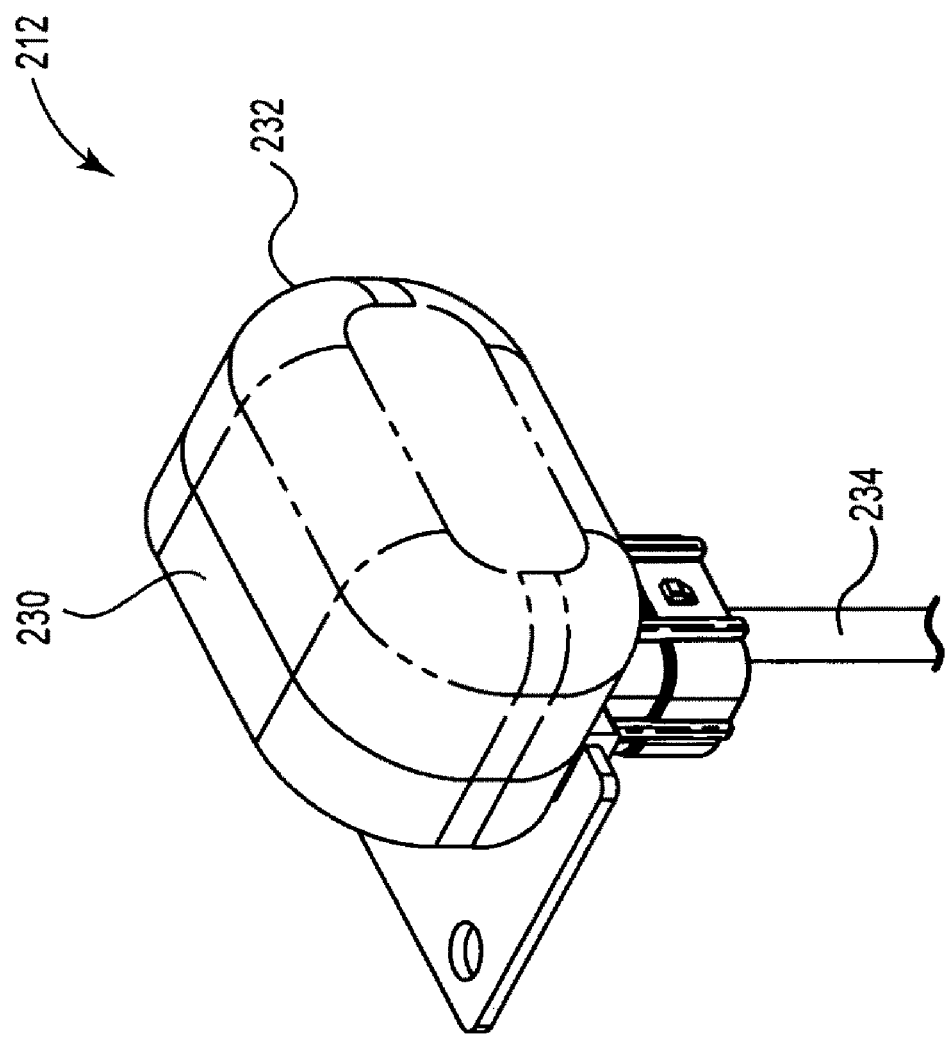
FIG. 28 shows a close up perspective view-of the sun position sensor shown in FIG. 1.

Referring to FIG. 28, sensor 212 includes a preferably injection molded main body 230, a clear cover 232, and an output cable 234. The volume within the clear cover may be filled with a clear material such as silicone, so as to eliminate the possibility of condensation or contamination-inside the sensor.

Figure 29:
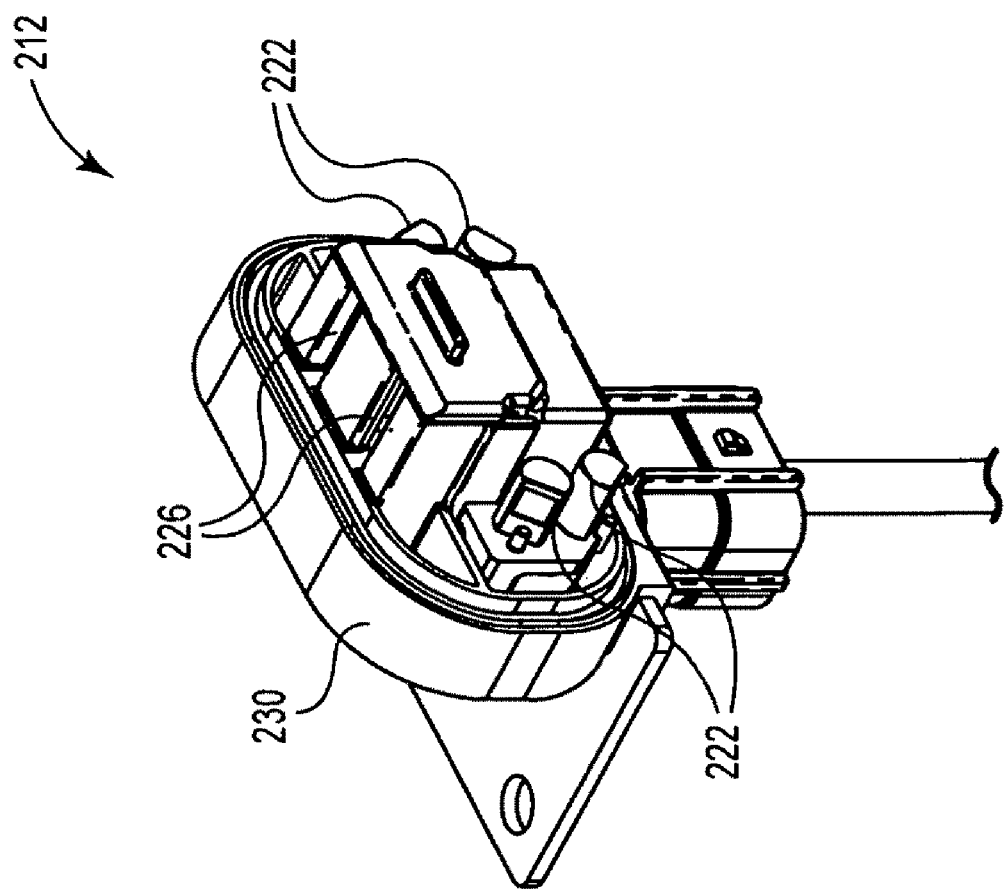
FIG. 29 shows the sensor shown if FIG. 28 with the clear cover removed.

FIG. 29 shows the sensor 212 with the clear cover removed, and more clearly reveals wide-angle sensing photodiodes 222 and precision slits 226.

Figure 30:
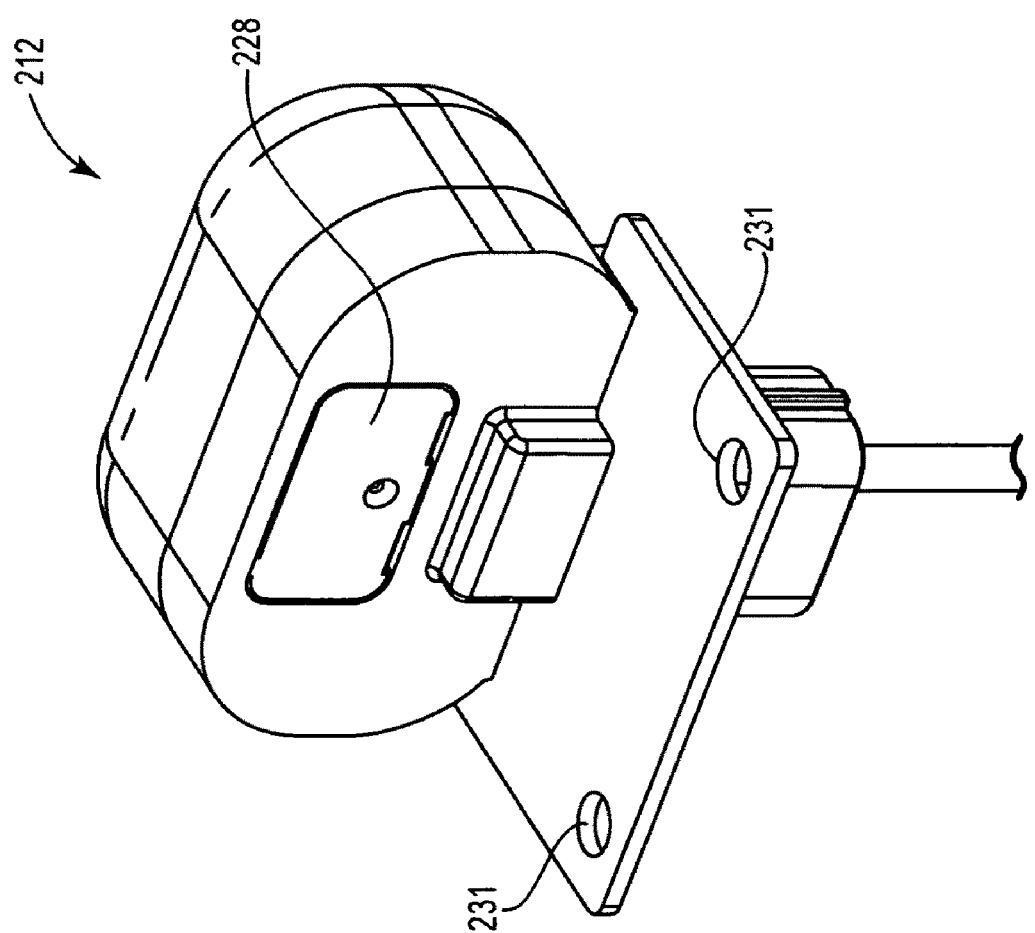
FIG. 30 shows the back side of the sensor shown in FIG. 28.

FIG. 30 shows the back side of the sensor 212, including back cover 228 and mounting features 231, which mate with mounting holes 220 in features 210 on the bucket 8.

Figure 31:
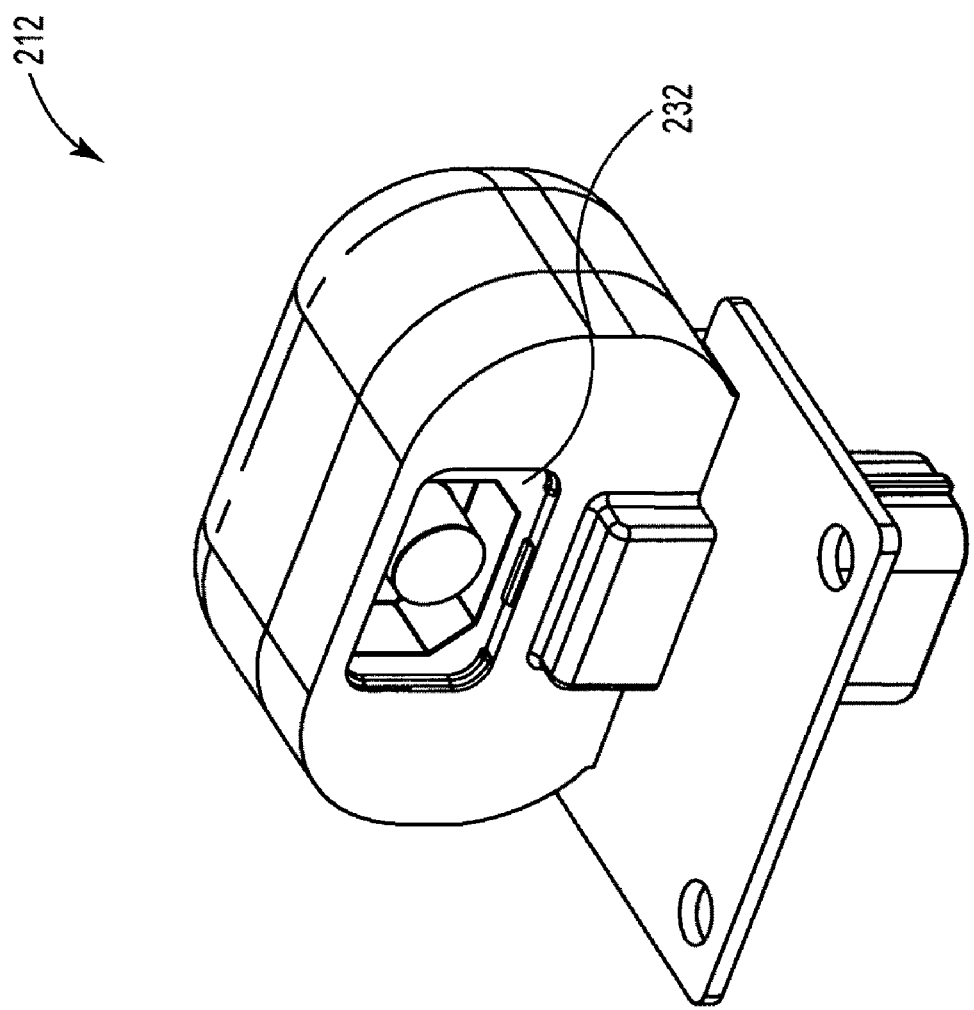
FIG. 31 shows the sensor shown in FIG. 30 with the back cover removed.

FIG. 31 shows the sensor 212 with the back cover 228 removed, and reveals circuit board 232 and diode holder 234.

Figure 32:
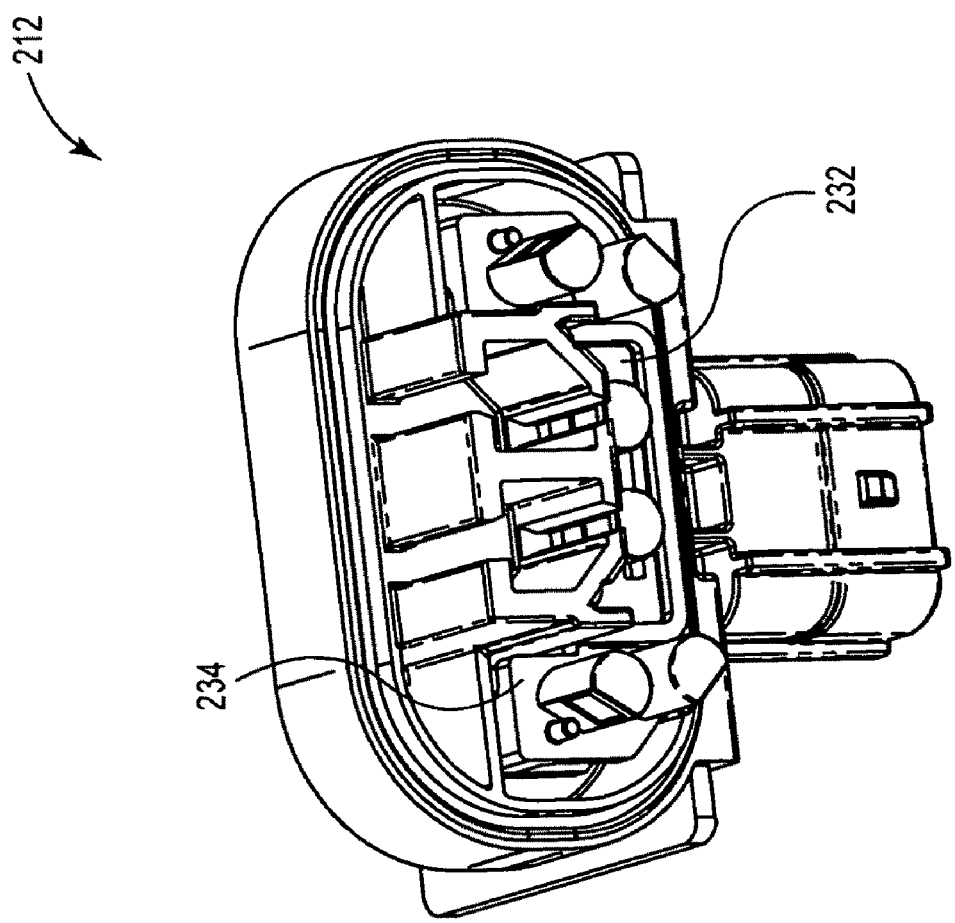
FIG. 32 shows the internal portion of the sensor shown in FIG. 28.
Figure 33:
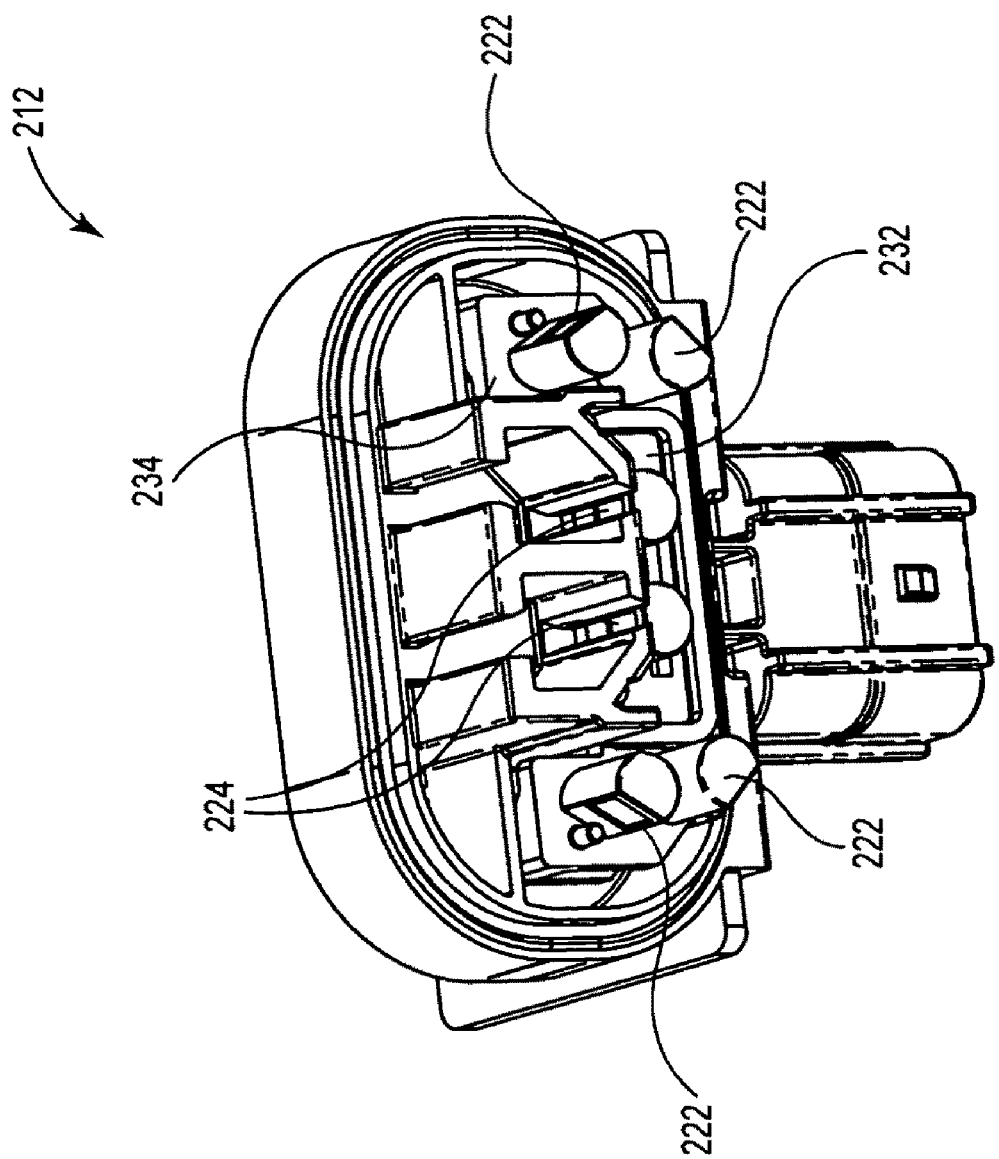
FIG. 33 shows a close-up view of a portion of the sensor shown in FIG. 31.

FIG. 32 is a front view of sun position sensor 212, and shows circuit board 232 largely covered by diode holder 234. The diode holder 234 is a preferably injection-molded part that provides for the diodes to be soldered to the circuit board at a preferred height above the board, and in preferred accurate orientations, as shown in further detail in FIG. 33.

Figure 34:
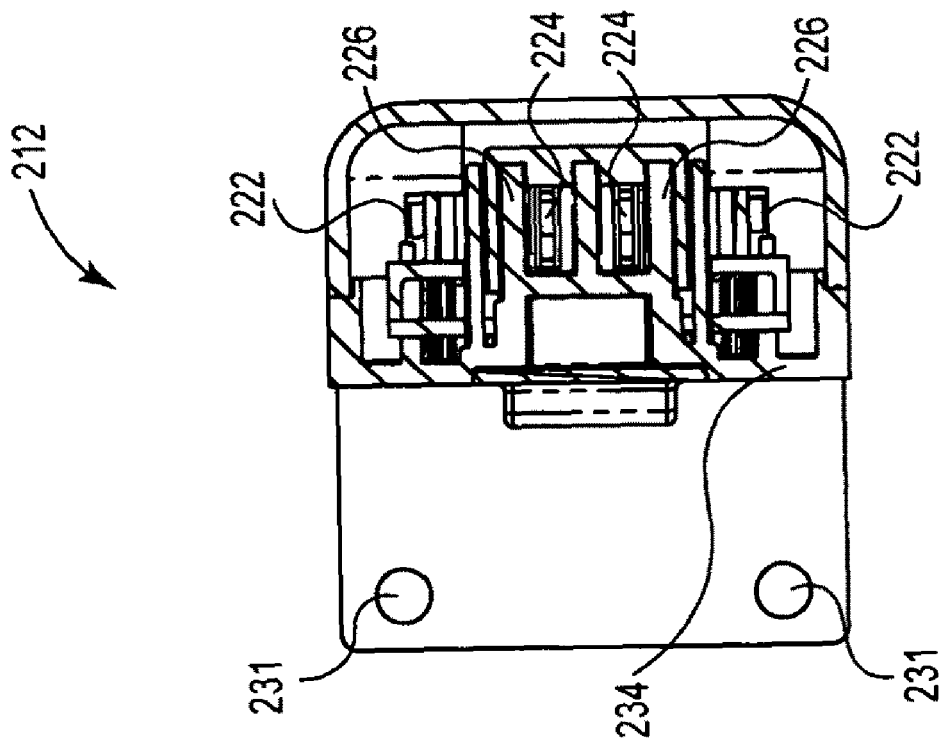
FIG. 34 shows a sectional view of a portion of the sensor shown in FIG. 28.

FIG. 34 shows a section view of the narrow-angle photodiodes 224 and the slits 226 which are molded into the main body 230. The view is from the top of the sensor 212, at a plane below the slits 226. As the sun passes over the sensor 212, slits 226 can cast shadows on the narrow-angle diodes 224. Mask 228 provides a precision aperture onto which the shadows of slits 226 are cast, thus creating a very precise sensor even if the photodiode itself is mechanically imperfect.

The sensors 212 are preferably designed to be sensitive to sun position in only one axis, so at least two preferred sensors 212 are desired to fully determine the position of the sun. Furthermore, inasmuch as it is possible for adjacent concentrator modules 2 or nearby concentrating solar panels 1 to cast shadows, it is desirable that there be redundant sensors 212 for each of the two axes (the tilt and tip axes), so that even when one sensor 212 is shaded, the other sensor 212 can preferably still see the sun. In the preferred embodiment, redundant sensors 212 are placed on opposite sides (in the east-west sense) of bucket 8 to help provide tolerance to shadows.

These sensors 212 include both narrow- and wide-angle sensing elements. Substantially similar tracking sensors are detailed in co-pending application having Ser. No. 11/974,407 (Johnson Jr., et al.) and filing date of Oct. 12, 2007.

Figure 54:
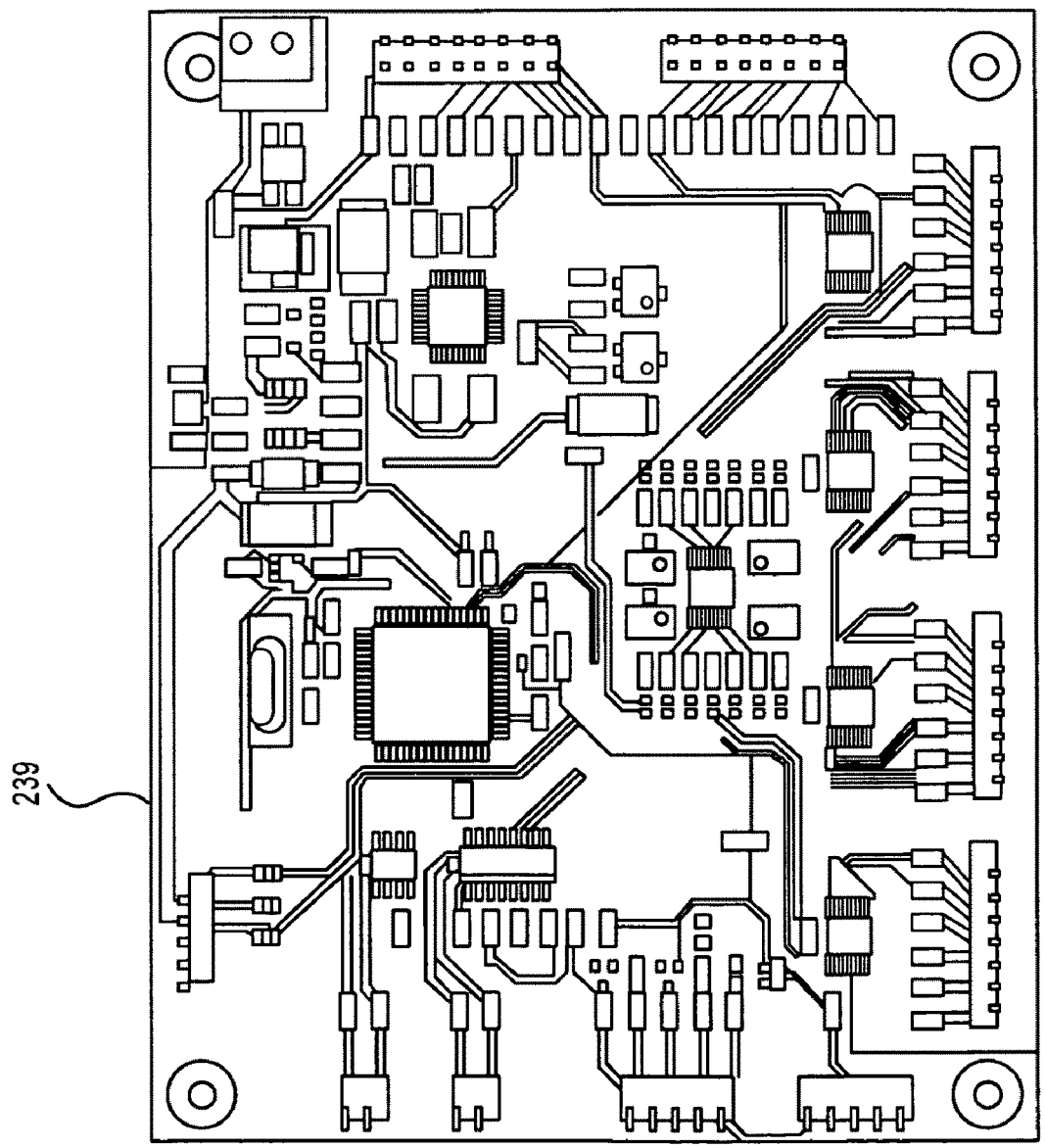
FIG. 54 is a photograph of control electronics used in connection with the sensor shown in FIG. 28.

The signal cables 234 are fed to control electronics 239 shown in FIG. 54 (discussed below), where software can interpret the data from the sensors 212 to infer the position of the sun and command the motors to move appropriately so that the solar panel 1 points at the sun.

The concentrating solar panel 1 includes a plurality of solar concentrator modules 2, coupled to articulating mechanism 3. The preferred articulating mechanism 3 shown in FIG. 40 includes frame 304, linkage 308, drive assembly 310, and pivot assembly 312.

Figure 39:
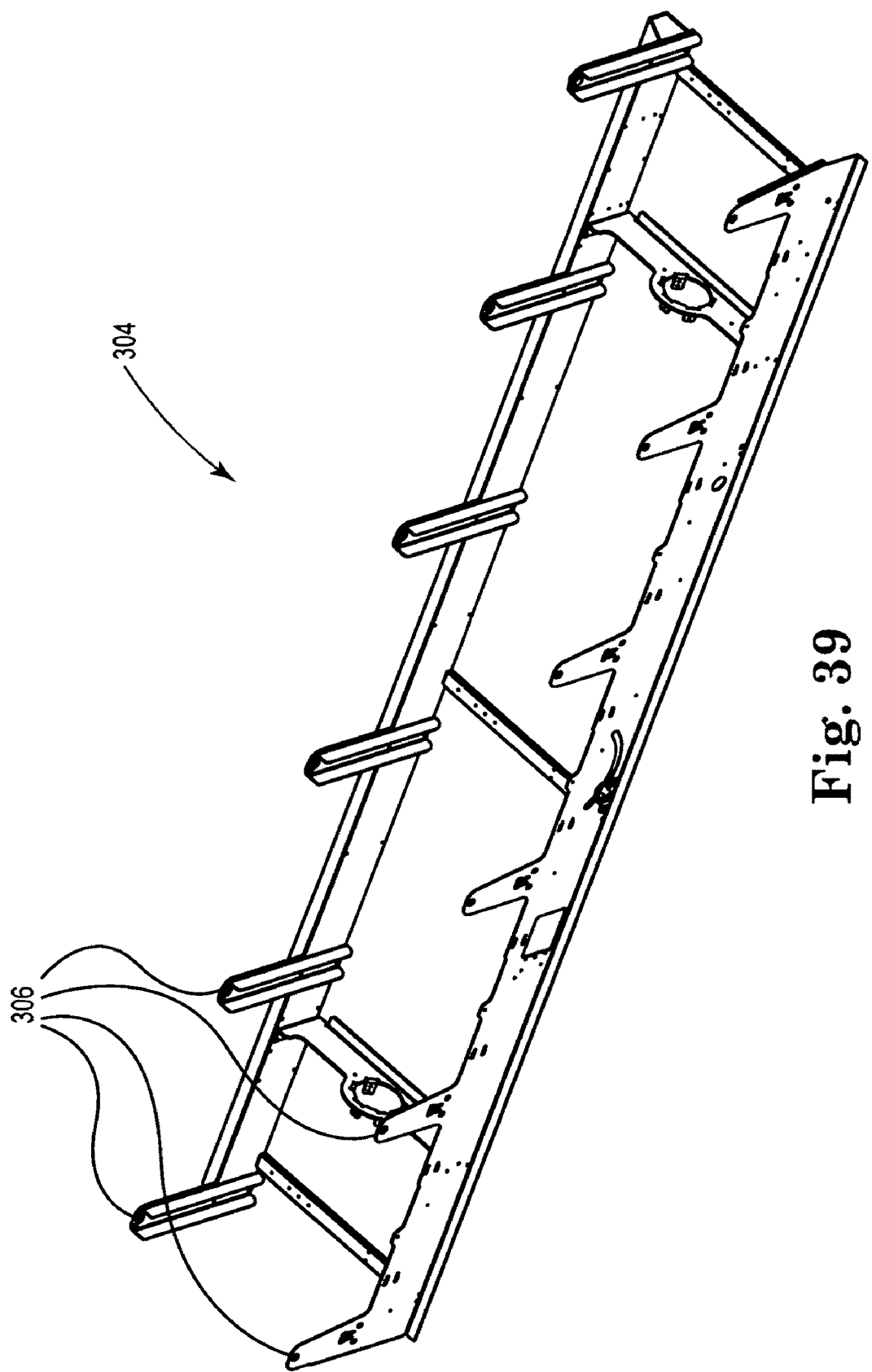
FIG. 39 shows a portion of the chassis frame shown in FIG. 37, with the concentrator modules removed.
Figure 40:
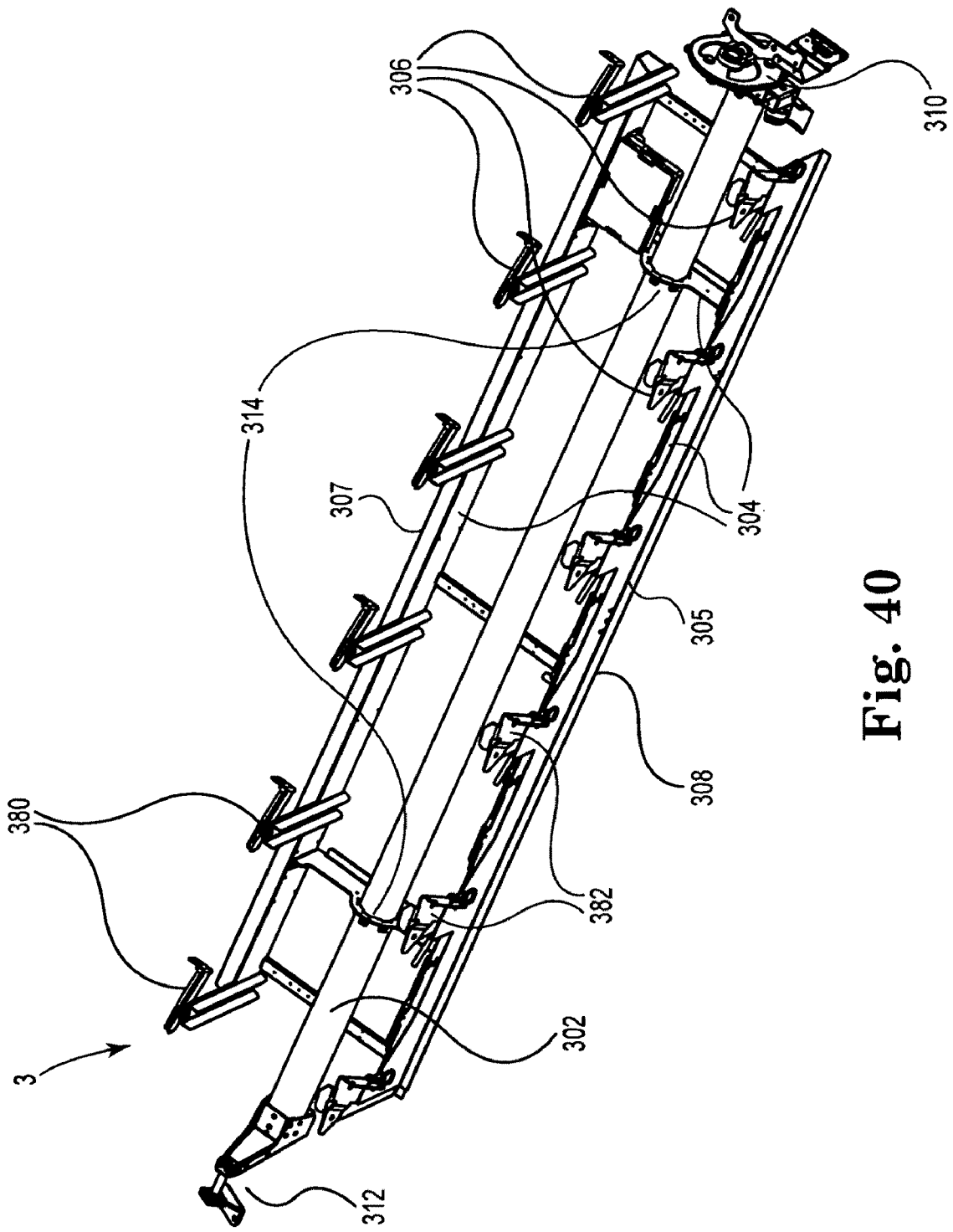
FIG. 40 shows the articulation mechanism shown in FIG. 37, with the concentrator modules removed.

FIGS. 35-38 show the frame 304 of articulating mechanism 3 in the context of the entire solar panel 1, while FIG. 39 shows the frame 304 in isolation. It is noted that in preferred embodiments, the articulating mechanism 3 (articulating in tip and tilt) is positioned underneath/beneath/below or proximal to and/or within the system 1 footprint shown in FIG. 7. As shown in FIG. 39, the concentrator modules 2 are preferably physically coupled to the frame 304 at pivot points 306 in an articulating manner, which connect to the buckets 8 inside cavities 134 and 136. Frame 304 includes two chassis members 305 and 307 that are rigidly, physically coupled to axle (third chassis member) 302. Each chassis member 305, 307, and 302 is substantially parallel to the other chassis members and each chassis member 305, 307, and 302 extends along the length "L" (see FIG. 1) of the panel 1 footprint. As shown in FIG. 40, frame 304 is preferably mounted on axle 302, which preferably pivots the frame 304 (including modules 2) about the tilt axis 15 (e.g., north-south axis as shown in FIG. 2) to move frame 304 in an arc or curve, similar to the motion of a pendulum. In preferred embodiments, frame 304 and/or axle 302 provide sufficient structural support for modules 2 within panel 1 in addition to articulating modules 2. Preferably, the frame 304 and/or axle 302 can support the weight of the modules 2 and any additional mechanical loads (including but not limited to snow, for example) without failing, but axle 302 may undergo flexing without impacting performance.

As shown, frame 304 is separate from axle 302. In preferred embodiments, frame 304 attaches to axle 302 at a pair of points 314. These points 314 are preferably positioned at locations partway along the length of the frame 304, for example, approximately 25% and 75% of the way along the frame 304. Attaching frame 304 to axle 302 at preferred points 314 can reduce deflection of frame 304 and/or allow reduction of the mass of the frame 304 while retaining structural rigidity. The tilt axle 302 preferably mates to the tilt axis 15 pivot elements 310 and 312. Because the frame 304 attaches to the axle 302 at, as illustrated, only two points 314, any bending of the axle 302 due to gravity tends to not be transmitted to frame 304. Isolating any sagging of axle 302 from frame 304 in this manner can advantageously permit the mass of axle 302 to be reduced without sacrificing performance. Note that connection points 314 preferably also function as a flexure or bearing in order to help prevent transmission of bending moments between the axle 302 and the frame 304. One preferred material for axle 302 includes aluminum (e.g., extruded aluminum tube).

Alternatively, frame 304 can mate directly with the tilt axis pivots 310 and 312. In such alternative embodiments, frame 304 can flex due to the weight of the concentrator modules 2, and typically the degree of flexing can vary as the tilt axis 15 rotates. Such variation in flexing can lead to the modules 2 pointing in slightly different directions from each other about the tip axis 17 as modules 2 articulate about the tilt axis 15. If the modules 2 are not pointed in substantially the same direction, the acceptance angle of the concentrating solar panel 1 as a whole tends to be reduced. Thus it can be desirable to minimize such differential pointing error.

The present invention appreciates that, in many markets of interest, the position of the sun at midday may be relatively low in the southern sky at some times of year, such as in the winter at northern latitudes, while the midday position of the sun in summer is near zenith. It is thus desirable that the tilt axis support 312 at the preferably southern end of the concentrating solar panel 1 be implemented so as not to cast a shadow on any of the concentrator modules 2, particularly, for example, at midday in the winter at northern latitudes. It is also desirable that support 312 allow clearance for concentrator modules 2 to articulate in tip without interference from support 312.

In some embodiments, the southern end of the tilt axis 15 is at a lower height than the northern end. This arrangement can lead to a tilt axis 15 that is slightly inclined with respect to the plane on which the panel 1 is mounted. Functionally, the inclined tilt axis 15 typically does not unduly affect the operation of the solar panel 1, but there advantageously may be a reduced shadowing benefit due to such inclination.

Figure 41:
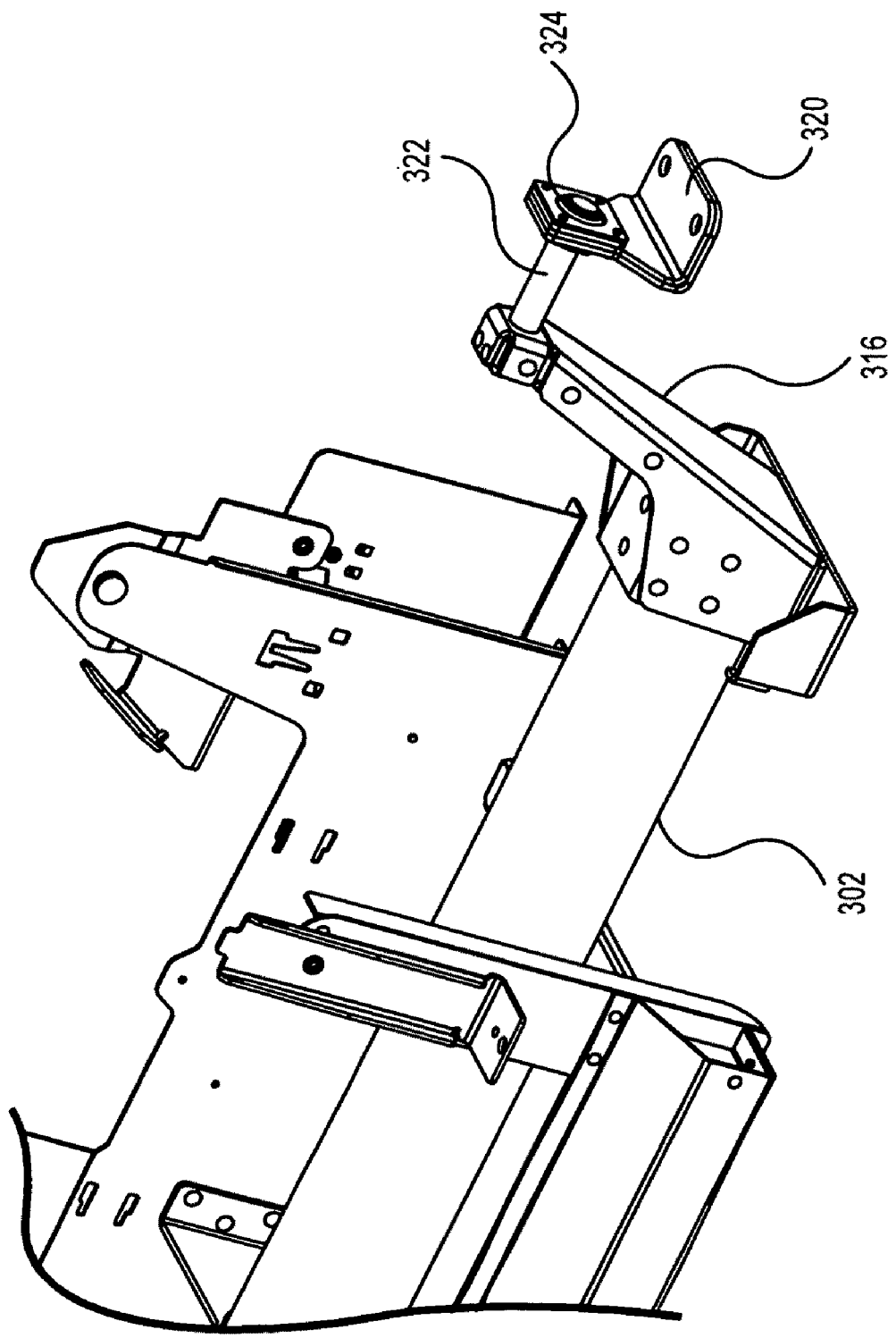
FIG. 41 shows a close-up view of the gooseneck attachment shown in FIG. 40.

In the preferred embodiment, the non-shadowing and clearance functions can be enhanced via the gooseneck attachment piece 316, shown in detail in FIG. 41. Gooseneck 316 preferably fits into axle 302 and arcs up to the desired pivot point about tilt axis 15, which is at or substantially near the center of gravity of the moving mass of the entire solar panel 1. Gooseneck 316 can be made out of any material suitable for articulating, and preferably supporting, axle 302 and any load that axle 302 may bear, such as cast aluminum.

Gooseneck 316 preferably mates to mounting plate 320 at pivot 322 via bearing 324. Bearing 324 can be any bearing that preferably allows for some desirable amount of range of articulation of axle 302 with respect to mounting plate 320. Advantageously, such a range of articulation can accommodate expected variations in the location of mounting points (not shown) during an installation. Accordingly, the present invention can allow the use of traditional flat-panel solar installation techniques if desired. A preferred bearing 324 includes a bearing that is partially spherical bearing. Additionally, pivot 322 is preferably free to slide longitudinally in bearing 324, thus allowing for translation of the mounting plate 320 in the, preferably, north-south direction, helping to accommodate variations in the position of mounting rails such as rails 350 and 352 in FIG. 2. Bearing 324 can be made of any suitable material such as, e.g., polymer.

While the preferred embodiment contains a single main support axle 302, alternative embodiments may use more than one main support axle 302.

Figure 42:
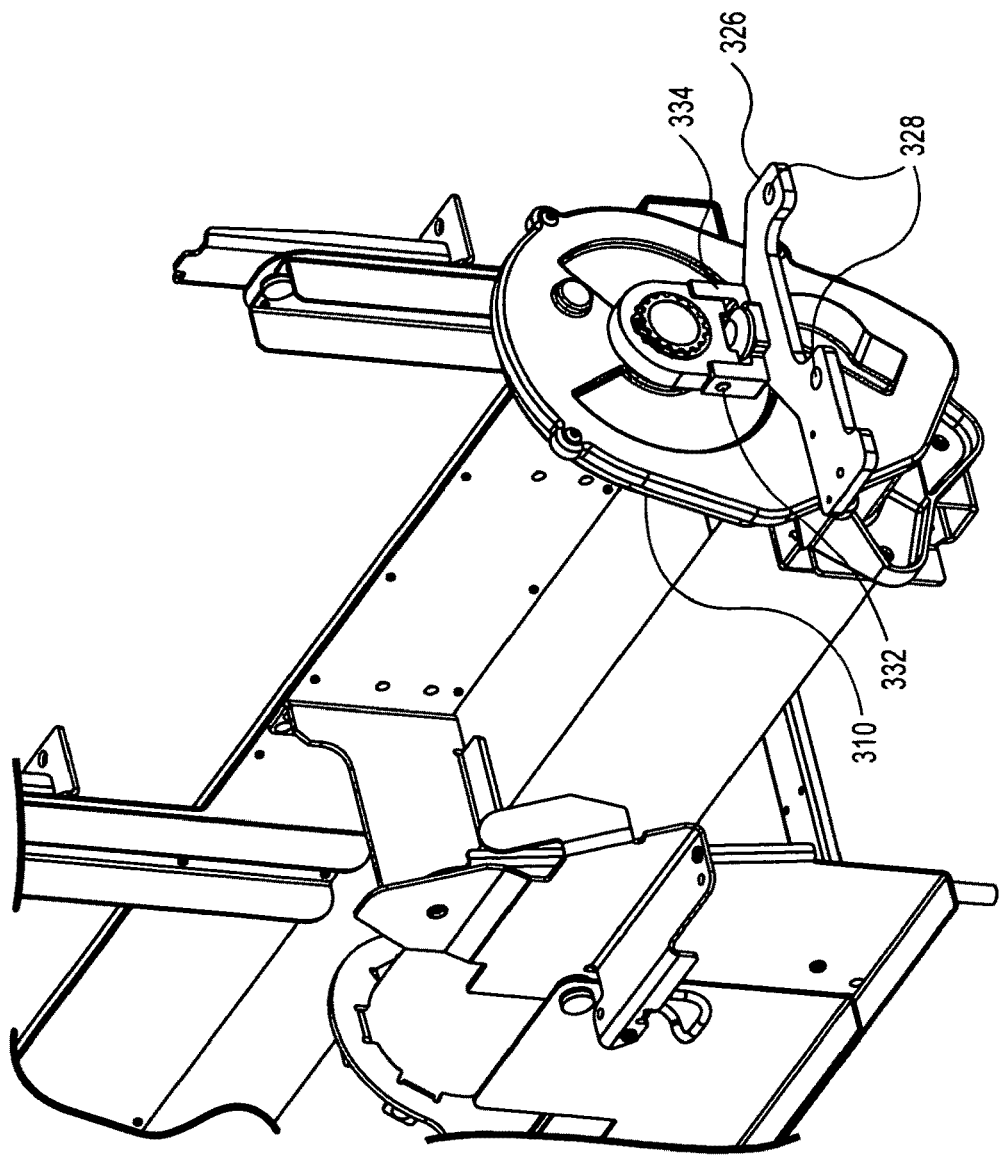
FIG. 42 shows an electronics housing associated with the articulation mechanism shown in FIG. 40.

Axle 302 is preferably articulated about tilt axis 15 by drive assembly 310 shown in FIG. 40. As shown in FIG. 42, drive assembly 310 is attached to bracket 326. FIG. 42 also shows electronics housing 240.

The drive 310 end of articulating mechanism 3 can be attached to a support using any suitable fastener. As shown, drive 310 is attached to mounting bracket 326. Bracket 326 includes mounting holes 328 for attaching to mounting rails. One approach to mounting the concentrating solar panel 1 is shown in FIG. 2, wherein bracket 326 mates to rail 350 and gooseneck mounting plate 320 mates to rail 352. FIG. 3 illustrates this scheme in the context of an entire roof, wherein a set of rails 354 are supported on a set of struts 356, providing a multiplicity of potential mounting points.

Returning to the mounting bracket 326 in FIG. 42, mounting bracket 326 mates to drive assembly 310 at pivot 332 via bearing 334. Together pivot 332 and bearing 334 preferably form a gimbal, allowing two degrees of freedom of movement at this interface, thus accommodating variations in mounting precision and mild misalignments of the tilt axis 15, e.g., with respect to the plane of the roof. Universal mounting joints, such as the gimbal formed by pivot 332 and bearing 334 as shown in FIG. 42, may be provided at one or both ends of panel 1. Panel 1 can be driven, and preferably supported, about tilt axis 15 with longitudinal compliance. Advantageously, panel 1 can continue to operate properly even when the racking is statically mislocated and/or dynamically moves.

Figure 43:
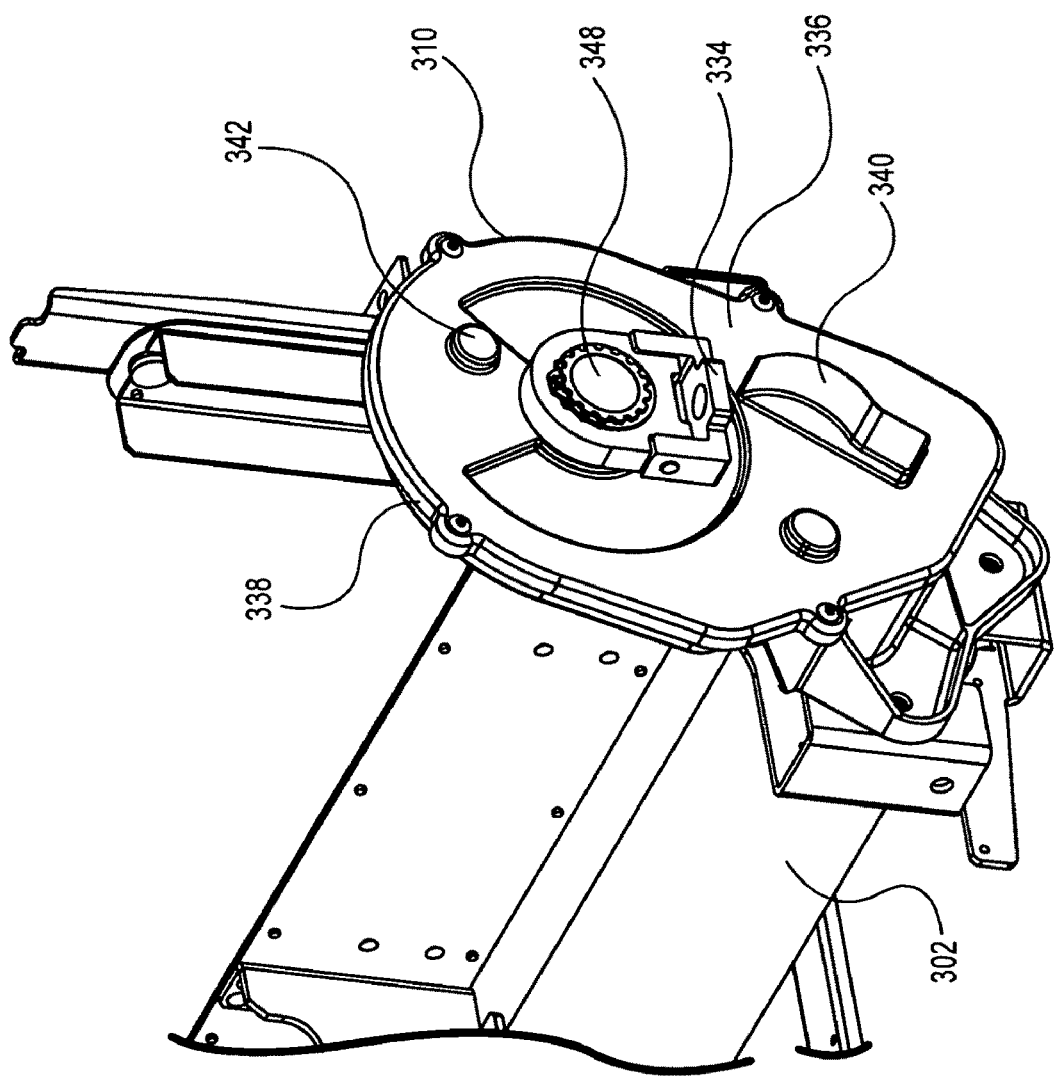
FIG. 43 shows the tilt axis drive mechanism for the articulation mechanism shown in FIG. 40.
Figure 44:
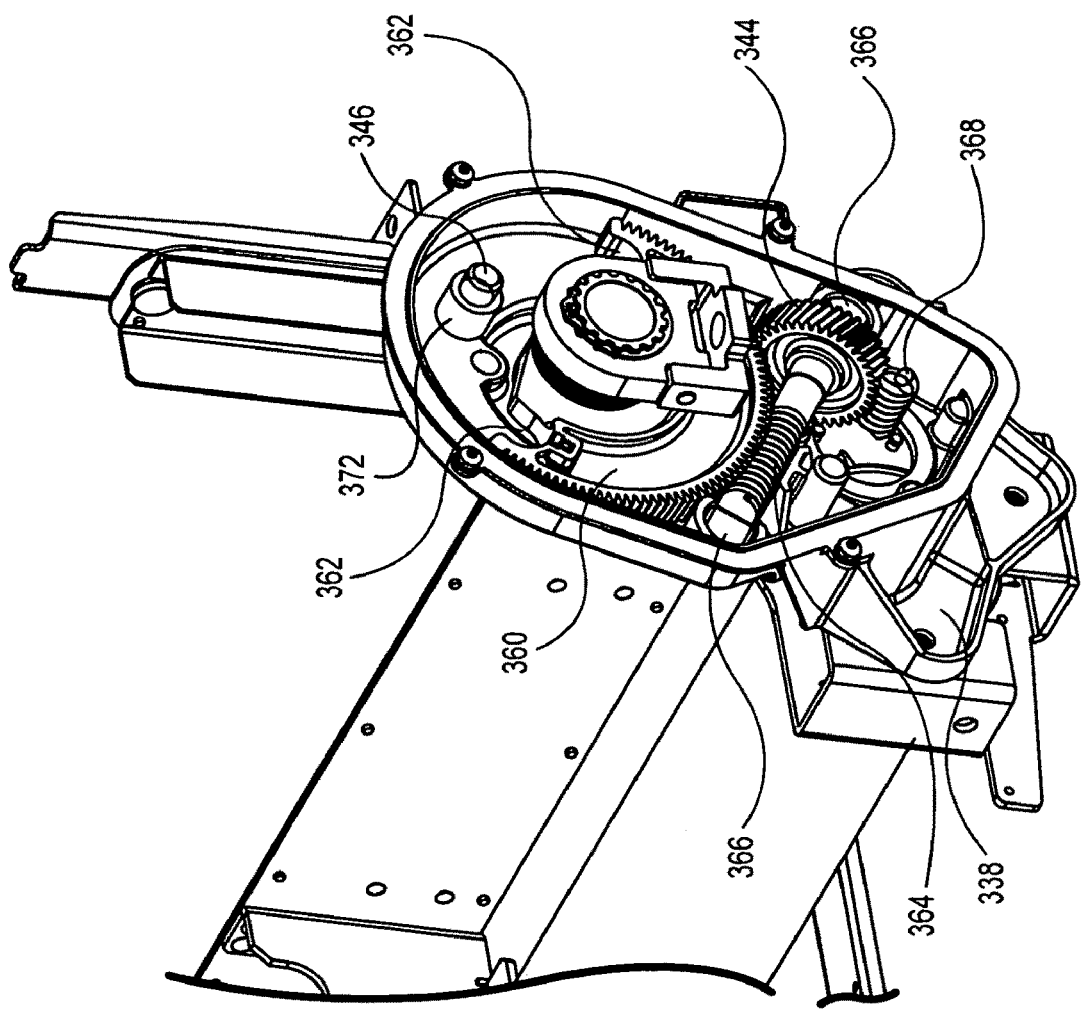
FIG. 44 shows the tilt axis drive mechanism of FIG. 43 with the cover removed.

Referring to FIG. 43, drive mechanism 310 is shown in more detail. Preferably, axle 348 (and sector gear 360, shown in FIG. 44) remains fixed, while the entire tilt mechanism 310 can rotate about it. The mechanism housing includes cover 336 and body 338. Body 338 fits into tilt axle 302. Referring also to FIG. 44, cover 336 includes a bulge 340 to accommodate gear 344 and a pocket 342 to accommodate limit pin 346. Cover 336 and body 338 can be made out of any suitable material. One preferred material includes cast aluminum.

Figure 45:
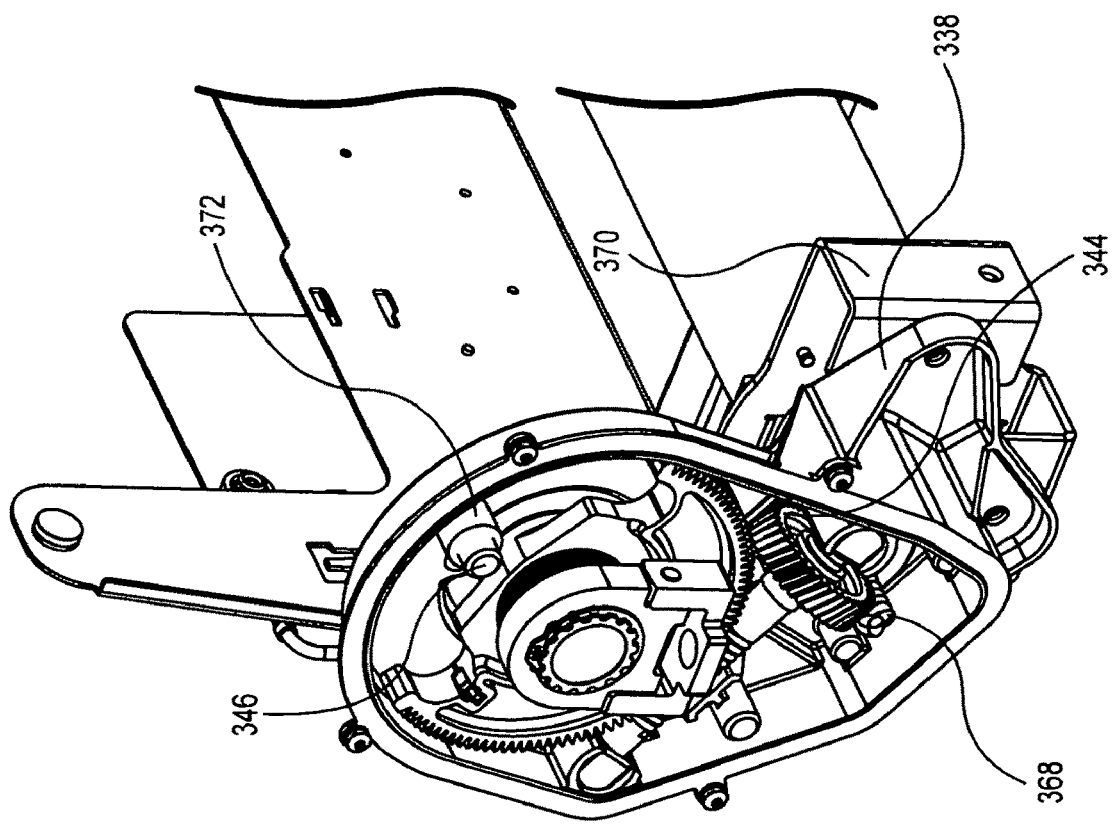
FIG. 45 is another view of the tilt axis drive mechanism of FIG. 43 with the cover removed.

FIGS. 44 and 45 are views of the tilt drive mechanism 310 with cover 336 removed. Motor (not shown) in box 370 provides the actuation for the mechanism 310 and is preferably a stepper motor. The motor drives worm gear 368, which turns gear 344, providing a first gear reduction. Gear 344 thus causes worm gear 364 to spin, supported on bearings 366, which are preferably semi-spherical polymer bearings. Worm gear 364 then causes housing 338 to rotate about fixed sector gear 360, providing a second gear reduction.

Tilt mechanism 310 desirably does not require maintenance, and thus preferably does not have to be lubricated. To help achieve this, the preferred mechanism includes gears made of appropriate material, for example, plastic for gears 344 and 360, and brass for worm gear 368. Worm gear 364 may be an appropriate metal (e.g., stainless steel), since it interfaces with only plastic and polymeric components. Similarly, polymeric bearings 366 aid in mechanism 310 not necessarily having to be lubricated. Worm gear 368 preferably includes brass, so that it may be assembled to the shaft of the motor via a press fit.

Sector gear 360 includes pockets 362, into which pin 346 enters at the limits of its motion. Collar 372 on pin 346 preferably implements a limit switch, for example, by providing a reed switch and magnet in collar 372 and one of the pockets 362.

Referring to FIG. 40 the entire frame 304 is preferably articulated about tilt axis 15 by the action of motor. FIG. 40 also illustrates preferred components which provide actuation about tip axis 17 (see FIG. 2 for tip axis 17). The buckets 8 are preferably ganged together, so that they move in synchrony about their respective tip axes 17. Each bucket 8 is preferably supported at pivot points 306 and articulates about these points 306 on brackets 382 and brackets 380. The buckets 8 are made to articulate by the motion of linkage arm 308.

Figure 35:
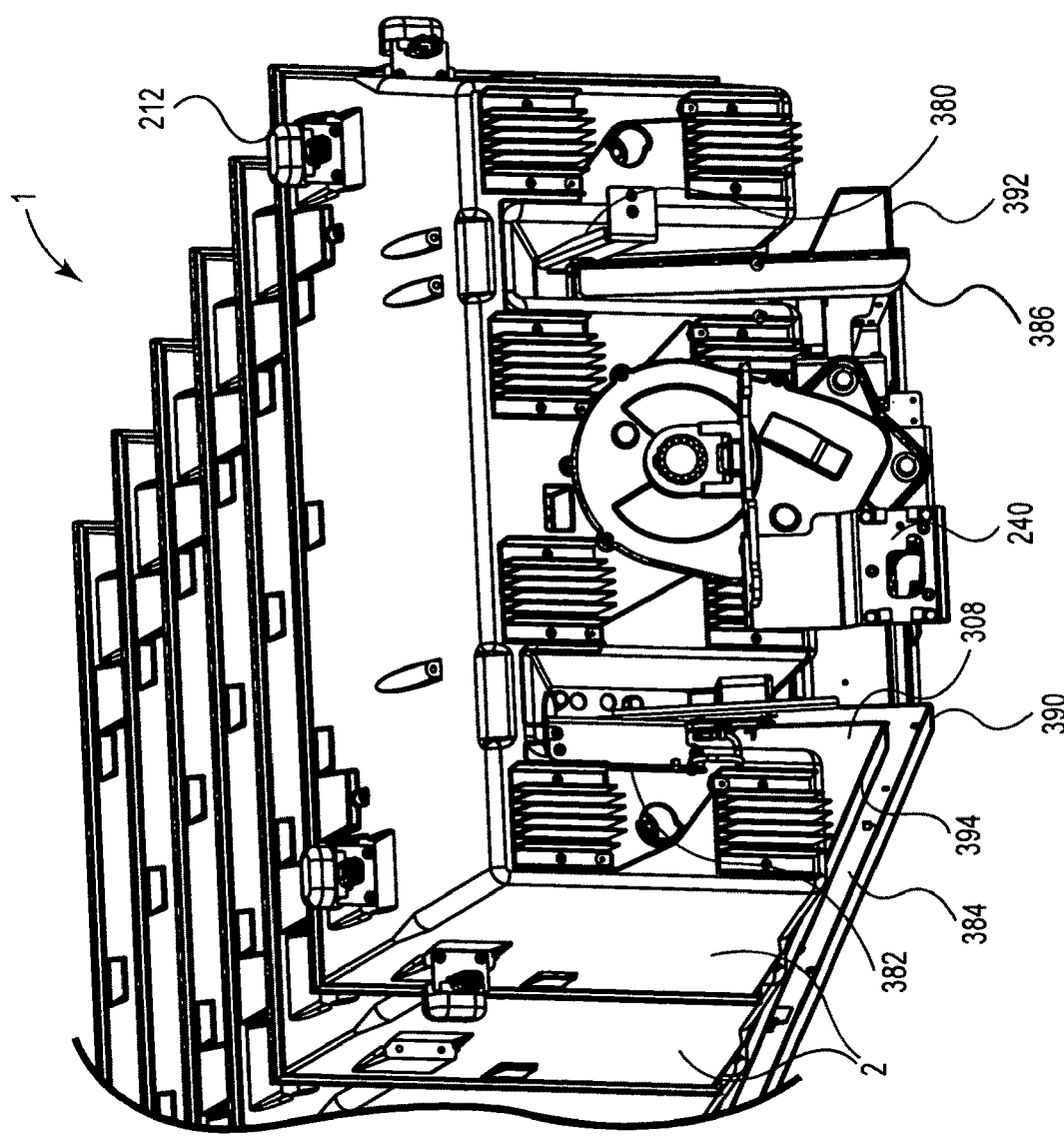
FIG. 35 shows a partial, alternate view of the system shown in FIG. 1.
Figure 36:
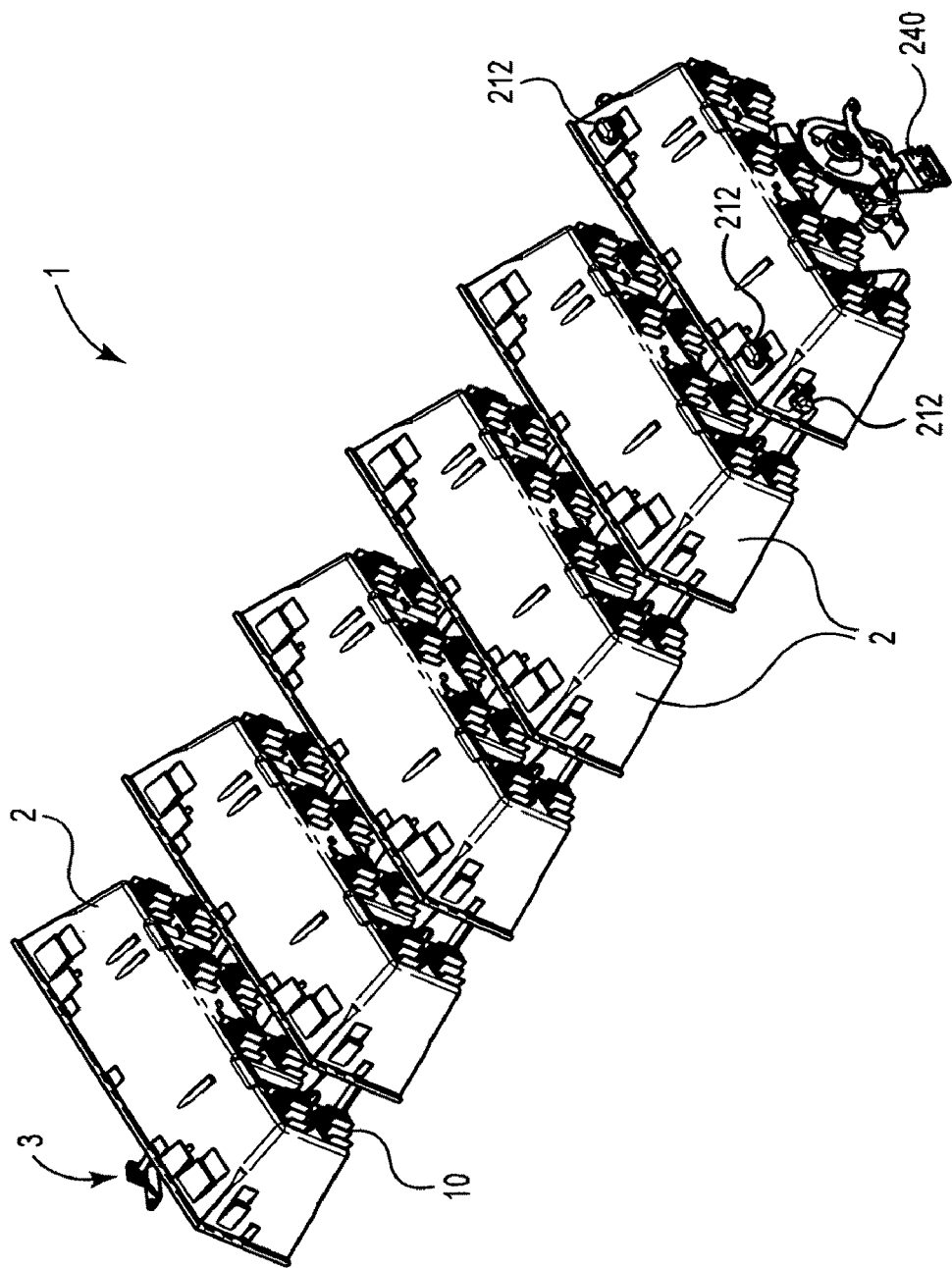
FIG. 36 shows an alternate-view of the system shown in FIG. 1.
Figure 37:
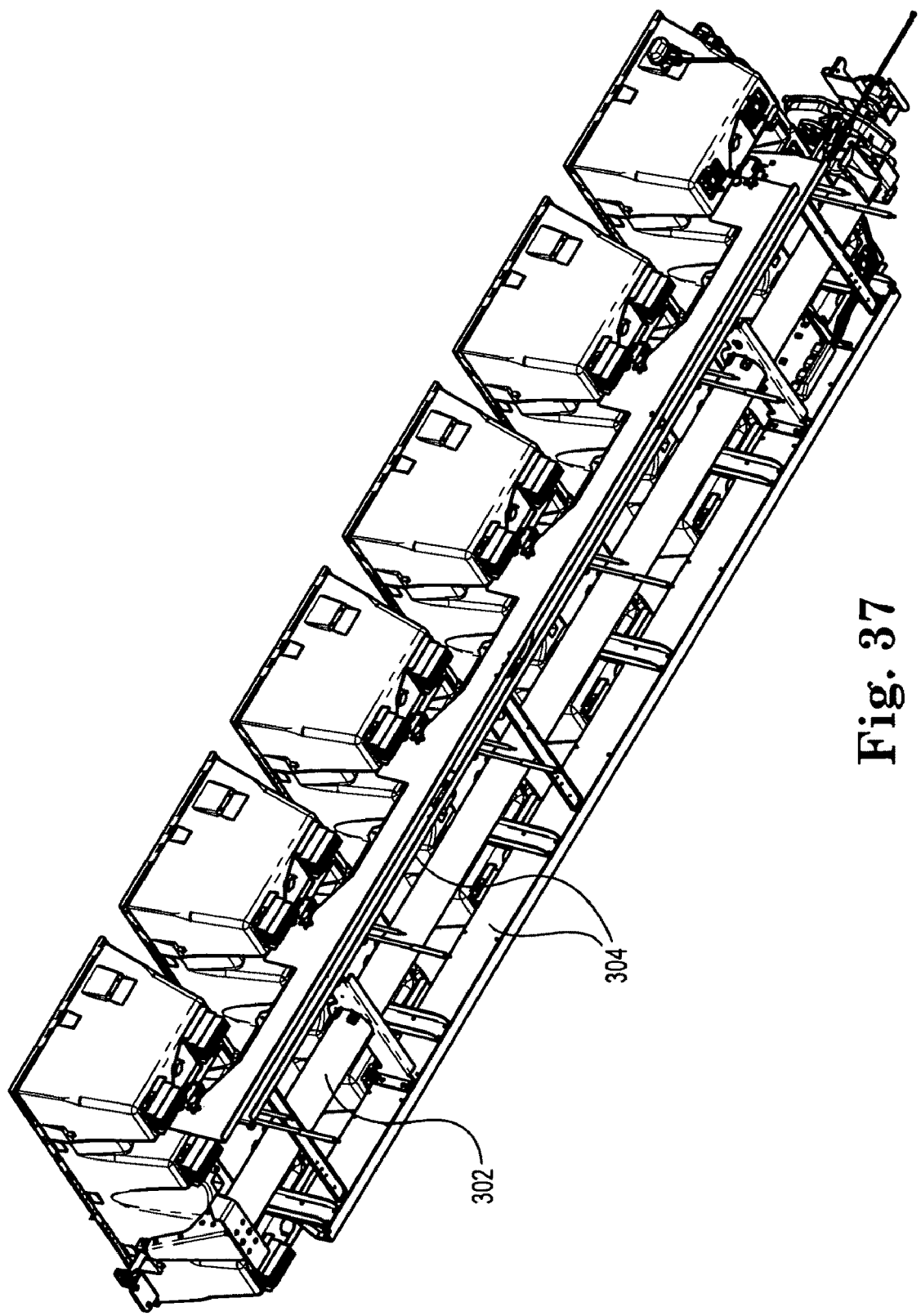
FIG. 37 shows an alternate view of the system shown in FIG. 1.
Figure 38:
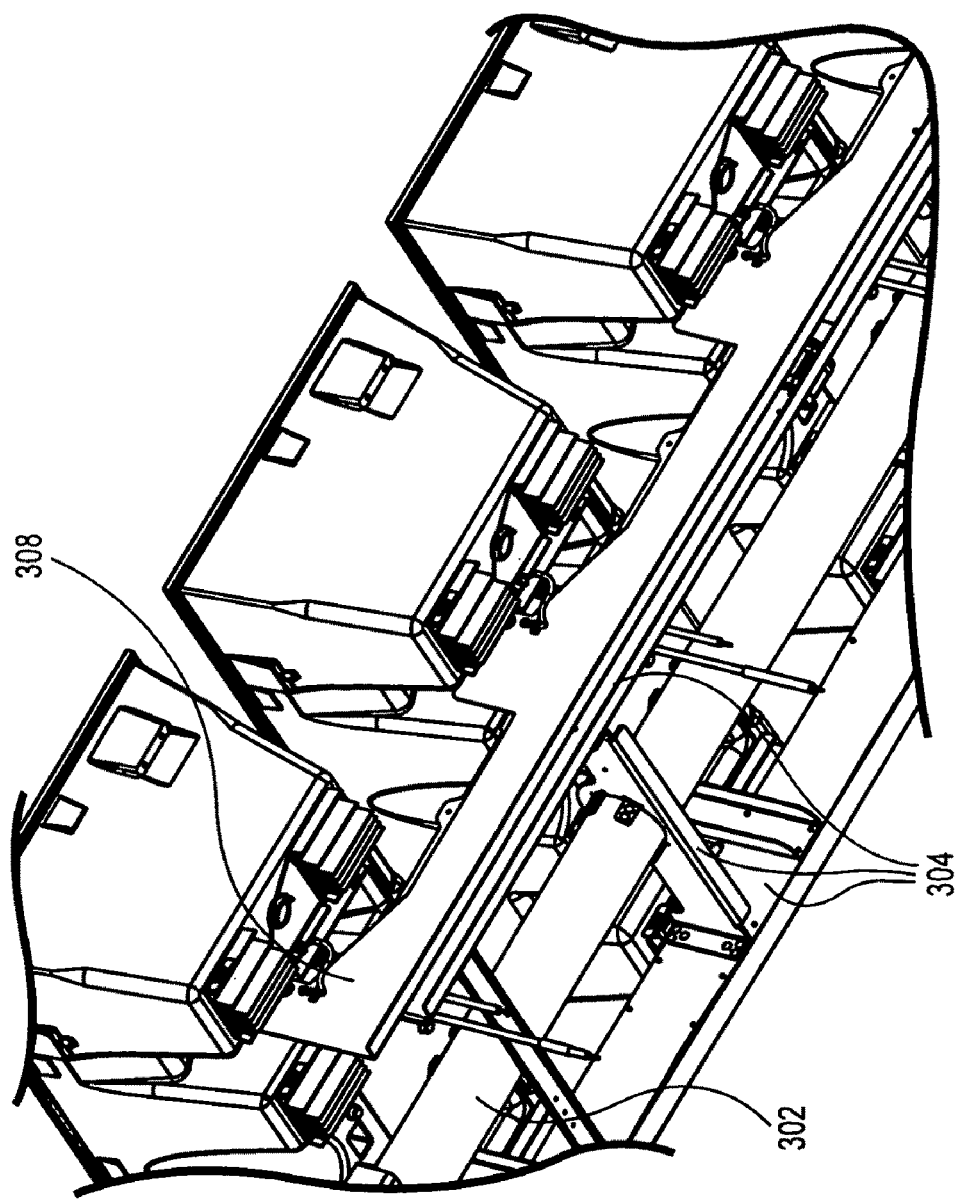
FIG. 38 shows a close-up view of a portion of the system shown in FIG. 37.

FIG. 35 illustrates the preferred brackets 380 and 382, frame, and linkage arm 308. The frame includes east-side rail 384 and west-side rail 386. Rail 384-includes stiffener 390, and rail 386 includes box stiffener 392. Linkage arm 308 includes stiffener 394.

Figure 46:
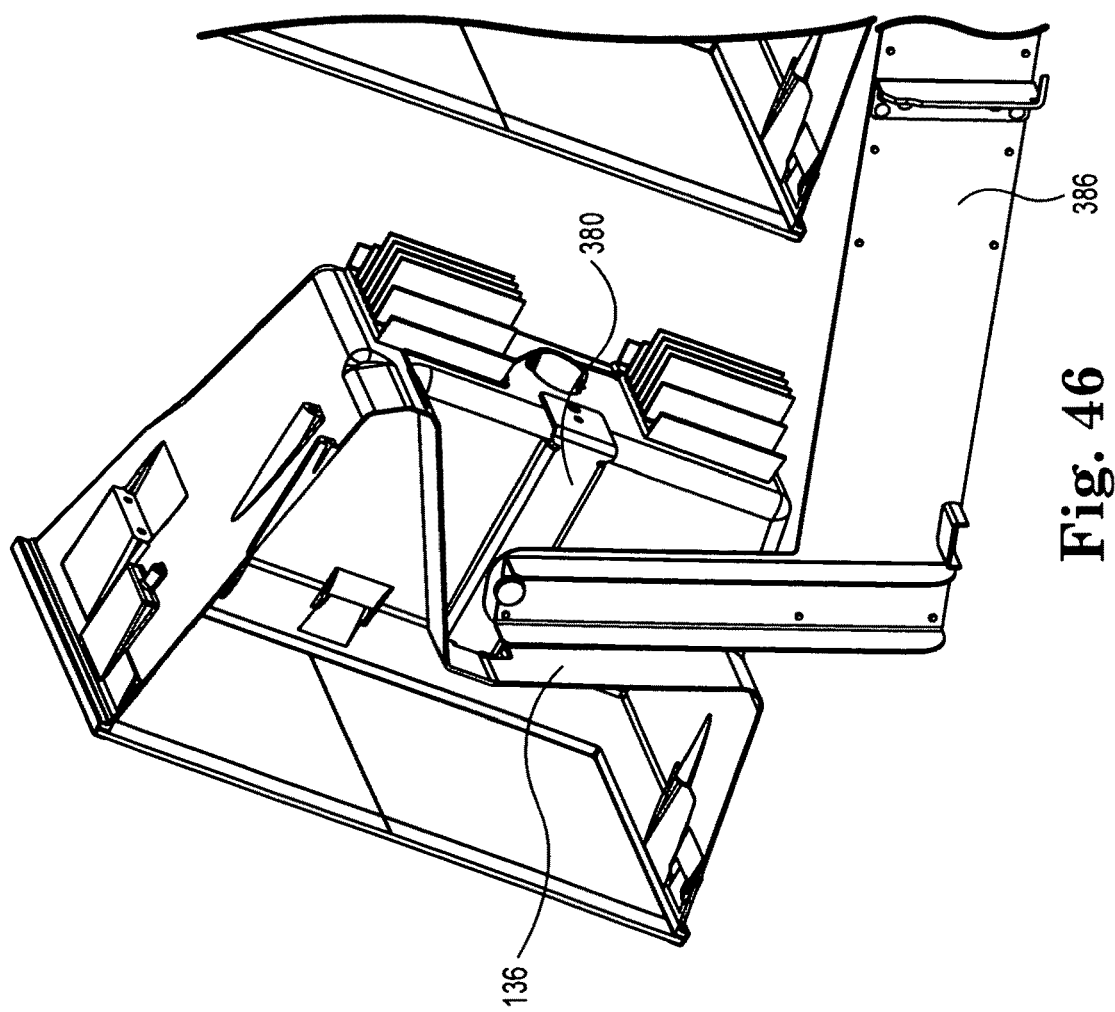
FIG. 46 shows a cross-sectional view of a portion of the system shown in FIG. 1.
Figure 47:
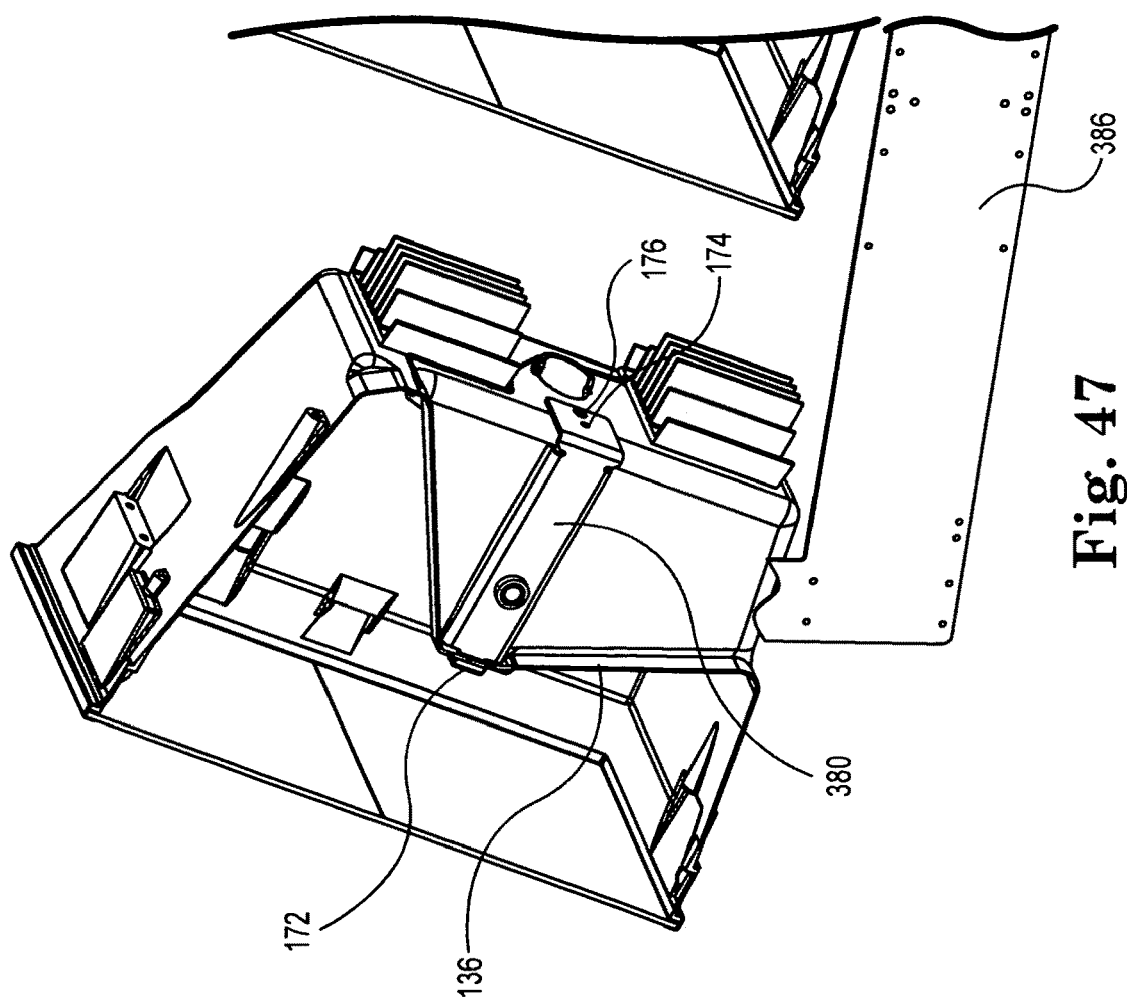
FIG. 47 shows another cross-sectional view of a portion of the system shown in FIG. 1.
Figure 48:
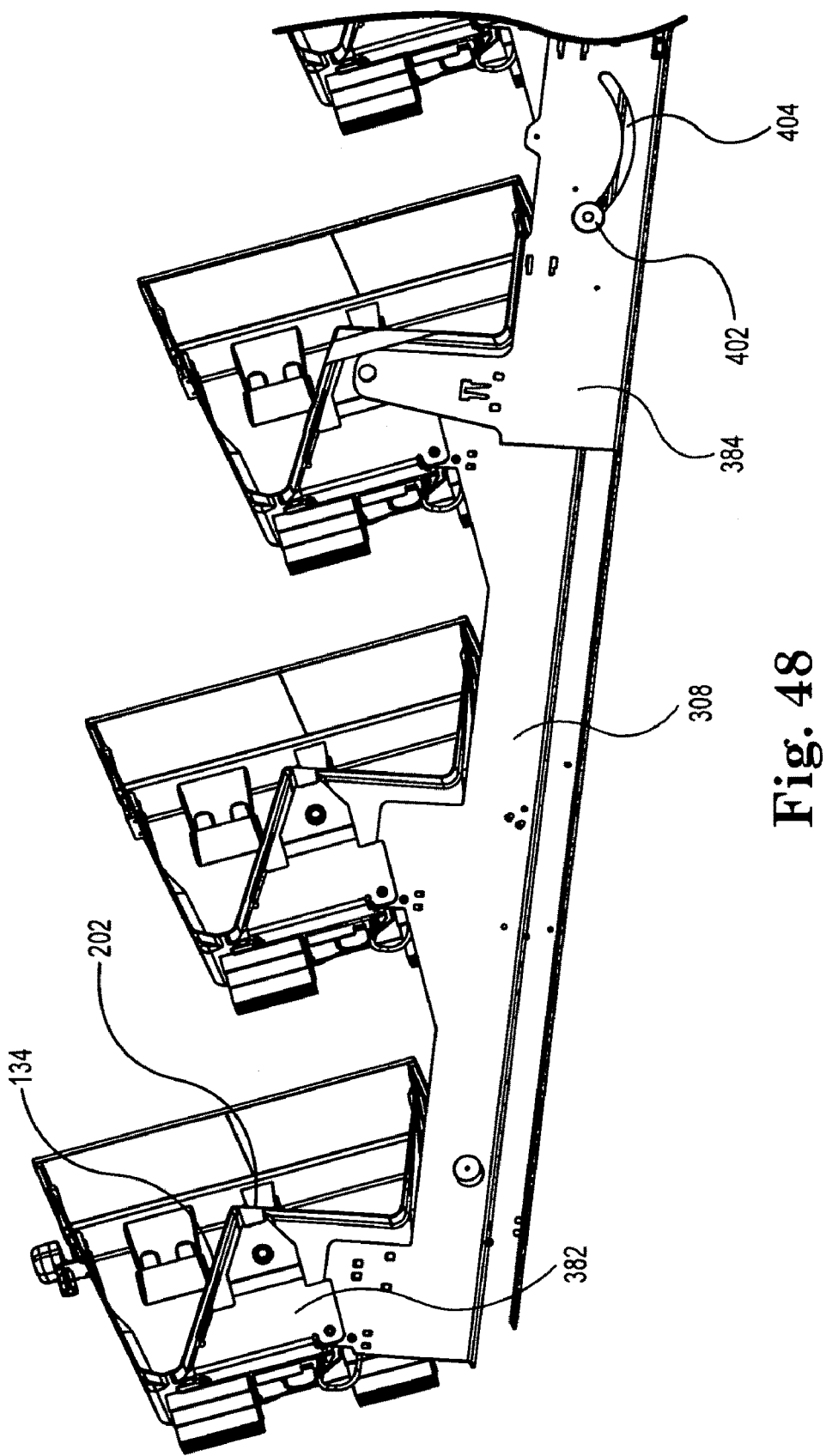
FIG. 48 shows another cross-sectional view of a portion of the system shown in FIG. 1.

The preferred method of supporting and articulating the tip axis is shown in further detail in the section views in FIGS. 46, 47, and 48. FIGS. 46 and 47 are views of the west-side rail 386 and brackets 380, with the sections taken at slightly different depths. In FIG. 47, and also referring back to FIG. 10, the mating of the brackets 380 to the buckets 8 is visible, including the nesting of the bracket's tip into pocket 172 in cavity 136, the screw attachment of bracket 380 into threaded insert 174, and the location of bracket 380 on nub 176.

Similarly, the section view in FIG. 48 shows east-side rail 384 and brackets 382. Also referring back to FIG. 11, it illustrates how brackets 382 fit into slots 202 inside cavities 134 and are screwed into threaded inserts 206. FIG. 48 also shows how linkage arm 308 moves with respect to rail 384, causing the buckets 8 to articulate about tip axis 17. A linear actuator (discussed below) causes spindle 402 to slide in slot 404, causing linkage arm 308 to move in an arc, causing rotation of brackets 382 and thus articulation of concentrator modules 2.

Figure 49:
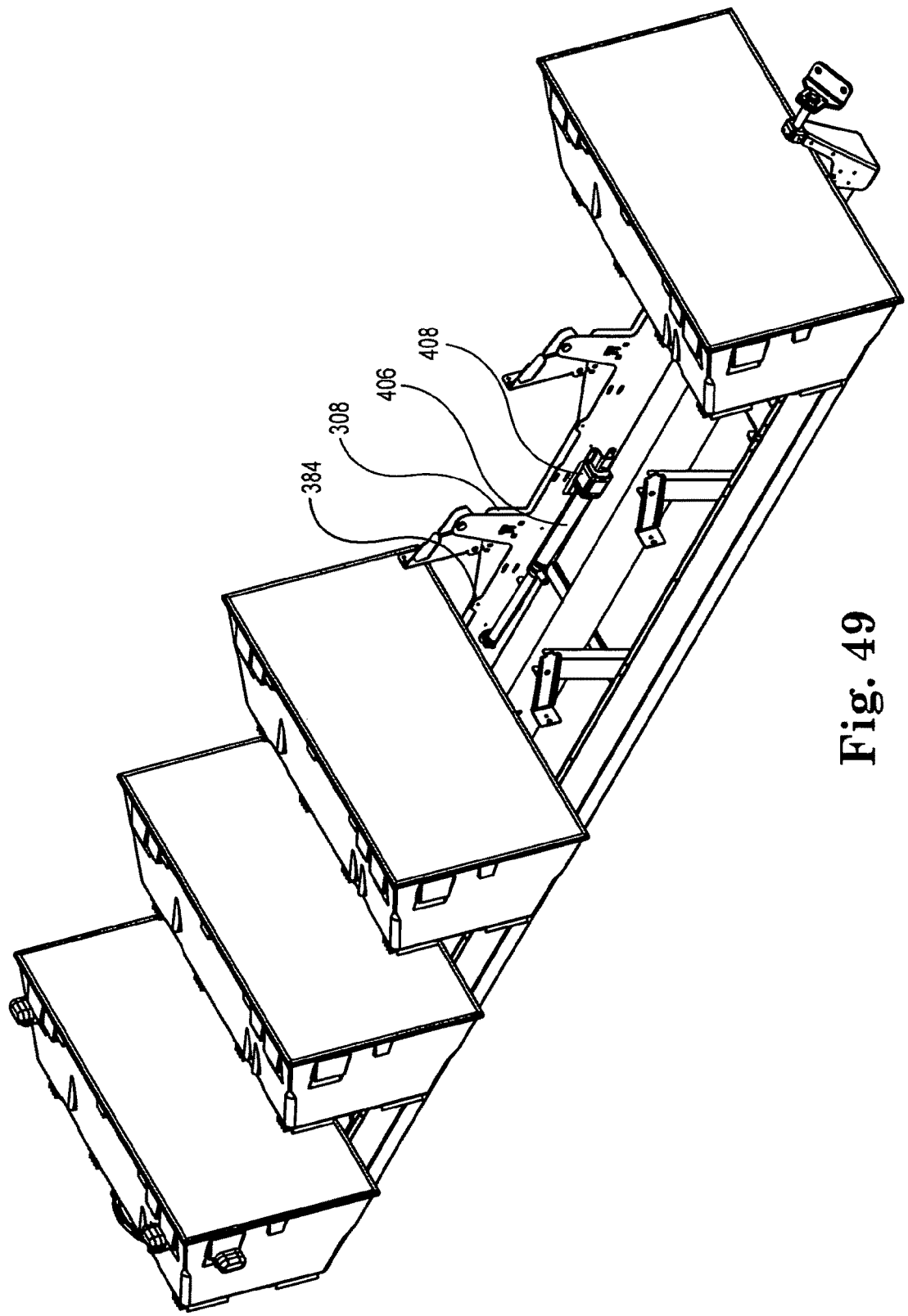
FIG. 49 shows a portion of the system shown in FIG. 1, with two concentrator modules removed.
Figure 50:
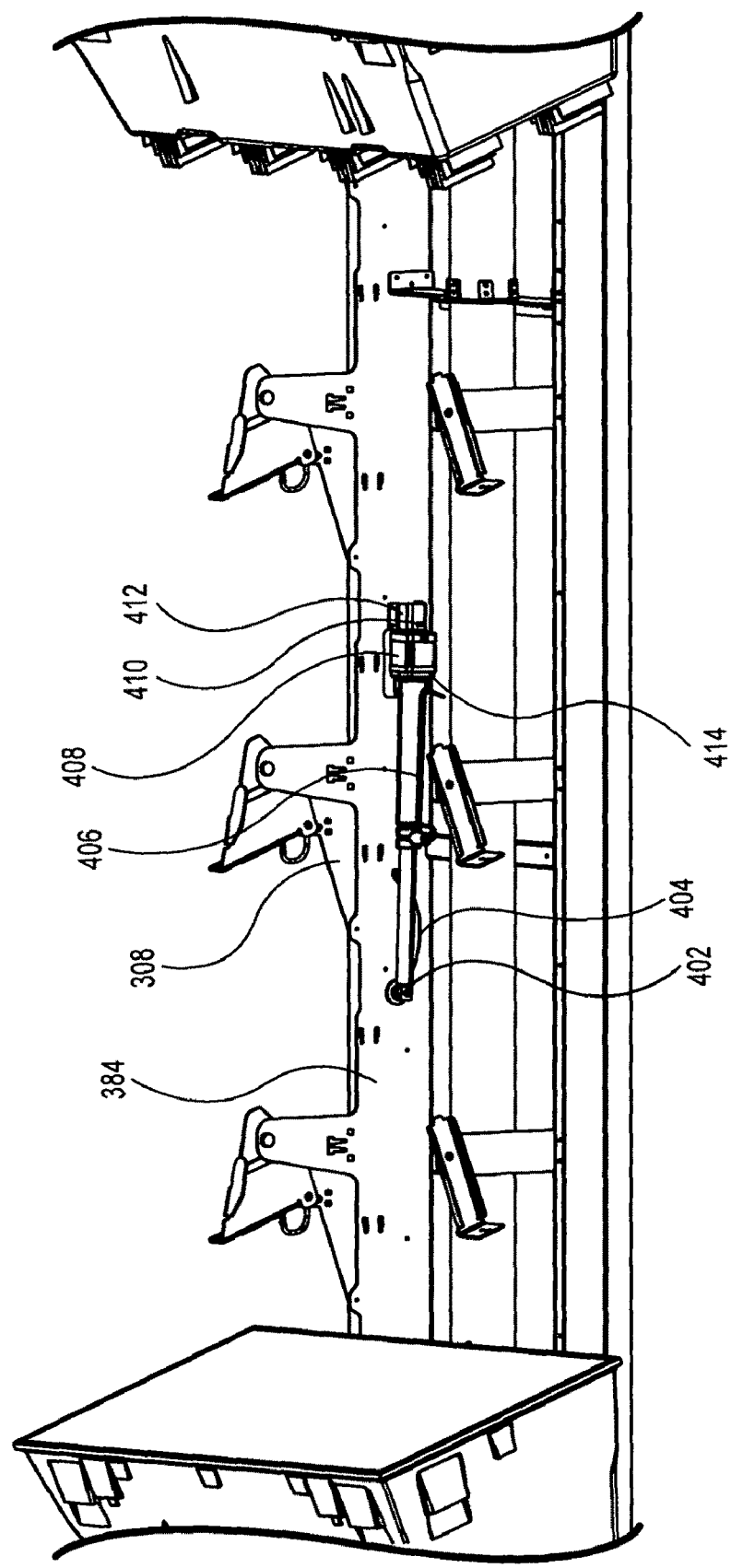
FIG. 50 shows a close-up view of a portion of FIG. 49.

FIGS. 49 and 50 illustrate the linear actuator that drives a bucket 8 about the tip axis 17. In both FIGS. 51 and 50, two of the concentrator modules 2 have been removed to reveal the actuator 406, which is driven by motor 408. The entire actuator pivots on spindle 410 mounted in bracket 412 and east-side rail 384. The actuator causes spindle 402 to slide in slot 404. The actuator also includes lever 414 which actuates a limit switch.

Buckets 8 of concentrating solar panel 1 may occasionally cast shadows on adjacent buckets 8 within solar panel 1 and/or on buckets 8 within adjacent solar panels 1. Preferably, power drops less than or in proportion to the amount of shadowing.

The power leads 53 and 56 from the heat sink assemblies 10 within the bucket 8 are preferably wired in a series-parallel circuit with the output wires from the other buckets 8 to produce a desired output voltage and current. While traditional solar panels rapidly lose power when they are even slightly shadowed, it is desirable for the preferred embodiment herein to exhibit a tolerance to shadowing. In practice, in traditional solar panels, power output can drop inasmuch as the currents through the different solar cells in a solar panel are mismatched. Preferably, the series-parallel circuit is selected to help make one or more buckets tolerant to shading, e.g., from adjacent buckets 8 within solar panel 1 or from adjacent solar panels 1.

Preferably, a circuit of a module 2 includes at least four solar cells, wherein a first set of solar cells includes at least two solar cells that are wired in parallel and a second set of solar cells includes at least two different solar cells that are wired in parallel, and wherein the first and second set of solar cells are wired in series. In preferred embodiments, a concentrator has at least a 2 by "n" array of solar cells (where "n" is 2 or greater) and at least two solar cells of a given solar cell set are from different rows. Preferably, the solar cells are wired in parallel in a "zig-zag" pattern as described below in connection with FIGS. 52 and 53.

Figure 51:
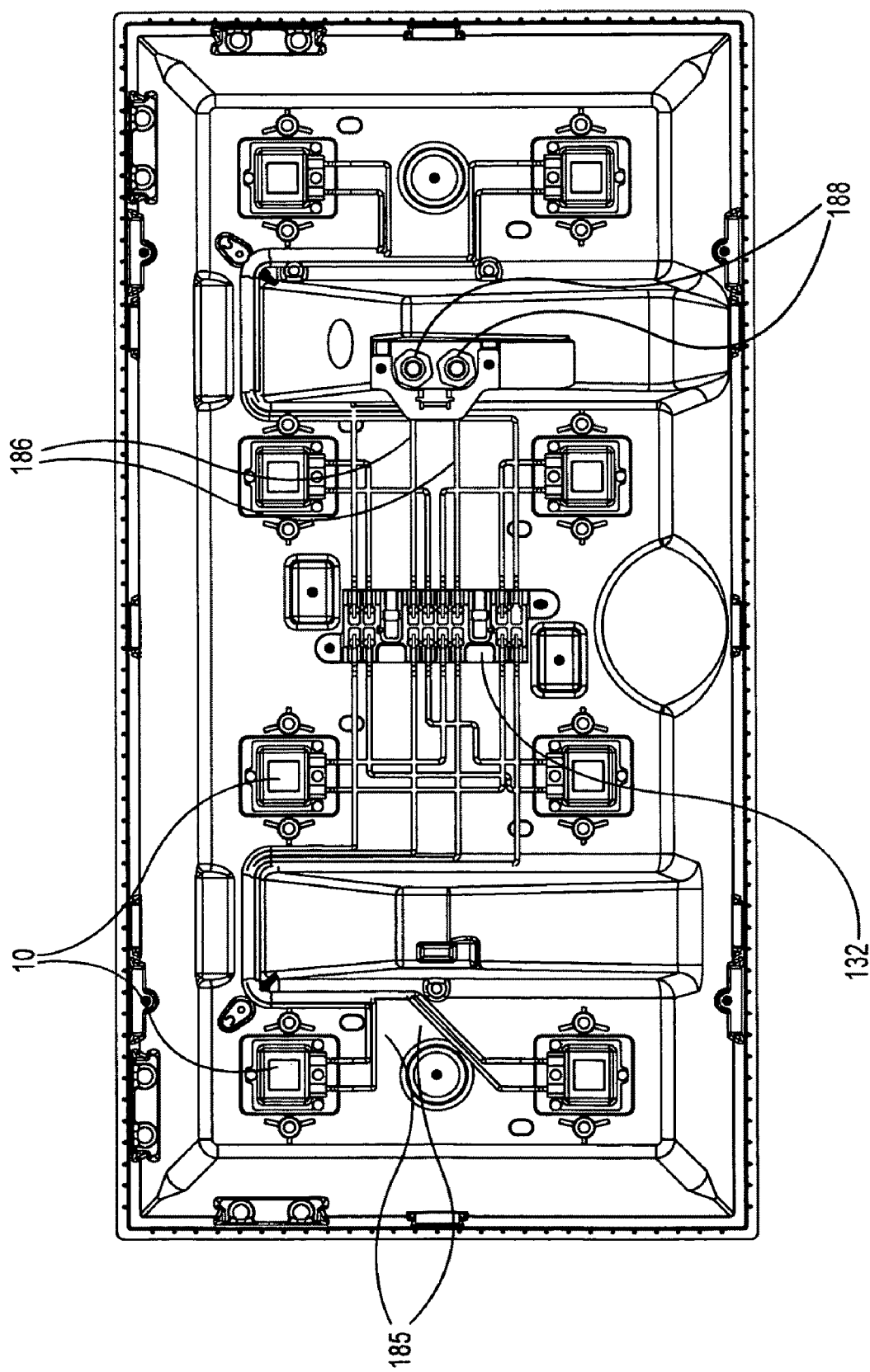
FIG. 51 shows the bucket of FIG. 6 with wiring.
Figure 52:
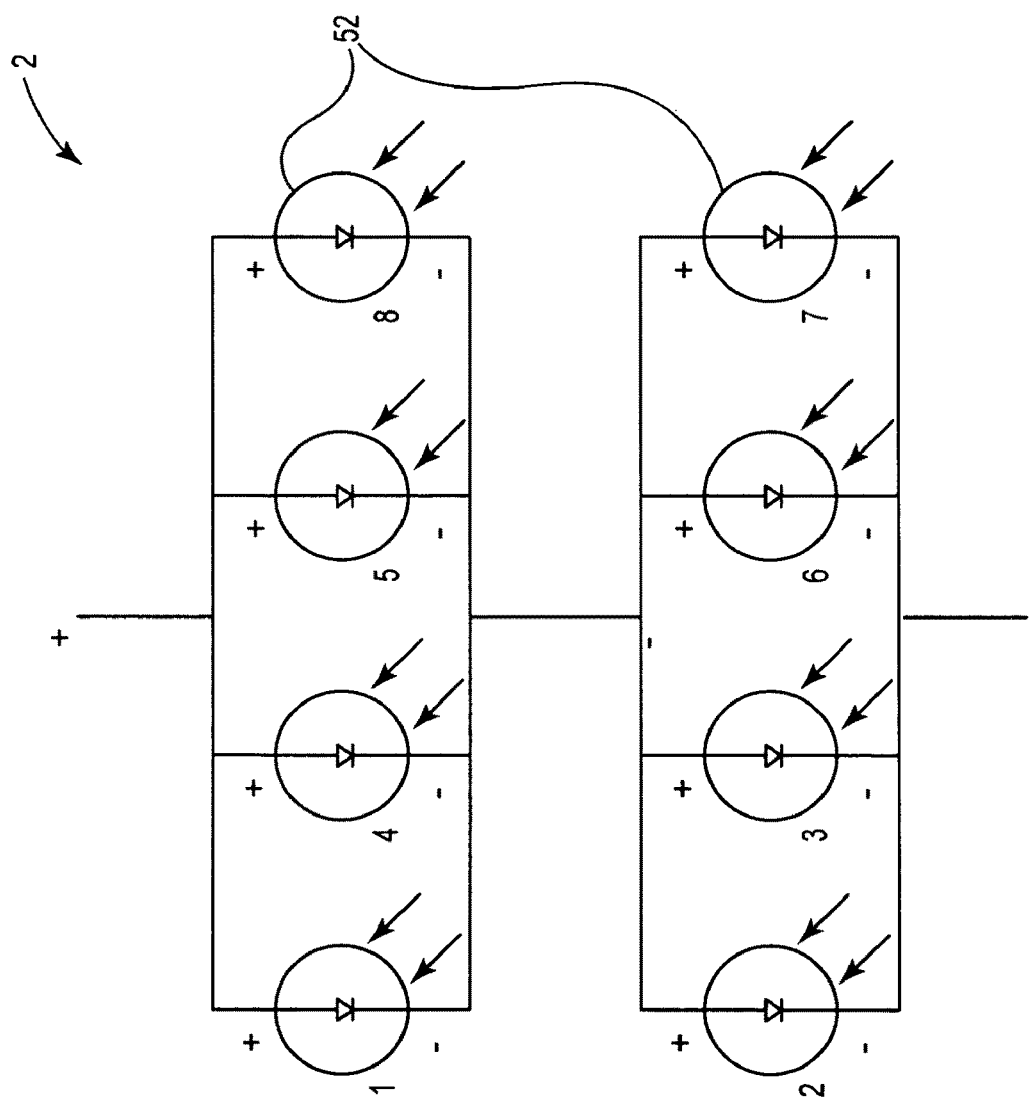
FIG. 52 shows a wiring schematic associated with the wiring layout shown in FIG. 51.

An exemplary wiring scheme that can help bucket 8 be tolerant to shading is shown graphically in FIG. 51 and schematically in FIG. 52. Wires 185 together with wiring hub 132 connect the solar cells 52 within heat sink assemblies 10 to form a series-parallel circuit, as shown in FIGS. 51 and 52. The resulting series-parallel circuit then preferably provides at least two output wires 186 which exit through the base 145 of the bucket 8, preferably as one or more output cables exiting the bucket 8 through one or more preferably watertight feedthroughs 188.

Figure 53:
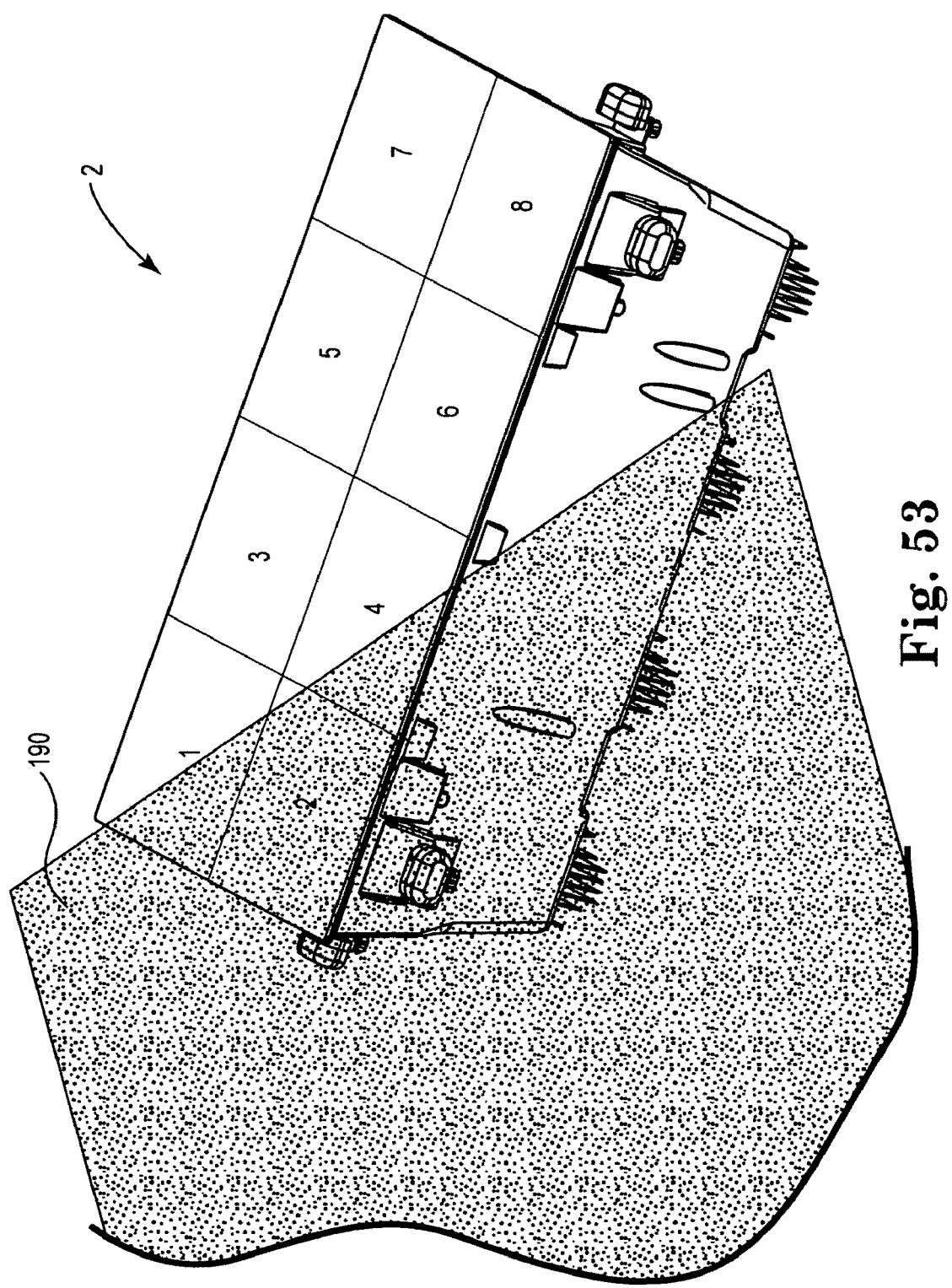
FIG. 53 shows the module of FIG. 5 in the context of a shadow.

As shown, the wiring hub 132 preferably includes high, common, and low bus bars 180, 182, and 184, respectively (see also FIG. 12). Referring to FIGS. 51, 52, and 53, by wiring the power leads 53 and 56 to the bus bars 180, 182, and 184, appropriately, the preferred embodiment places the solar cells from apertures 1, 4, 5; and 8 in parallel, and places the solar cells from apertures 2, 3, 6, and 7 in parallel, and then wires these two parallel groups in series. Disproportionate losses due to shadowing may occur only inasmuch as the aggregate illumination of each of the two parallel groups is different. If a shadow is cast as approximately a straight line across the concentrator module 2 (such as shadow 190), the net loss of illumination in the two groups will tend to be equal. For example, as shown in FIG. 53, the total shadowed area of apertures 1 and 4 is approximately the same as the shadowed area of aperture 2. The preferred wiring scheme can help prevent a disproportionate penalty from such shadowing.

Also present in the preferred embodiment, but not shown in FIG. 52, bypass diodes are placed in parallel with each solar cell so as to protect the cell from reverse voltages, as may happen when a large portion of the bucket is in shadow.

Referring to FIGS. 11 and 12, the eastern side of the bucket further preferably includes power feedthroughs 188, slot 202, vent port 204, threaded inserts 206, and optional grounding lug 208. Slot 202 and inserts 206 are for attachment of a mounting bracket to the bucket, described later. Grounding lug 208 is an optional feature for routing system ground from the inside of the bucket to the outside (an alternative path is via the heat sinks).

After the power wires 186 exit the feedthroughs 188, the wires from the buckets are preferably wired together in series to produce a desired voltage and current output.

Alternative embodiments may use other wiring approaches instead of a wiring hub 132, including a printed circuit board (not shown), pre-formed bent (not shown) and/or welded wire structures (not shown), and wiring (not shown) co-molded into the base of the bucket 8 or into an auxiliary part (not shown) that fits into the base of the bucket 8.

Solar panel 1 can produce any desired voltage and amperage. An exemplary embodiment includes approximately 32 volts at 12.5 amps under typical conditions.

Buckets 8 are preferably capable of holding a position about both of the tip axis 17 and tilt axis 15 without any torque being provided by the motors (i.e., they are preferably not "back-drivable"). Both actuators 406 and gearbox 310 incorporate a worm and/or screw gear to help implement non-back-drivability.

Buckets 8 are preferably actuated about both the tip axis 17 and tilt axis 15 by stepper motors. Stepper motors can offer high torque at low speeds, which are typical specifications for a tracking solar collector. The preferred stepper motors can be driven by electronic control module 239 shown in FIG. 54. There is preferably one electronic control module 239 per concentrating solar panel 1, but alternative embodiments may control multiple panels 1 from a single electronic control module (not shown).

The electronic control module 239 includes a microcontroller, preferably an Atmel AT90CAN12 from the AVR family of processors, input power conditioning, motor drivers, input signal conditioning, an external digital interface, and means to program the microcontroller with software. Any appropriate closed-loop or open-loop tracking algorithm may be used. Preferably, a closed-loop algorithm is used.

As shown in FIG. 35, the control electronics are housed in a small box 240.

The electronic control module 239 receives input from a set of preferably four sun position sensors 212. The electronic control module 239 preferably uses a first-order closed-loop servo algorithm to point at the sun, along with an open-loop estimator of present sun velocity to help maintain approximately correct pointing when the sun goes behind a cloud or other obstruction. The open-loop estimator may optionally be disabled if desired. While the first-order servo with open-loop estimator is preferred, any appropriate control scheme may be used, including pure open-loop, second-order closed-loop servo, or more complex compensated servos.

The electronic control module 239 is preferably powered by an external unregulated 24V DC power supply. Final regulation can be performed on the electronic control module 239 itself. Any other appropriate power scheme may be used, including an external AC supply, onboard batteries that are optionally recharged by the panel itself, or a source of self-power, such as described in U.S. Pub. No. 2007/0102037 (Irwin), the entirety of which is incorporated herein by reference.

The electronic control module 239 preferably includes an interface allowing the microcontroller to be programmed in the factory with its operating software.

The electronic control module 239 also preferably includes a digital interface, preferably CANbus, through which panel telemetry can be reported, comprising tracking system performance data such as sensor readings, motor velocities, and servo errors, and/or panel power data such as current and/or voltage output.

Each panel 1 is assigned a preferably unique ID at the factory so that its telemetry can be distinguished from all the others on the CANbus. Additionally, the electronic control module 239 preferably provides a capability to listen for commands on the CANbus, so that an external control computer can be connected to the bus to command diagnostics or other useful functions. The electronic control module 239 also preferably provides the ability to reprogram the microcontroller over that CANbus, thus allowing, for example, for upgradeability of the system firmware in the field.

Different target customers may trade off power density in their installation against overall cost. For example, since balance of system costs including inverters, racking, permitting, overhead, and installation are typically better amortized by a high-power system, some customers may want relatively higher power density, thus desiring to closely pack concentrator modules 2 in the east-west direction. Other customers will be less sensitive to these costs and may want the maximum annual energy output from each module 2. These customers may desire to space the modules 2 far apart in the east-west direction so that modules 2 are less likely to shadow one another over a substantial part of the year.

Figure 56:
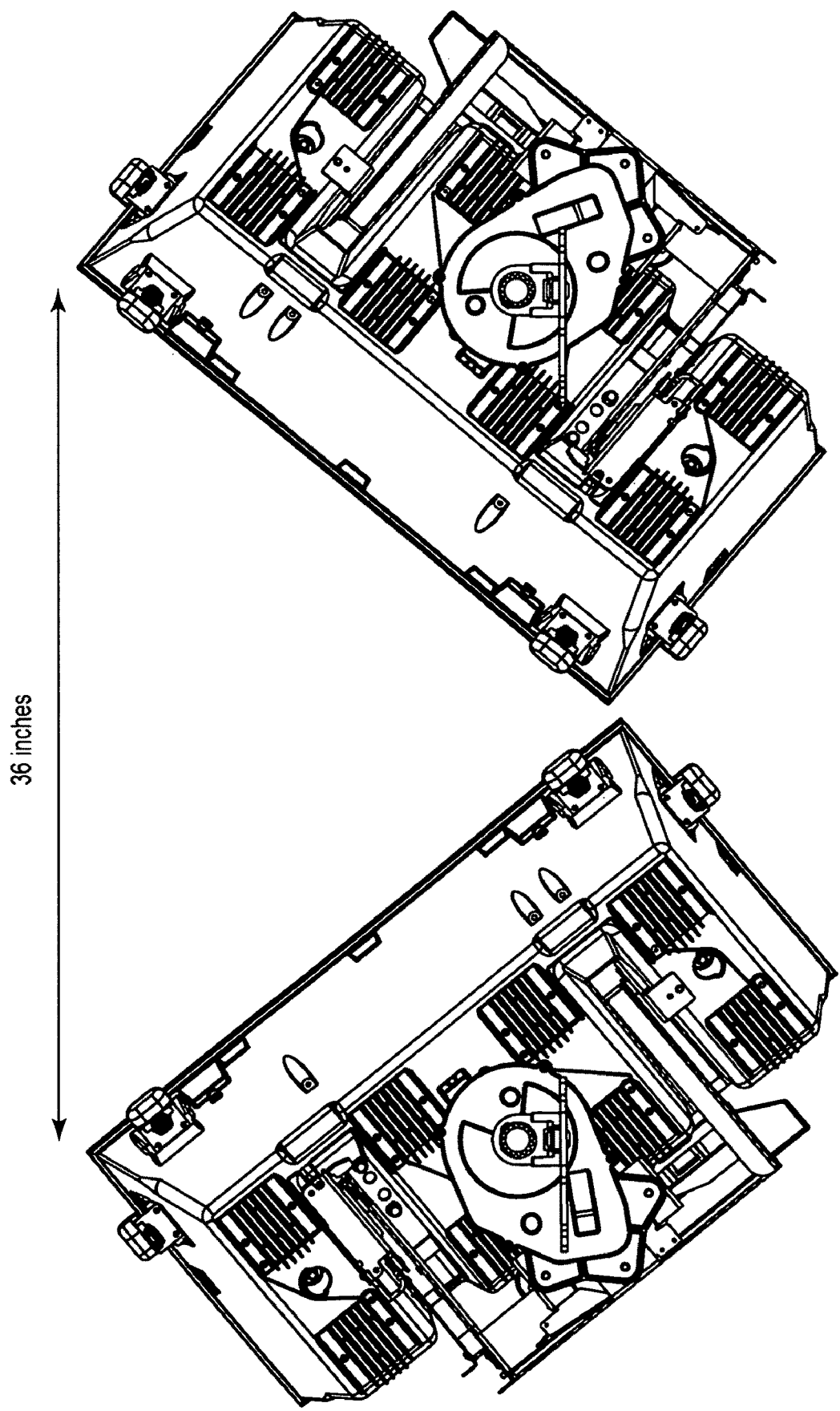
FIG. 56 shows a preferred embodiment of the arrangement shown in FIG. 55.

The present invention provides a solution to meet the needs of both types of customers by preferably providing the modules 2 in a single row on a single tilt axis 15. The spacing between adjacent concentrating solar panels 1 about tilt axis 15 (which is the direction most likely to experience regular and/or significant shadowing in a preferably oriented system) can then be adjusted by the customer as desired in order to achieve a desired cost/benefit ratio. In the preferred embodiment, the tilt-axis-to-tilt-axis spacing of the panels 1 may be as little as 36 inches (39 inches with a safety margin) as shown in FIG. 56. Generally, there is no upper bound. In alternative embodiments, the tilt-axis-to-tilt-axis spacing may be relatively smaller, e.g., as low as the width of a concentrating module 2.

Figure 55:
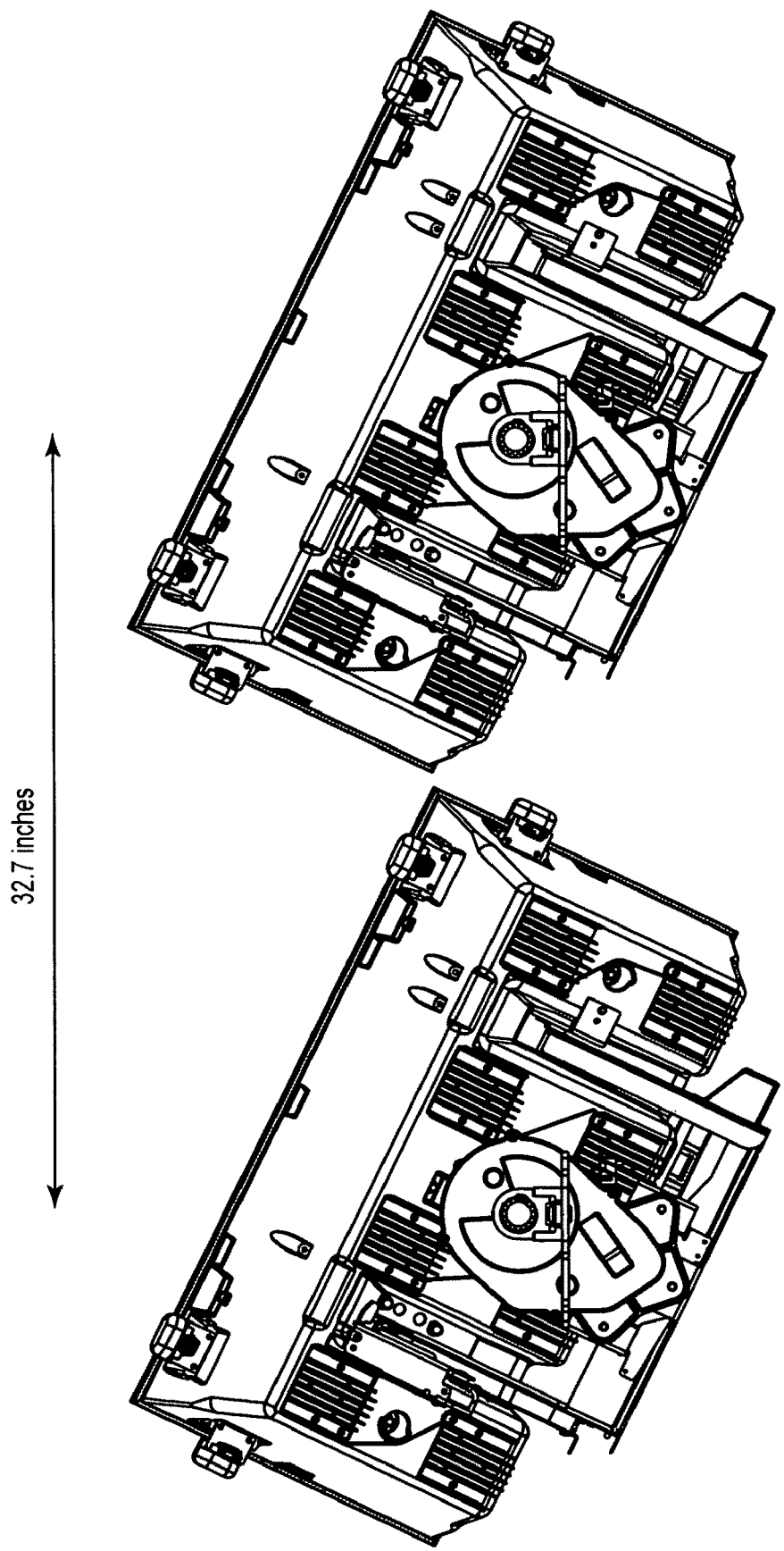
FIG. 55 shows two concentrator modules as shown in FIG. 5 that are on adjacent solar panels, with the remaining solar panel removed.

As shown in FIG. 55, minimum spacing is set by the diameter of the circle swept by the concentrator modules as they articulate in tilt, while tipped at their maximum extent, which is 70 degrees in the preferred embodiment. Preferably, the minimum separation between modules 2 is approximately the length of the diagonal of module 2. For example, the diagonal is 32.7 inches for a 29 inch by 15 inch rectangular shaped module 2 as shown in FIG. 55.

If the tilt axis 15 does not intersect exactly with the tip axis 17, the concentrator modules 2 tend to move in an arc as modules 2 articulate, rather than just pivoting in place. In the most general case, shown in FIG. 56, it is possible for adjacent concentrating solar panels 1 to articulate in opposite directions in tilt, while also articulating a small arc about the geometric center of the buckets 8, leading to a minimum separation of at least 36 inches in the preferred embodiment. Allowing for some margin of error during installation, a center-to-center distance of at least 36.3 inches can be used.

In alternative embodiments, the tilt axes of adjacent concentrating solar panels can operate in synchrony, adjacent units 1 can detect the position of each other so that panels 1 do not collide, and/or the units 1 can be tolerant of collisions. Advantageously, such embodiments can allow the tighter spacing shown in FIG. 55.

Figure 59:
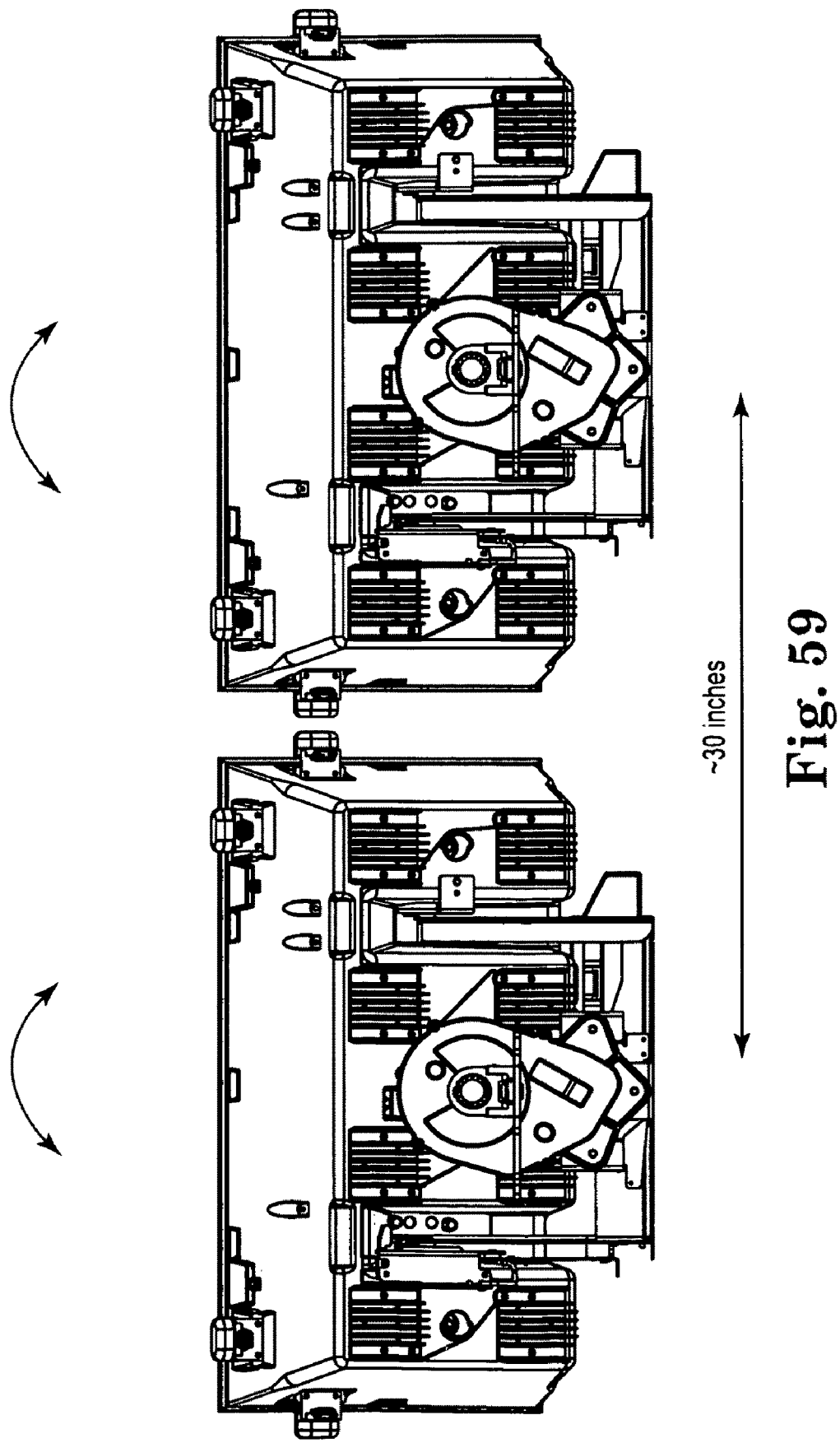
FIG. 59 shows the arrangement shown in FIG. 55 with an optional and additional articulation axis.

Referring to FIG. 59, an alternative embodiment adds articulation about the line of sight (i.e., the axis in the direction of the sun when the concentrator module 2 is pointed at the sun) in addition to articulation about the tip axis 17 and the tilt axis 15. Appropriate articulation about the line of sight axis can cause the concentrator modules 2 to rotate such that the case of FIG. 55 is instead replaced by the case of FIG. 59. In such an embodiment, the center-to-center spacing of the panels 1 may be much less, nearly the width of the concentrator modules 2, perhaps 30 inches in some alternative embodiments.

All the foregoing notwithstanding, while the concentrating modules 2 in a preferred embodiment are evenly spaced along the tilt axis in the preferred embodiment, they may be spaced at any desired interval on the tilt axis 15.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A photovoltaic power system optimized for more power and less area comprising:
   a plurality of photovoltaic concentrator modules packed tightly in a two dimensional array in a manner to maximize reception of incident sunlight for each photovoltaic concentrator module with minimum shadow cast from other photovoltaic concentrator modules, and wherein each photovoltaic concentrator module comprises a main body portion having:
   a base,
   a plurality of side walls connected to the base, wherein the base and the plurality of side walls define an interior region of the main body portion,
   two cavities on the side walls that extend into the interior region, wherein each cavity has an attachment point,
   a tip articulating mechanism including one or more gooseneck members coupled to the attachment point in each cavity such that the tip articulating mechanism can articulate the photovoltaic concentrator module about a first axis that is substantially parallel to longest dimension of the photovoltaic concentrator module, wherein the tip articulating mechanism, the cavities and the attachment points are configured to minimize shadows cast from the incident sunlight on the other photovoltaic concentrator modules, and
   one or more apertures located opposite the base, each aperture comprising a plurality of lenses positioned in said each aperture in a manner such that each lens is capable of directing incident light to a focus on a solar cell within the interior region of the main body portion; and a tilt articulating mechanism configured to articulate the plurality of photovoltaic concentrator modules about a second axis that is substantially perpendicular to the first axis, so that the plurality of photovoltaic concentrator modules are aligned with the sun and track the sun during the course of a day so that the incident sunlight is directly focused on a respective solar cell by a respective lens, wherein the tilt articulating mechanism comprises a chassis, and a mounting plate coupled to the chassis via a movable joint configured to permit the mounting plate to move relative to the chassis in a manner to accommodate a plurality of mounting locations, wherein the one or more gooseneck members mate to the mounting plate at a pivot via the movable joint, and wherein the movable joint allows for a desirable range of articulation around the first axis with respect to the mounting plate to minimize shadows cast from the incident sunlight on the other photovoltaic concentrator modules.

2. The photovoltaic power system of claim 1, wherein the main body portion comprises an integrated molded plastic material.

3. The photovoltaic power system of claim 1, wherein the main body portion comprises one or more material selected from the group consisting of epoxy, sheet molding compound (SMC), and bulk molding compound (BMC).

4. The photovoltaic power system of claim 1, wherein each photovoltaic concentrator module further comprises a heat sink assembly on an exterior surface of the main body portion, the heat sink assembly comprising a heat sink and one or more structural braces positioned over the one or more apertures such that the one or more structural braces allow incident light to pass to the one or more apertures, and wherein the one or more structural braces contact outer surface of the main body portion in a structurally supporting manner.

5. The photovoltaic power system of claim 1, wherein the tip articulating mechanism comprises at least three chassis members positioned adjacent to the base, wherein a first chassis member is physically coupled to one of the attachment points in a first cavity, a second chassis member is physically coupled to the other attachment point in a second cavity, and at least a third chassis member is physically coupled to the first and second chassis members in a manner to minimize shadows cast from the incident sunlight on the other photovoltaic concentrator modules.

6. The photovoltaic power system of claim 1, wherein the tilt articulating mechanism further comprises a cylindrical member positioned between the chassis and the mounting plate and having a first end and a second end, wherein the first end is rigidly coupled to the chassis and the second end is movably coupled to the mounting plate via the movable joint.

7. The photovoltaic power system of claim 1, wherein the movable joint is a spherical bearing.

8. The photovoltaic power system of claim 1, wherein the main body portion further comprises one or more vent ports located in the interior region, and wherein at least one of the vent ports comprises a semi-permeable membrane that is permeable to gas such that the interior region can stabilize with the surrounding atmosphere.

9. The photovoltaic power system of claim 1, wherein the one or more side walls of the main body portion of at least one photovoltaic concentrator module further comprises one or more mounting features for mounting a sun sensor.

10. The photovoltaic power system of claim 1, wherein the plurality of photovoltaic concentrator modules is six photovoltaic concentrator modules.

11. The photovoltaic power system of claim 1, wherein the plurality of lenses comprise an "m" by "n" array of lenses, wherein m and n are integers, m>1, n>1, and m is not equal to n.

* * * * *